（12） United States Patent
Kobayashi et al.

(10) Patent No.: US 9,519,213 B2
(45) Date of Patent: Dec. 13, 2016

(54) PATTERNING PROCESS AND RESIST COMPOSITION

(71) Applicant: SHIN-ETSU CHEMICAL CO., LTD., Tokyo (JP)

(72) Inventors: Tomohiro Kobayashi, Joetsu (JP); Kazuhiro Katayama, Joetsu (JP); Kentaro Kumaki, Joetsu (JP); Chuanwen Lin, Joetsu (JP); Masaki Ohashi, Joetsu (JP); Masahiro Fukushima, Joetsu (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 0 days.

(21) Appl. No.: 14/182,682

(22) Filed: Feb. 18, 2014

(65) Prior Publication Data
US 2014/0255843 A1 Sep. 11, 2014

(30) Foreign Application Priority Data
Mar. 5, 2013 (JP) ................................. 2013-042709

(51) Int. Cl.
G03F 7/004 (2006.01)
G03F 7/38 (2006.01)
G03F 7/40 (2006.01)
G03F 7/039 (2006.01)
G03F 7/11 (2006.01)
G03F 7/20 (2006.01)
G03F 7/32 (2006.01)

(52) U.S. Cl.
CPC ........... *G03F 7/0045* (2013.01); *G03F 7/0046* (2013.01); *G03F 7/0395* (2013.01); *G03F 7/0397* (2013.01); *G03F 7/11* (2013.01); *G03F 7/2041* (2013.01); *G03F 7/325* (2013.01); *G03F 7/38* (2013.01); *G03F 7/40* (2013.01)

(58) Field of Classification Search
CPC ........ G03F 7/0397; G03F 7/38; G03F 7/0045; G03F 7/11; G03F 7/2041; G03F 7/325; G03F 7/40
USPC ............. 430/270.1, 326, 921, 922, 325, 910
See application file for complete search history.

(56) References Cited

U.S. PATENT DOCUMENTS

| 4,743,529 A * | 5/1988 | Farid et al. ................. 430/281.1 |
| 6,312,867 B1 | 11/2001 | Kinsho et al. |
| 7,537,880 B2 | 5/2009 | Harada et al. |
| 7,771,913 B2 | 8/2010 | Kaneko et al. |
| 7,998,655 B2 | 8/2011 | Tsubaki |
| 8,034,547 B2 | 10/2011 | Tsubaki et al. |
| 8,088,557 B2 | 1/2012 | Tsubaki |
| 8,227,183 B2 | 7/2012 | Tsubaki et al. |
| 8,241,840 B2 | 8/2012 | Tsubaki et al. |
| 8,323,872 B2 | 12/2012 | Hatakeyama et al. |
| 2008/0090172 A1 | 4/2008 | Hatakeyama et al. |
| 2008/0187860 A1* | 8/2008 | Tsubaki ................ G03F 7/2024 430/270.1 |
| 2010/0209827 A1 | 8/2010 | Ohashi et al. |
| 2011/0117499 A1* | 5/2011 | Matsumiya .......... C09D 133/16 430/285.1 |
| 2011/0294069 A1* | 12/2011 | Bae ....................... G03F 7/0392 430/283.1 |
| 2011/0311914 A1 | 12/2011 | Kamimura et al. |
| 2012/0148945 A1 | 6/2012 | Hasegawa et al. |
| 2012/0219901 A1 | 8/2012 | Bae et al. |
| 2012/0219902 A1 | 8/2012 | Bae et al. |
| 2012/0288796 A1 | 11/2012 | Katayama et al. |
| 2013/0052587 A1 | 2/2013 | Hatakeyama et al. |
| 2014/0052941 A1 | 2/2014 | Karashima et al. |
| 2014/0199629 A1 | 7/2014 | Ohashi et al. |

FOREIGN PATENT DOCUMENTS

| JP | 2000336121 A | 12/2000 |
| JP | 3790649 B2 | 6/2006 |
| JP | 200725634 A | 2/2007 |
| JP | 2007297590 A | 11/2007 |
| JP | 2007316448 A | 12/2007 |
| JP | 20083569 A | 1/2008 |
| JP | 2008111103 A | 5/2008 |
| JP | 2008122932 A | 5/2008 |
| JP | 2008-281975 A | 11/2008 |

(Continued)

OTHER PUBLICATIONS

Owe-Yang et al., "Double exposure for the contact layer of the 65-nm node", Advances in Resist Technology and Processing XXII, 2005, pp. 171-180, Proc. SPIE vol. 5753, Hsin-Chu, Taiwan.
Landie et al., Fundamental Investigation of Negative Tone Development (NTD) for the 22nm node (and beyond)., Proceedings of SPIE et al., 2011, pp. 797206-1-797206-13, SPIE vol. 7927.
Japanese Office Action dated Jun. 9, 2015, issued in corresponding Japanese Patent Application No. 2013-042709 (5 pages).

*Primary Examiner* — John S Chu
(74) *Attorney, Agent, or Firm* — Westerman, Hattori, Daniels & Adrian, LLP

(57) ABSTRACT

A negative pattern is formed by coating a resist composition comprising (A) a polymer having an acid labile group, adapted to change its polarity under the action of acid, (B) a photoacid generator, and (C) an organic solvent onto a substrate, baking, exposing the resist film to high-energy radiation, PEB, and developing in an organic solvent-based developer to selectively dissolve the unexposed region of resist film. The photoacid generator has the formula: $R^1$—$COOC(CF_3)_2$—$CH_2SO_3^-R^2R^3R^4S^+$ wherein $R^1$ is a monovalent hydrocarbon group, $R^2$, $R^3$ and $R^4$ are an alkyl, alkenyl, oxoalkyl, aryl, aralkyl or aryloxoalkyl group, or may bond together to form a ring with the sulfur atom.

4 Claims, 10 Drawing Sheets

(56) References Cited

FOREIGN PATENT DOCUMENTS

| | | | |
|---|---|---|---|
| JP | 2008281974 | A | 11/2008 |
| JP | 2008309879 | A | 12/2008 |
| JP | 2010-197619 | A | 9/2010 |
| JP | 4554665 | B2 | 9/2010 |
| JP | 2010215608 | A | 9/2010 |
| JP | 4590431 | B2 | 12/2010 |
| JP | 2012128067 | A | 7/2012 |
| JP | 2012-181522 | A | 9/2012 |
| JP | 2012-181524 | A | 9/2012 |
| JP | 2013-003555 | A | 1/2013 |
| JP | 2013-003768 | A | 1/2013 |
| JP | 2013-045055 | A | 3/2013 |

\* cited by examiner

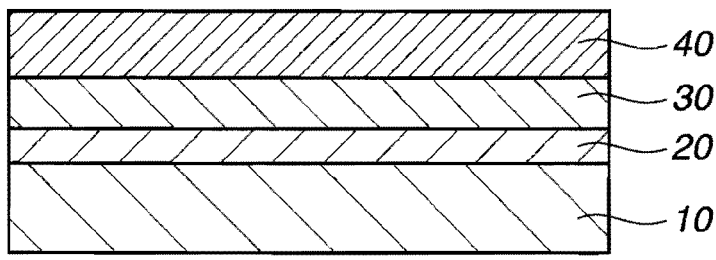
FIG.1A PHOTORESIST COATING
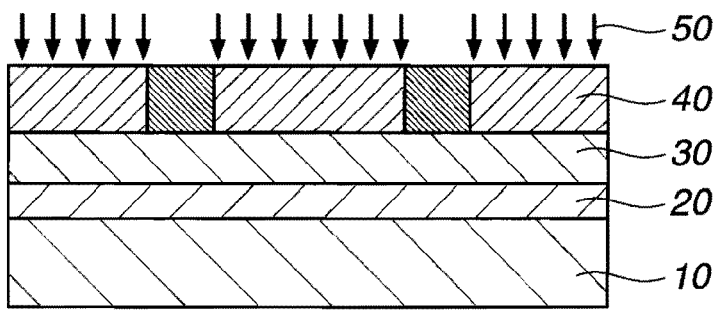
FIG.1B PHOTORESIST EXPOSURE
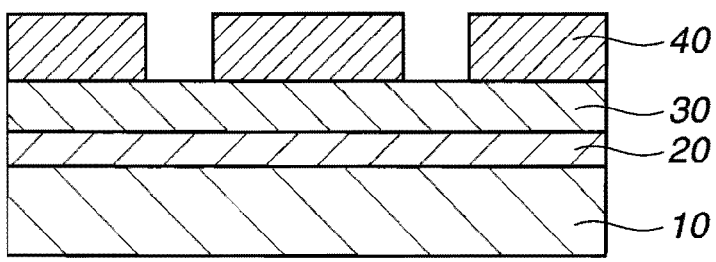
FIG.1C ORGANIC SOLVENT DEVELOPMENT

PATTERNING PROCESS AND RESIST COMPOSITION

CROSS-REFERENCE TO RELATED APPLICATION

This non-provisional application claims priority under 35 U.S.C. §119(a) on Patent Application No. 2013-042709 filed in Japan on Mar. 5, 2013, the entire contents of which are hereby incorporated by reference.

TECHNICAL FIELD

This invention relates to a pattern forming process comprising the steps of exposure of resist film, deprotection reaction with the aid of acid and heat, and development in an organic solvent to selectively dissolve the unexposed region of resist film for thereby forming a negative tone pattern, and a resist composition used therein.

BACKGROUND ART

In the lithography art, a highlight is recently put on the organic solvent development again. It would be desirable if a very fine hole pattern, which is not achievable with the positive tone, is resolvable through negative tone exposure. To this end, a positive resist composition featuring a high resolution is subjected to organic solvent development to form a negative pattern. An attempt to double a resolution by combining two developments, alkaline development and organic solvent development is under study.

As the ArF resist composition for negative tone development with organic solvent, positive ArF resist compositions of the prior art design may be used. Such pattern forming processes are described in Patent Documents 1 to 3. These patent documents disclose resist compositions for organic solvent development comprising a copolymer of hydroxyadamantane methacrylate, a copolymer of norbornane lactone methacrylate, and a copolymer of methacrylate having acidic groups including carboxyl, sulfo, phenol and thiol groups substituted with two or more acid labile groups, and pattern forming processes using the same.

Further, Patent Document 4 discloses a process for forming a pattern through organic solvent development in which a protective film is applied onto a resist film. Patent Document 5 discloses a topcoatless process for forming a pattern through organic solvent development in which an additive is added to a resist composition so that the additive may segregate at the resist film surface after spin coating to provide the surface with improved water repellency.

The negative tone pattern forming process is also useful in enhancing the resolution of trench patterns. Since a high optical contrast is available where the pattern design on the mask is isolated lines (i.e., bright-field mask), as compared with where the pattern design on the mask is isolated trenches (i.e., dark-field mask), the negative tone patterning process involving reversal of line image is more advantageous in forming trench patterns. See Non-Patent Document 1.

However, it is hardly described that the negative development with organic solvent takes full advantage of optical images even in formation of hole or trench patterns, because of the shortage of dissolution contrast of the above-mentioned resist compositions.

In the negative tone pattern forming process, the contrast shortage tends to result in an inversely tapered profile. There is a likelihood that the line width in a surface layer of resist film is greater than the line width in a substrate-adjoining layer of resist film. Then pattern collapse becomes a serious problem.

In general, the organic solvent development is low in dissolution contrast, as compared with the positive resist system adapted to be dissolved in alkaline developer when deprotection reaction takes place to produce acidic carboxyl or phenol groups. Specifically, in the case of alkaline developer, the alkali dissolution rate differs more than 1,000 times between unexposed and exposed regions, whereas the difference in the case of organic solvent development is at most 100 times, and only about 10 times for certain materials. Further it is important to enhance the gradient or gamma ($\gamma$) at the dose corresponding to dissolution/non-dissolution conversion. A low $\gamma$ value is prone to form an inversely tapered profile and allows for pattern collapse in the case of a line pattern. To obtain a perpendicular pattern, the resist must have a dissolution contrast having a $\gamma$ value as high as possible.

It is also important to control acid diffusion in a resist film because the diffusion of acid generated in the exposed region of resist film to the unexposed region invites degradation of a latent image and the degraded profile leads to a loss of pattern collapse resistance and an increase of edge roughness.

CITATION LIST

Patent Document 1: JP-A 2008-281974
Patent Document 2: JP-A 2008-281975
Patent Document 3: JP 4554665
Patent Document 4: JP 4590431
Patent Document 5: JP-A 2008-309879
Patent Document 6: JP-A 2010-215608 (US 20100209827)
Non-Patent Document 1: Proc. SPIE Vol. 7972, 797206 (2011)

DISCLOSURE OF INVENTION

An object of the invention is to provide a resist composition having a significant dissolution contrast upon organic solvent development and an ability to control acid diffusion. Another object is to provide a process for forming a negative pattern by combining the resist composition with negative tone development, the process being capable of forming a pattern with minimal edge roughness while mitigating the risk of pattern collapse.

The inventors have found that when a resist composition comprising a photoacid generator of specific structure is subjected to negative tone development in organic solvent, a fine trench pattern with improved edge roughness can be formed and the risk of pattern collapse is mitigated.

The photoacid generator of specific structure is described in Patent Document 6. It is allegedly effective for enhancement of PED stability and improvement in pattern profile and particularly useful in the fabrication of mask blanks. Apparently this resist is intended for the positive tone development in aqueous alkaline solution.

The inventors have found that unexpected results are obtained by combining a resist composition comprising the photoacid generator of specific structure with negative tone development in organic solvent-based developer. More particularly, a photoacid generator of the structure having the general formula (1), defined below, has a high solubility in organic solvent, and the acid generated by the photoacid generator has such an acidity that the dissolution contrast ($\gamma$) is improved and the influence of acid diffusion is suppressed.

These lead to a reduction of roughness, an improvement in pattern profile, and an improvement in collapse resistance.

In one aspect, the invention provides a process for forming a negative pattern, comprising the steps of coating a resist composition comprising (A) a polymer having an acid labile group, adapted to change its polarity under the action of acid, (B) a photoacid generator, and (C) an organic solvent onto a substrate, baking the coating to form a resist film, exposing the resist film to high-energy radiation to define exposed and unexposed regions, baking, and developing the resist film in a developer comprising an organic solvent to selectively dissolve the unexposed region of resist film. The photoacid generator (B) has the general formula (1):

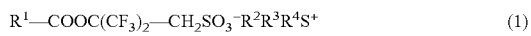

$$R^1\text{—COOC}(CF_3)_2\text{—}CH_2SO_3^-R^2R^3R^4S^+ \quad (1)$$

wherein $R^1$ is a straight, branched or cyclic, monovalent hydrocarbon group of 1 to 50 carbon atoms which may contain a heteroatom, $R^2$, $R^3$ and $R^4$ are each independently a substituted or unsubstituted, straight or branched $C_1$-$C_{10}$ alkyl, alkenyl or oxoalkyl group or a substituted or unsubstituted $C_6$-$C_{18}$ aryl, aralkyl or aryloxoalkyl group, or at least two of $R^2$, $R^3$ and $R^4$ may bond together to form a ring with the sulfur atom.

In a preferred embodiment, the polymer (A) comprises recurring units having the general formula (2):

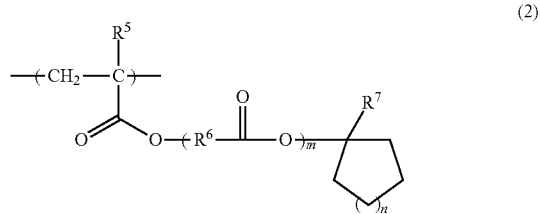

wherein $R^5$ is hydrogen or methyl, $R^6$ is a straight, branched or cyclic, divalent aliphatic hydrocarbon group of 2 to 16 carbon atoms which may contain an ether or ester bond, $R^7$ is a straight, branched or cyclic $C_1$-$C_7$ alkyl group, m is 0 or 1, and n is 1 or 2. Preferably, $R^7$ is tert-butyl, tert-pentyl or neopentyl.

In a preferred embodiment, the polymer (A) further comprises recurring units having the general formula (3):

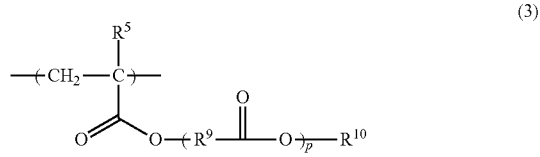

wherein $R^8$ is hydrogen or methyl, $R^9$ is a straight, branched or cyclic, divalent aliphatic hydrocarbon group of 2 to 16 carbon atoms which may contain an ether or ester bond, $R^{10}$ is a cyclic hydrocarbon group of 4 to 15 carbon atoms having at least one partial structure selected from the group consisting of hydroxyl, ether, ketone, ester, carbonic acid ester, and sulfonic acid ester, and p is 0 or 1.

In a preferred embodiment, the developer comprises at least one organic solvent selected from the group consisting of 2-octanone, 2-nonanone, 2-heptanone, 3-heptanone, 4-heptanone, 2-hexanone, 3-hexanone, diisobutyl ketone, 2-methylcyclohexanone, 3-methylcyclohexanone, 4-methylcyclohexanone, acetophenone, 2'-methylacetophenone, 4'-methylacetophenone, propyl acetate, butyl acetate, isobutyl acetate, amyl acetate, isoamyl acetate, butenyl acetate, propyl formate, butyl formate, isobutyl formate, amyl formate, isoamyl formate, methyl valerate, methyl pentenoate, methyl crotonate, ethyl crotonate, methyl lactate, ethyl lactate, propyl lactate, butyl lactate, isobutyl lactate, amyl lactate, isoamyl lactate, methyl 2-hydroxyisobutyrate, ethyl 2-hydroxyisobutyrate, methyl benzoate, ethyl benzoate, phenyl acetate, benzyl acetate, methyl phenylacetate, benzyl formate, phenylethyl formate, methyl 3-phenylpropionate, benzyl propionate, ethyl phenylacetate, and 2-phenylethyl acetate. The organic solvent is present in a total amount of at least 60% by weight of the developer.

In a preferred embodiment, the step of exposing the resist film to high-energy radiation includes ArF excimer laser immersion lithography of wavelength 193 nm.

In another aspect, the invention provides a resist composition comprising (A) a polymer, (B) a photoacid generator, and (C) an organic solvent, wherein the photoacid generator (B) has formula (1) and the polymer (A) comprises recurring units having formula (2), both defined above.

Preferably, $R^7$ in formula (2) is tert-butyl, tert-pentyl or neopentyl.

The polymer (A) may further comprise recurring units having formula (3) defined above.

Advantageous Effects of Invention

Now that a resist composition comprising a photoacid generator of specific structure is combined with negative tone development in an organic solvent-based developer, the inventive process can form a fine trench pattern with minimized edge roughness. An inversely tapered profile is suppressed, and pattern collapse is mitigated.

BRIEF DESCRIPTION OF DRAWINGS

FIGS. 1A to 1C are cross-sectional views of a patterning process according one embodiment of the invention; FIG. 1A shows a photoresist film disposed on a substrate, FIG. 1B shows the resist film being exposed, and FIG. 1C shows the resist film being developed in an organic solvent.

DESCRIPTION OF EMBODIMENTS

Figure 2:
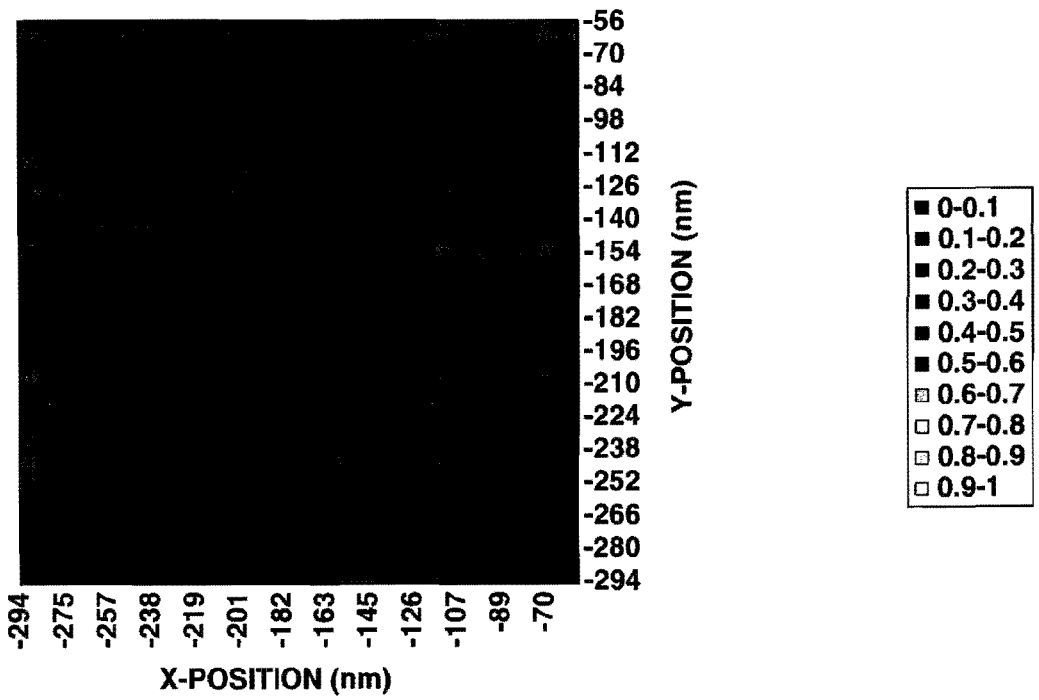
FIG. 2 is an optical image of X-direction lines having a pitch of 90 nm and a line size of 45 nm printed under conditions: ArF excimer laser of wavelength 193 nm, NA 1.3 lens, dipole illumination, 6% halftone phase shift mask, and s-polarization.

The terms "a" and "an" herein do not denote a limitation of quantity, but rather denote the presence of at least one of the referenced item. "Optional" or "optionally" means that the subsequently described event or circumstances may or may not occur, and that description includes instances where the event or circumstance occurs and instances where it does not. As used herein, the notation ($C_n$-$C_m$) means a group containing from n to m carbon atoms per group. As used herein, the term "film" is used interchangeably with "coating" or "layer." The term "processable layer" is interchangeable with patternable layer and refers to a layer that can be processed such as by etching to form a pattern therein.

It is understood that for many structures represented by chemical formulae, there can exist enantiomers and diastereomers. Unless otherwise stated, a single plane or steric formula collectively represents all such stereoisomers. The stereoisomers may be used alone or in admixture.

The abbreviations and acronyms have the following meaning.

Mw: weight average molecular weight
Mn: number average molecular weight
Mw/Mn: molecular weight distribution or dispersity
GPC: gel permeation chromatography
PEB: post-exposure bake
PAG: photoacid generator Briefly stated, the resist composition used herein is defined as comprising (A) a polymer having an acid labile group, adapted to change its polarity under the action of acid, (B) a photoacid generator, and (C) an organic solvent.

Component (A) is a polymer having a polar group protected with an acid labile group so that it may change its polarity in response to deprotection reaction that takes place under the action of an acid generated by the PAG (B). Suitable polar groups include carboxyl, hydroxyl and sulfonamide groups.

The acid labile protective group is typically selected from alkoxymethyl groups of the general formula (L1) and tertiary alkyl groups of the general formulae (L2) to (L8), but not limited thereto.

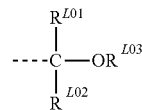
(L1)

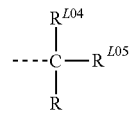
(L2)

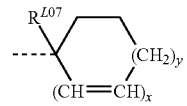
(L3)

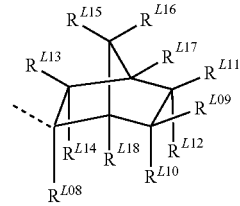
(L4)

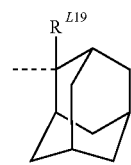
(L5)

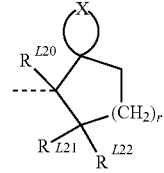
(L6)

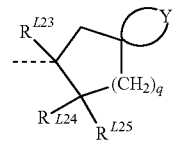
(L7)

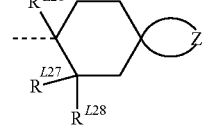
(L8)

Herein and throughout the specification, the broken line denotes a valence bond.

In formula (L1), $R^{L01}$ and $R^{L02}$ each are hydrogen or a straight, branched or cyclic alkyl group of 1 to 18 carbon atoms, preferably 1 to 10 carbon atoms, examples of which include methyl, ethyl, propyl, isopropyl, n-butyl, sec-butyl, tert-butyl, cyclopentyl, cyclohexyl, 2-ethylhexyl, n-octyl, and adamantyl. $R^{L03}$ is a monovalent hydrocarbon group of 1 to 18 carbon atoms, preferably 1 to 10 carbon atoms, which may contain a heteroatom such as oxygen, examples of which include straight, branched or cyclic alkyl groups and substituted forms of these groups in which some hydrogen atoms are replaced by hydroxyl, alkoxy, oxo, amino, alkylamino or the like. Suitable straight, branched or cyclic alkyl groups are as exemplified for $R^{L01}$ and $R^{L02}$. Exemplary substituted alkyl groups are illustrated below.

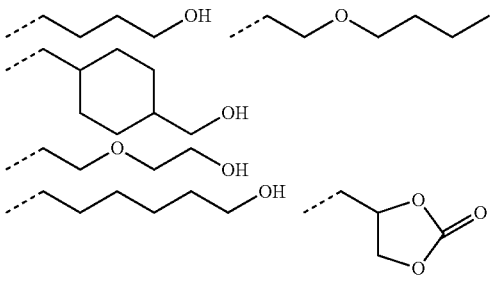

A pair of $R^{L01}$ and $R^{L02}$, $R^{L01}$ and $R^{L03}$, or $R^{L02}$ and $R^{L03}$ may bond together to form a ring with the carbon and oxygen atoms to which they are attached. A pair of $R^{L01}$ and $R^{L02}$, $R^{L01}$ and $R^{L03}$, or $R^{L02}$ and $R^{L03}$ represents a straight or branched alkylene group of 1 to 18 carbon atoms, preferably 1 to 10 carbon atoms when they form a ring.

In formula (L2), $R^{L04}$, $R^{L05}$, and $R^{L06}$ are each independently a straight, branched or cyclic $C_1$-$C_{15}$ alkyl group. Suitable alkyl groups include methyl, ethyl, propyl, isopropyl, n-butyl, sec-butyl, tert-butyl, cyclopentyl, cyclohexyl, 2-ethylhexyl, n-octyl, 1-adamantyl, and 2-adamantyl.

In formula (L3), $R^{L07}$ is an optionally substituted, straight, branched or cyclic $C_1$-$C_{10}$ alkyl group or optionally substituted $C_6$-$C_{20}$ aryl group. Examples of the optionally substituted alkyl groups include straight, branched or cyclic ones such as methyl, ethyl, propyl, isopropyl, n-butyl, sec-butyl, tert-butyl, tert-amyl, n-pentyl, n-hexyl, cyclopentyl, cyclohexyl, and bicyclo[2.2.1]heptyl; and substituted forms of the foregoing in which some hydrogen atoms are replaced by hydroxyl, alkoxy, carboxyl, alkoxycarbonyl, oxo, amino, alkylamino, cyano, mercapto, alkylthio, sulfo or other groups or in which one or more methylene moiety is replaced by an oxygen or sulfur atom. Exemplary optionally substituted aryl groups are phenyl, methylphenyl, naphthyl, anthryl, phenanthryl, and pyrenyl. In formula (L3), x is 0 or 1, y is 0, 1, 2 or 3, and 2x+y is equal to 2 or 3.

In formula (L4), $R^{L08}$ is an optionally substituted, straight, branched or cyclic $C_1$-$C_{10}$ alkyl group or optionally substituted $C_6$-$C_{20}$ aryl group. Examples are as exemplified for $R^{L02}$. $R^{L09}$ to $R^{L18}$ each independently denote hydrogen or a monovalent $C_1$-$C_{15}$ hydrocarbon group. Exemplary hydrocarbon groups are straight, branched or cyclic alkyl groups such as methyl, ethyl, propyl, isopropyl, n-butyl, sec-butyl, tert-butyl, tert-amyl, n-pentyl, n-hexyl, n-octyl, n-nonyl, n-decyl, cyclopentyl, cyclohexyl, cyclopentylmethyl, cyclopentylethyl, cyclopentylbutyl, cyclohexylmethyl, cyclohexylethyl and cyclohexylbutyl, and substituted forms of the foregoing in which some hydrogen atoms are replaced by hydroxyl, alkoxy, carboxyl, alkoxycarbonyl, oxo, amino, alkylamino, cyano, mercapto, alkylthio, sulfo or other groups. Alternatively, a pair of $R^{L09}$ and $R^{L10}$, $R^{L09}$ and $R^{L11}$, $R^{L09}$ and $R^{L12}$, $R^{L10}$ and $R^{L12}$, $R^{L11}$ and $R^{L12}$, $R^{L13}$ and $R^{L14}$, or $R^{L15}$ and $R^{L16}$ may bond together to form a ring. A pair of $R^{L09}$ to $R^{L18}$ represents a divalent $C_1$-$C_{15}$ hydrocarbon group when they form a ring, examples of which are those exemplified above for the monovalent hydrocarbon groups, with one hydrogen atom being eliminated. Also a pair of $R^{L09}$ and $R^{L11}$, $R^{L11}$ and $R^{L17}$, or $R^{L15}$ and $R^{L17}$ which are attached to vicinal carbon atoms may bond together directly to form a double bond.

In formula (L5), $R^{L19}$ is an optionally substituted, straight, branched or cyclic $C_1$-$C_{10}$ alkyl group or optionally substituted $C_6$-$C_{20}$ aryl group. Examples are as exemplified for $R^{L07}$.

In formula (L6), $R^{L20}$ is an optionally substituted, straight, branched or cyclic $C_1$-$C_{10}$ alkyl group or optionally substituted $C_6$-$C_{20}$ aryl group. Examples are as exemplified for $R^{L07}$. X is a divalent group that forms an optionally substituted cyclopentane, cyclohexane or norbornane ring with the carbon atom to which it is attached. $R^{L21}$ and $R^{L22}$ are each independently hydrogen or a straight, branched or cyclic, monovalent hydrocarbon group of 1 to 10 carbon atoms. $R^{L21}$ and $R^{L22}$ may bond together to form a ring with the carbon atom to which they are attached, and in this case, $R^{L21}$ and $R^{L22}$ taken together represent a divalent group that forms an optionally substituted cyclopentane or cyclohexane ring. The subscript r is 1 or 2.

In formula (L7), $R^{L23}$ is an optionally substituted, straight, branched or cyclic $C_1$-$C_{10}$ alkyl group or optionally substituted $C_6$-$C_{20}$ aryl group. Examples are as exemplified for $R^{L07}$. Y is a divalent group that forms an optionally substituted cyclopentane, cyclohexane or norbornane ring with the carbon atom to which it is attached. $R^{L24}$ and $R^{L25}$ are each independently hydrogen or a straight, branched or cyclic, monovalent hydrocarbon group of 1 to 10 carbon atoms. $R^{L24}$ and $R^{L25}$ may bond together to form a ring with the carbon atom to which they are attached, and in this case, $R^{L24}$ and $R^{L25}$ taken together represent a divalent group that forms an optionally substituted cyclopentane or cyclohexane ring. The subscript q is 1 or 2.

In formula (L8), $R^{L26}$ is an optionally substituted, straight, branched or cyclic $C_1$-$C_{10}$ alkyl group or optionally substituted $C_6$-$C_{20}$ aryl group. Examples are as exemplified for $R^{L07}$. Z is a divalent group that forms an optionally substituted cyclopentane, cyclohexane or norbornane ring with the carbon atom to which it is attached. $R^{L27}$ and $R^{L28}$ are each independently hydrogen or a straight, branched or cyclic, monovalent hydrocarbon group of 1 to 10 carbon atoms. $R^{L27}$ and $R^{L28}$ may bond together to form a ring with the carbon atom to which they are attached, and in this case, $R^{L27}$ and $R^{L28}$ taken together represent a divalent group that forms an optionally substituted cyclopentane or cyclohexane ring.

Of the acid labile groups of formula (L1), suitable straight or branched groups are exemplified below.

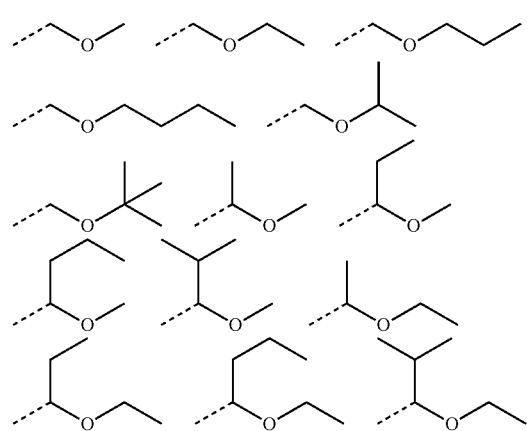

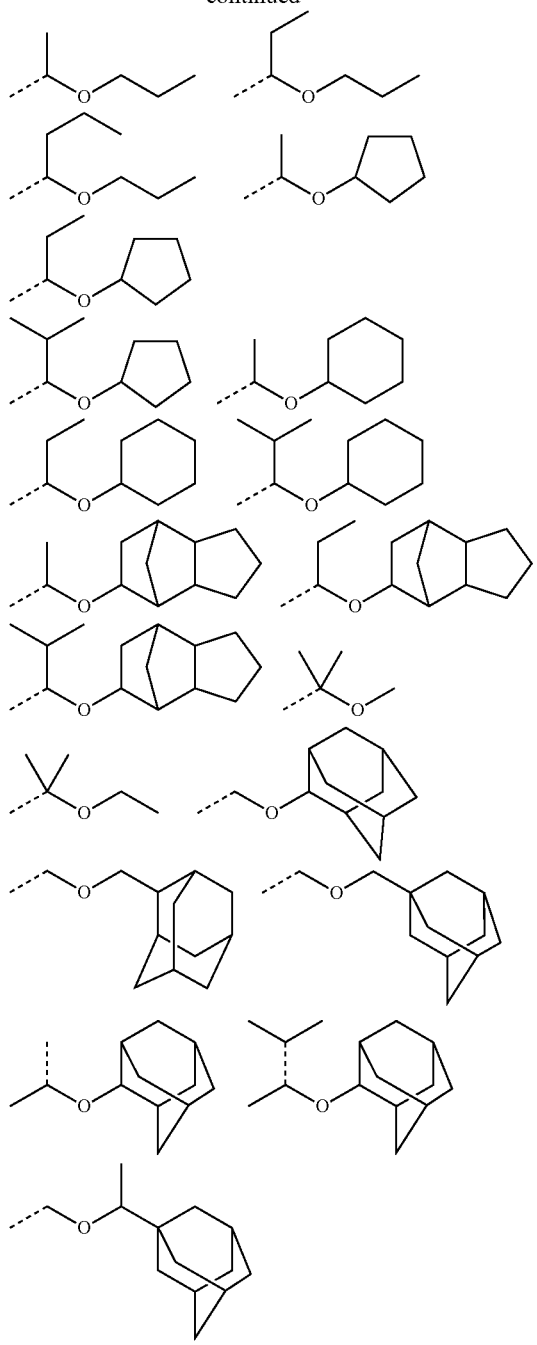

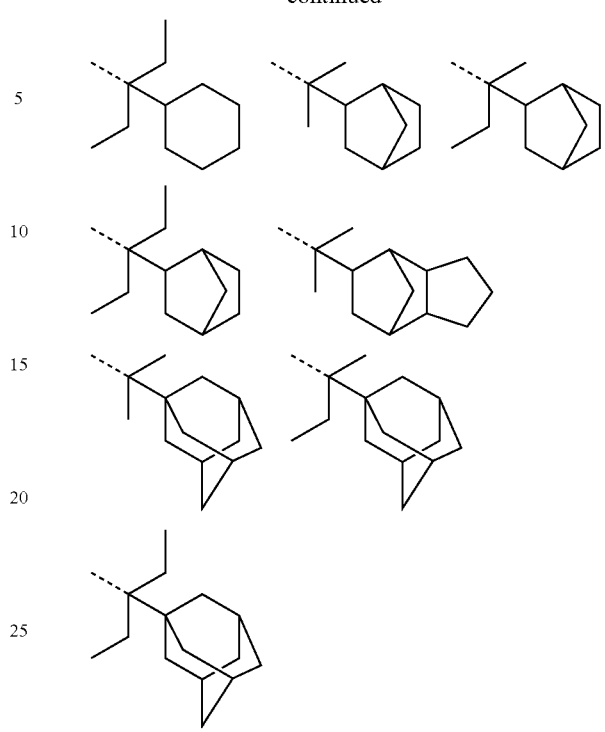

Of the acid labile groups of formula (L1), the cyclic ones are, for example, tetrahydrofuran-2-yl, 2-methyltetrahydrofuran-2-yl, tetrahydropyran-2-yl, and 2-methyltetrahydropyran-2-yl.

Examples of the acid labile group of formula (L2) include tert-butyl, tert-amyl, and the groups shown below.

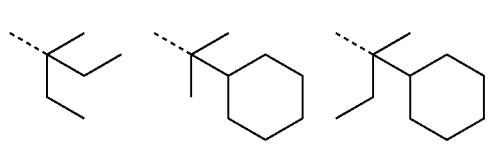 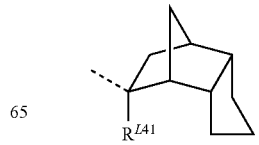

Examples of the acid labile group of formula (L3) include 1-methylcyclopentyl, 1-ethylcyclopentyl, 1-n-propylcyclopentyl, 1-isopropylcyclopentyl, 1-n-butylcyclopentyl, 1-sec-butylcyclopentyl, 1-cyclohexylcyclopentyl, 1-(4-methoxy-n-butyl)cyclopentyl, 1-(bicyclo[2.2.1]heptan-2-yl)cyclopentyl, 1-(7-oxabicyclo[2.2.1]heptan-2-yl)cyclopentyl, 1-methylcyclohexyl, 1-ethylcyclohexyl, 3-methyl-1-cyclopenten-3-yl, 3-ethyl-1-cyclopenten-3-yl, 3-methyl-1-cyclohexen-3-yl, and 3-ethyl-1-cyclohexen-3-yl.

Of the acid labile groups of formula (L4), those groups of the following formulae (L4-1) to (L4-4) are more preferred.

(L4-1)

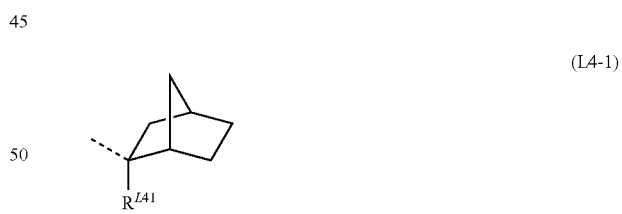

(L4-2)

(L4-3)

(L4-4)

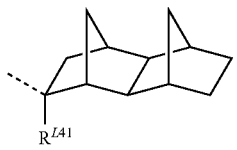

(L4-4-4)

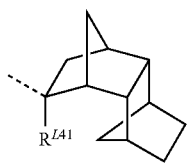

In formulae (L4-1) to (L4-4), the broken line denotes a bonding site and direction. $R^{L41}$ is each independently selected from monovalent hydrocarbon groups, typically straight, branched or cyclic $C_1$-$C_{10}$ alkyl groups, for example, methyl, ethyl, propyl, isopropyl, n-butyl, sec-butyl, tert-butyl, tert-amyl, n-pentyl, n-hexyl, cyclopentyl, and cyclohexyl.

For formulas (L4-1) to (L4-4), there can exist enantiomers and diastereomers. Each of formulae (L4-1) to (L4-4) collectively represents all such stereoisomers. Such stereoisomers may be used alone or in admixture.

For example, the general formula (L4-3) represents one or a mixture of two selected from groups having the following general formulas (L4-3-1) and (L4-3-2).

(L4-3-1)

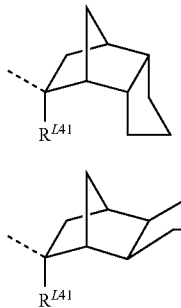

(L4-3-2)

Herein $R^{L41}$ is as defined above.

Similarly, the general formula (L4-4) represents one or a mixture of two or more selected from groups having the following general formulas (L4-4-1) to (L4-4-4).

(L4-4-1)

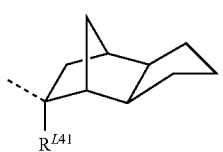

(L4-4-2)

(L4-4-3)

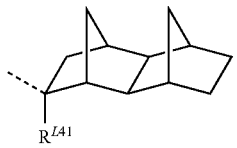

Herein $R^{L41}$ is as defined above.

Each of formulas (L4-1) to (L4-4), (L4-3-1) and (L4-3-2), and (L4-4-1) to (L4-4-4) collectively represents an enantiomer thereof and a mixture of enantiomers.

It is noted that in the above formulas (L4-1) to (L4-4), (L4-3-1) and (L4-3-2), and (L4-4-1) to (L4-4-4), the bond direction is on the exo side relative to the bicyclo[2.2.1] heptane ring, which ensures high reactivity for acid-catalyzed elimination reaction (see JP-A 2000-336121). In preparing these monomers having a tertiary exo-alkyl group of bicyclo[2.2.1]heptane skeleton as a substituent group, there may be contained monomers substituted with an endo-alkyl group as represented by the following formulas (L4-1-endo) to (L4-4-endo). For good reactivity, an exo proportion of at least 50 mol % is preferred, with an exo proportion of at least 80 mol % being more preferred.

(L4-1-endo)

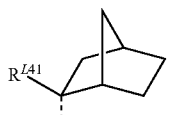

(L4-2-endo)

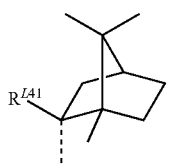

(L4-3-endo)

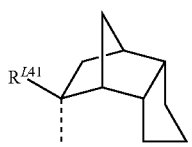

(L4-4-endo)

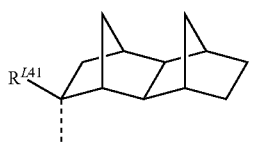

Herein $R^{L41}$ is as defined above.

Illustrative examples of the acid labile group of formula (L4) are given below, but not limited thereto.

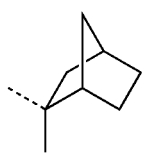 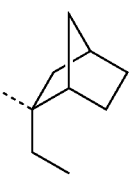 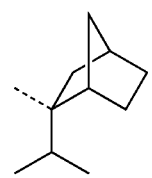

-continued
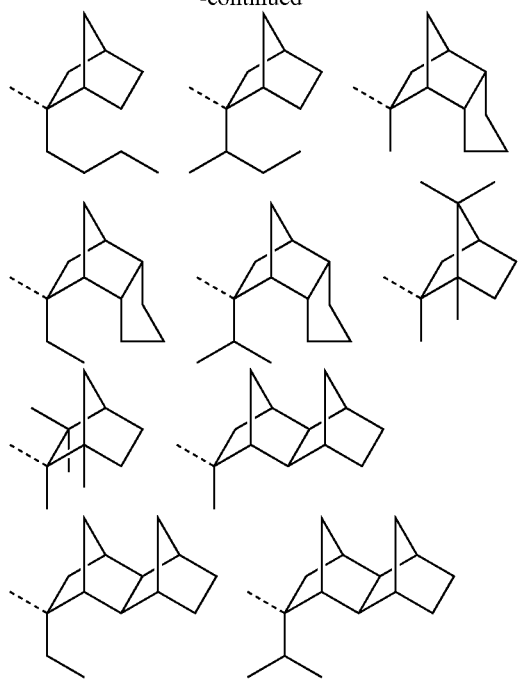
Examples of the acid labile group of formula (L5) are shown below.
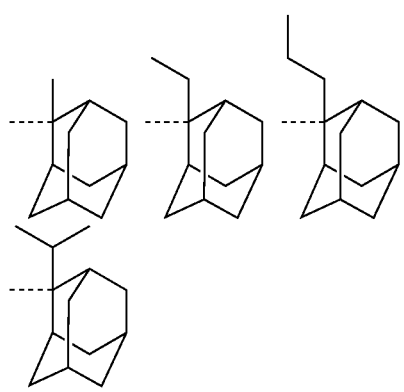
Examples of the acid labile group of formula (L6) are shown below.
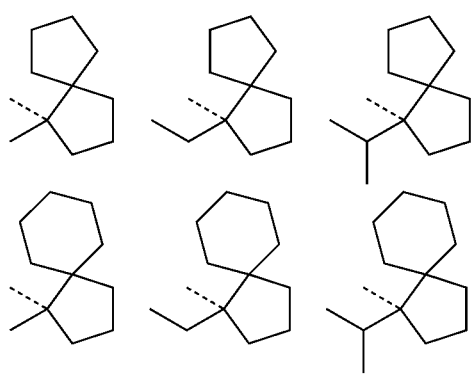
-continued
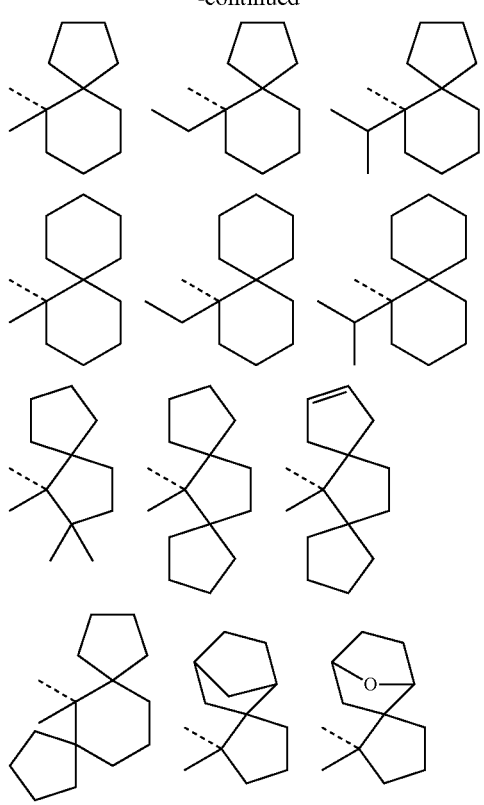
Examples of the acid labile group of formula (L7) are shown below.
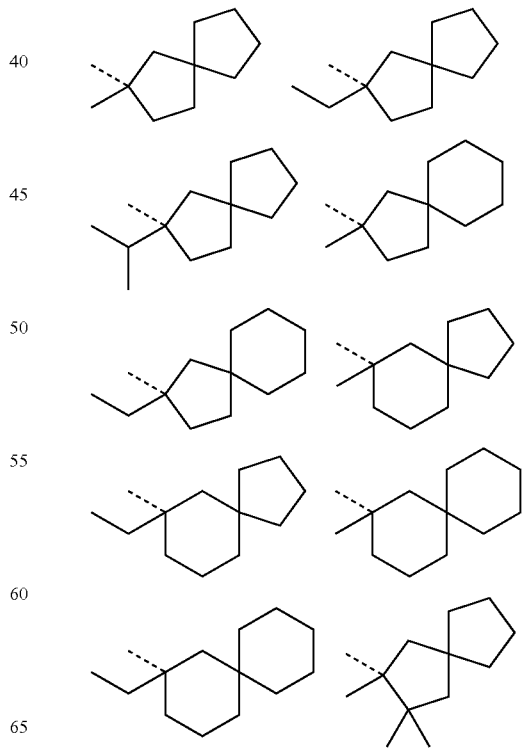

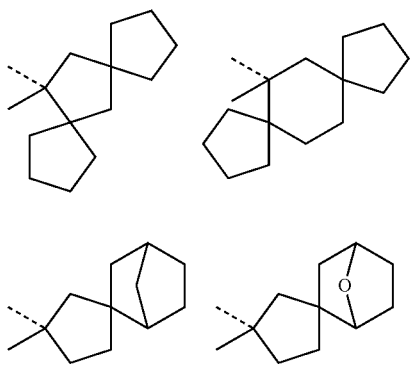

Examples of the acid labile group of formula (L8) are shown below.

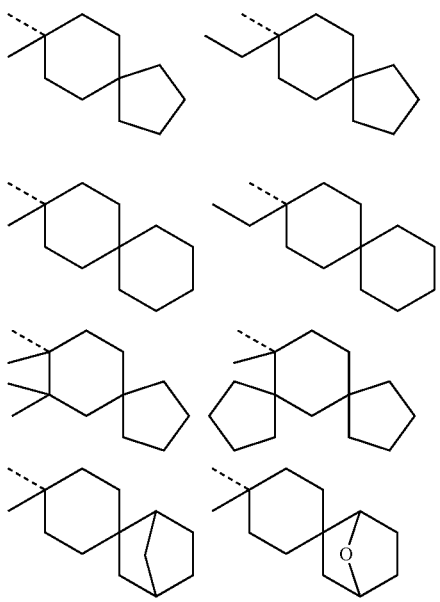

Suitable polymers (A) include, but are not limited to, (i) addition polymers of cyclic olefin monomers, (ii) hydrogenated products of ring-opening metathesis polymerization (ROMP) polymers of cyclic olefin monomers, and (iii) (meth)acrylate resins, each having a polar group protected with an acid labile group.

Illustrative, non-limiting examples of the addition polymers (i) are shown below.

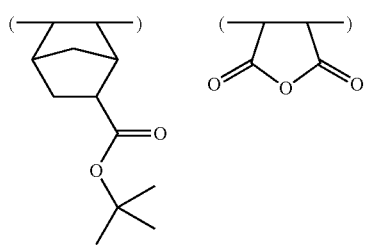

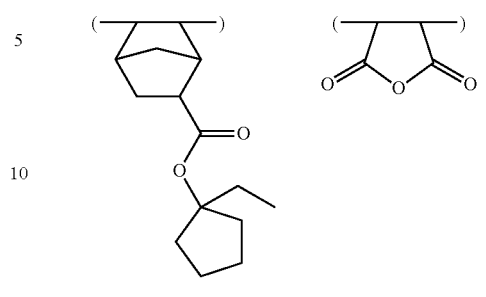

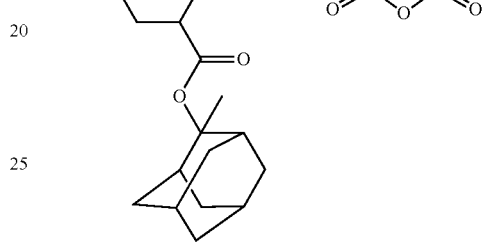

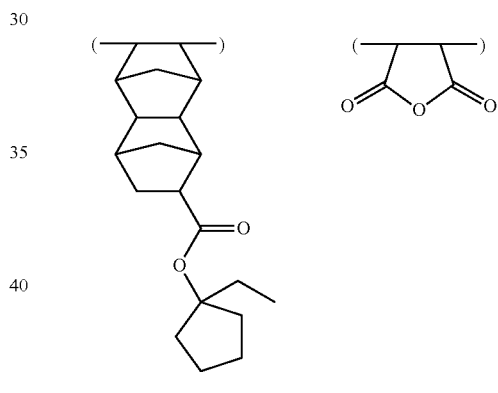

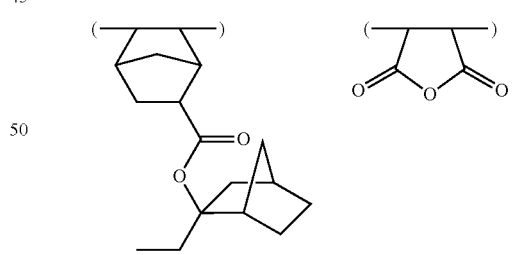

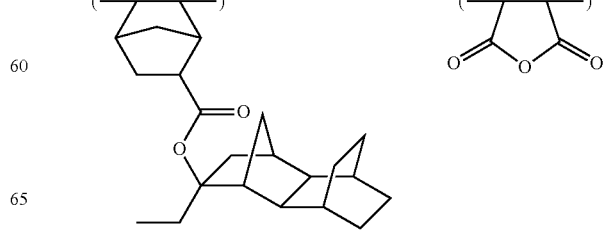

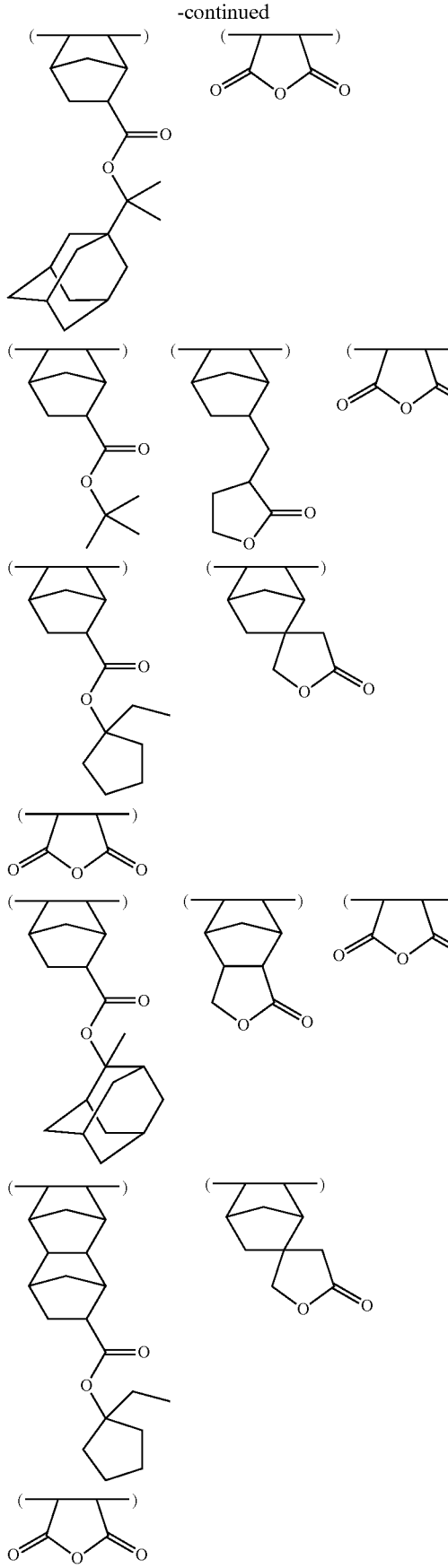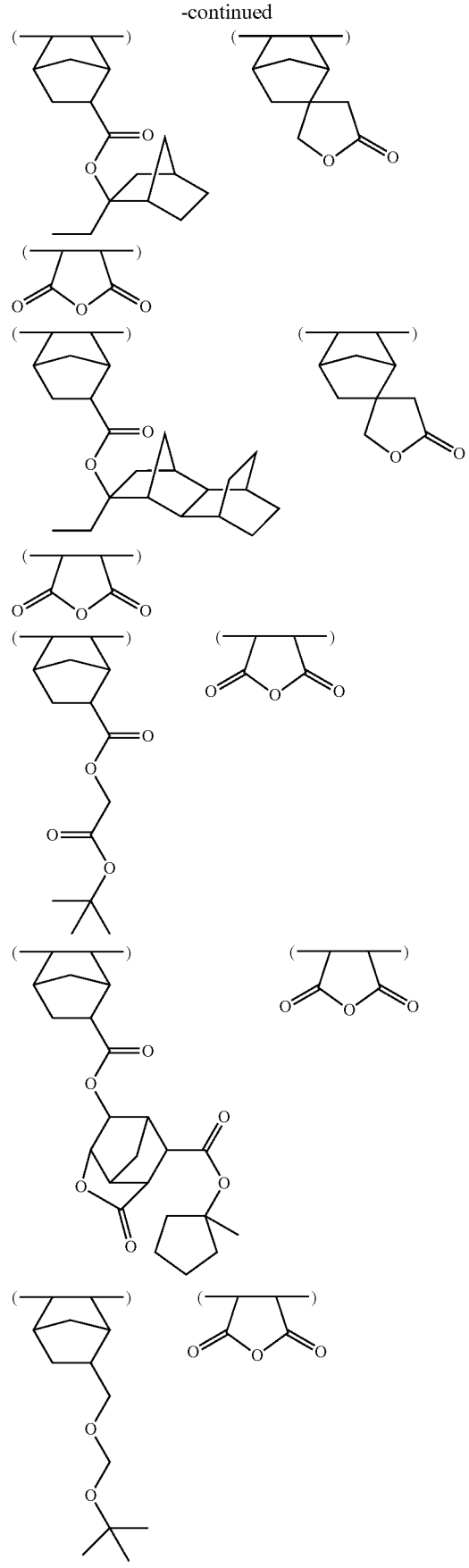

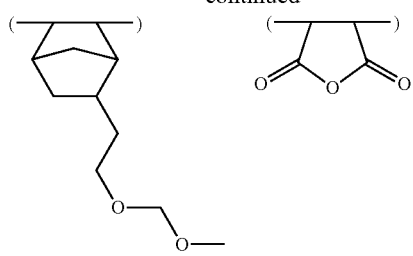
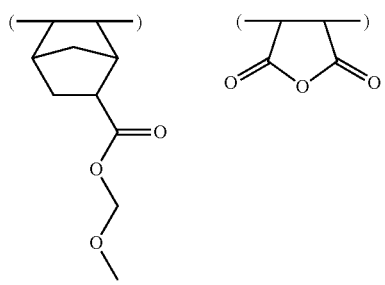
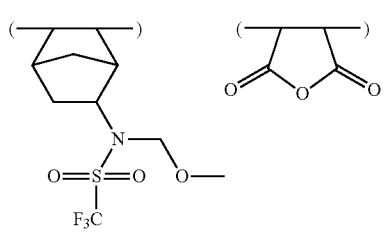
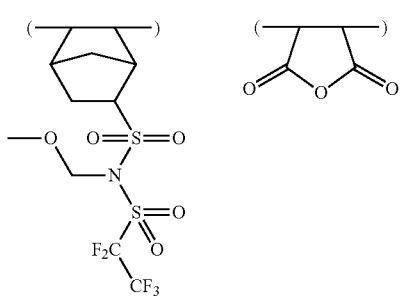
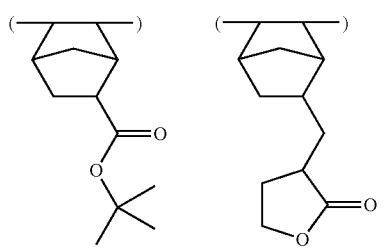
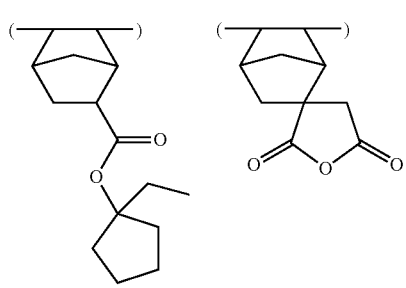
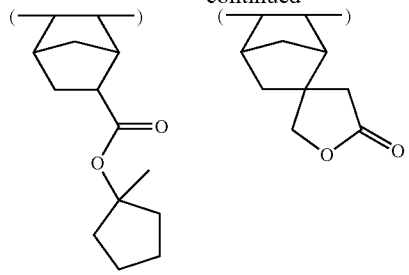
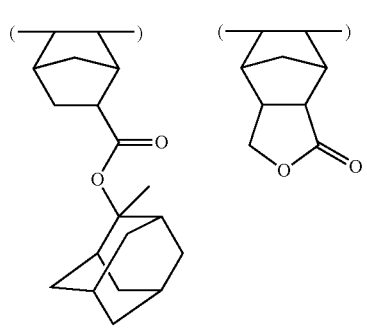
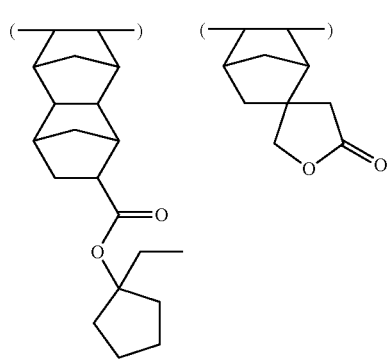
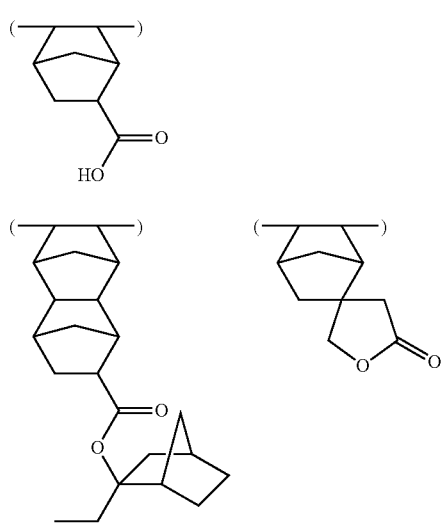
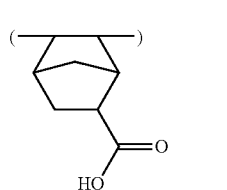

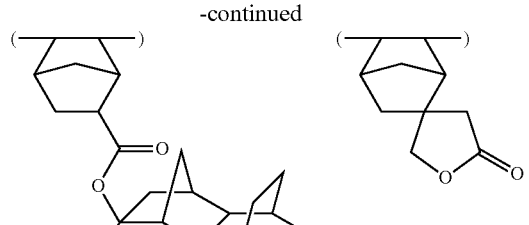
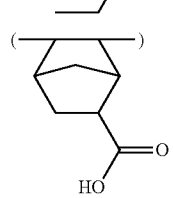
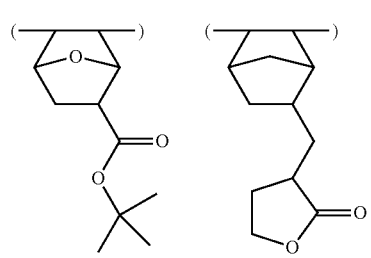
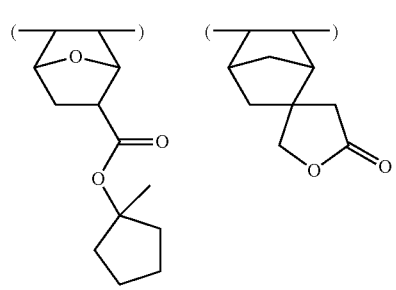
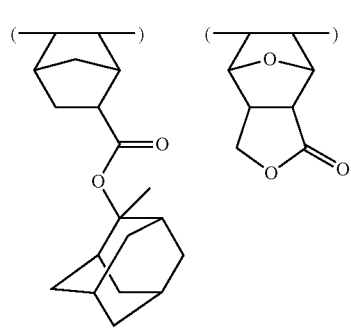
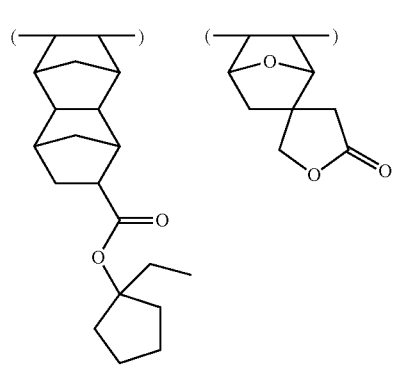
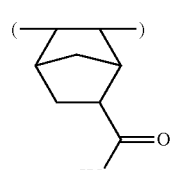
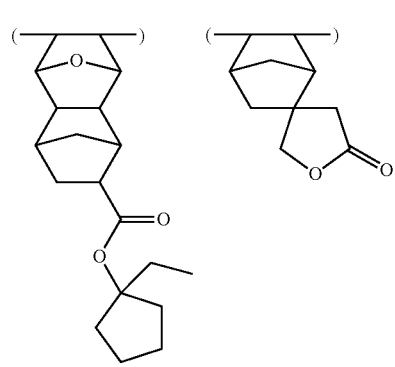
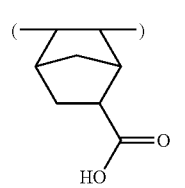
Illustrative, non-limiting examples of the hydrogenated ROMP polymers (ii) are shown below.
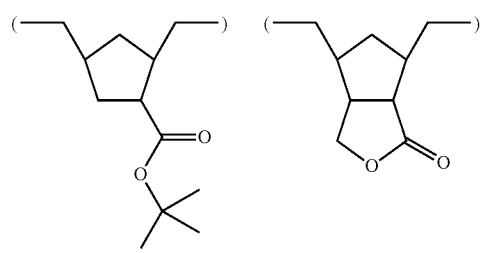
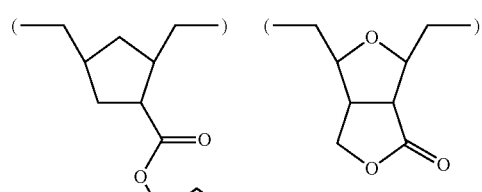
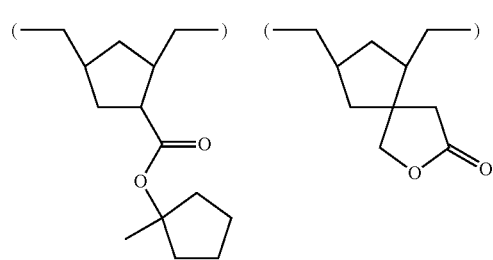

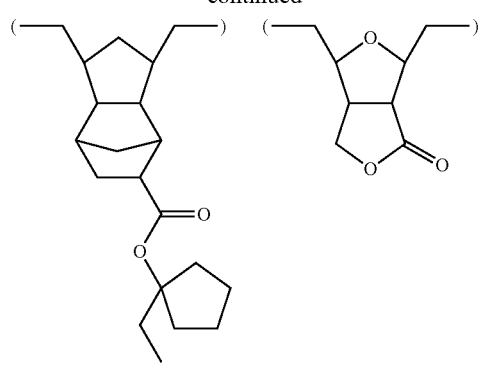
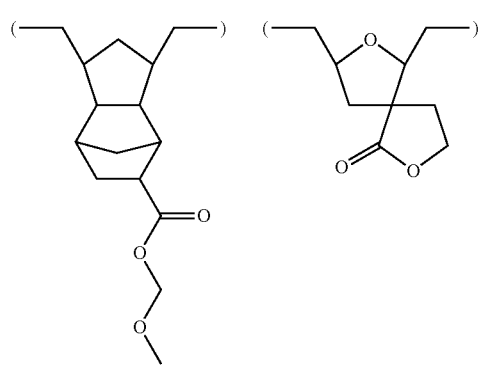
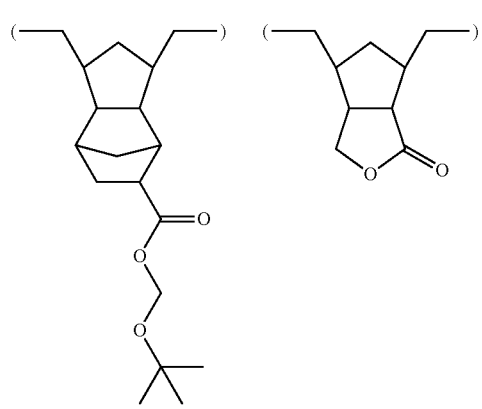
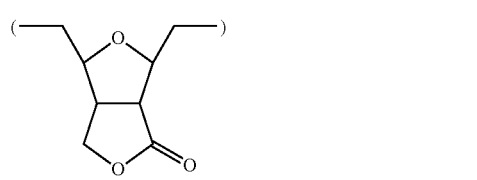
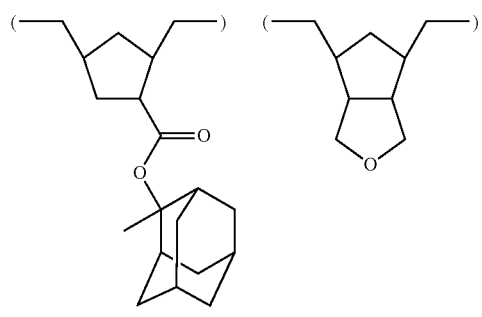
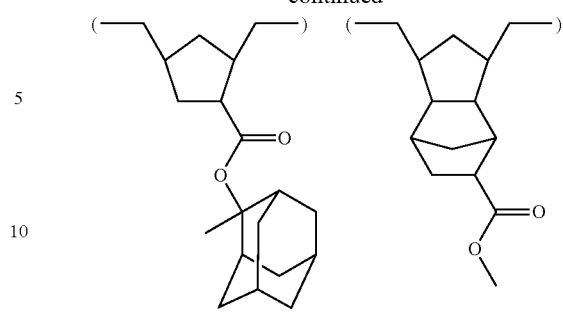
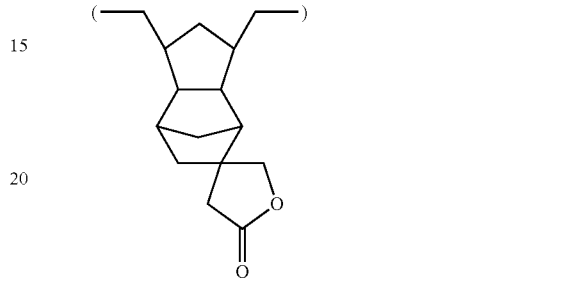
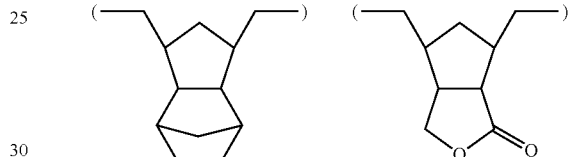
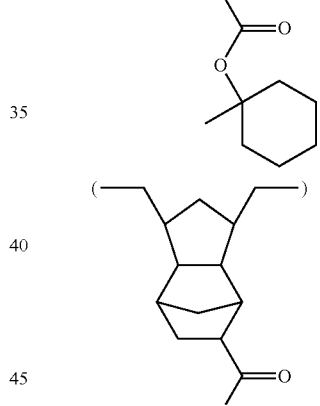
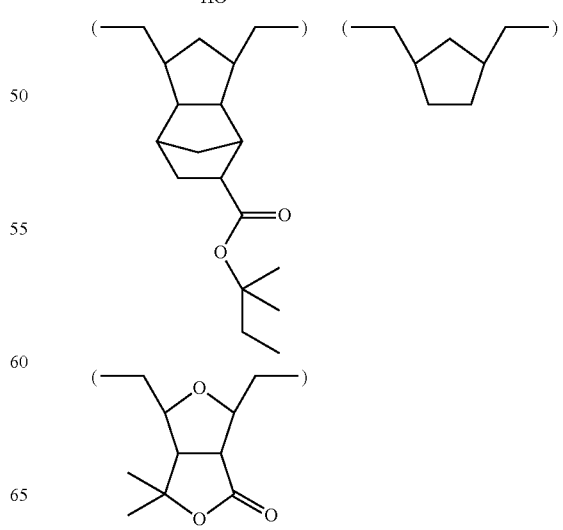

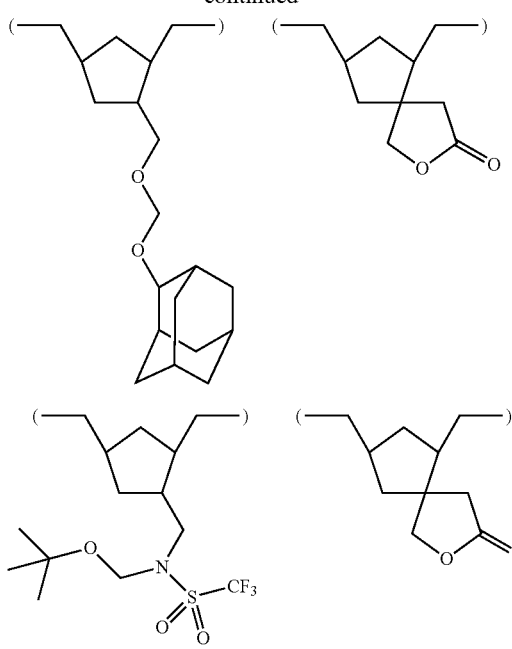
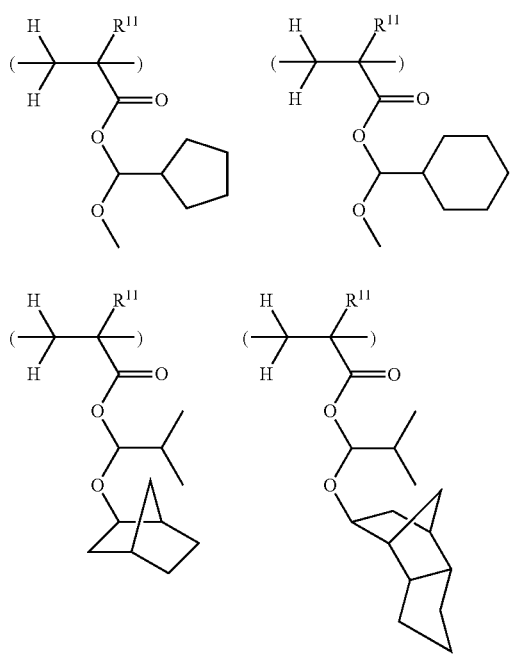

Most preferred as the polymer (A) are (iii) (meth)acrylate resins comprising recurring units having a polar group protected with an acid labile group. In general, (meth)acrylate resins are advantageous in dissolution contrast since they experience a great change in polarity before and after deprotection of the acid labile group.

The recurring unit having a polar group protected with an acid labile group, which is incorporated in the (meth)acrylate resins (iii), is represented by the following formula:

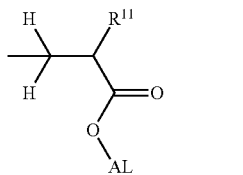

wherein $R^{11}$ is hydrogen or methyl, and AL is an organic group containing an acid labile group.

Examples of the recurring unit having a polar group protected with an acid labile group, which is incorporated in the (meth)acrylate resins (iii), are shown below, but not limited thereto.

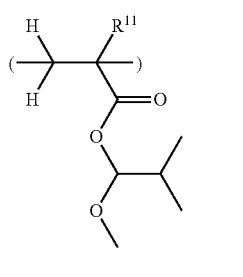
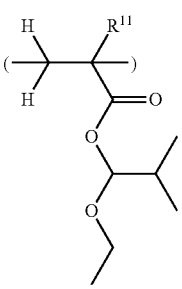
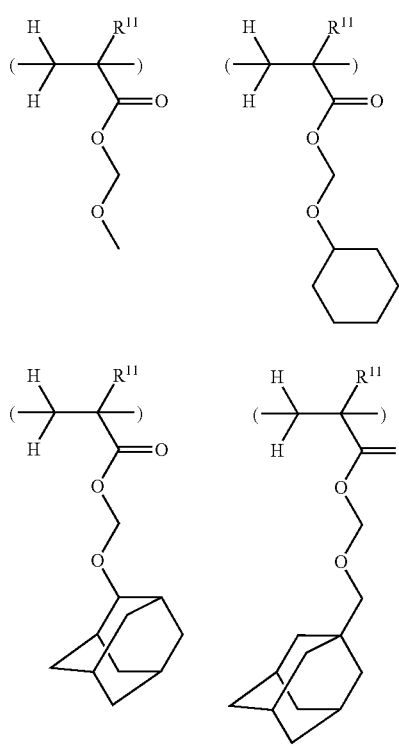
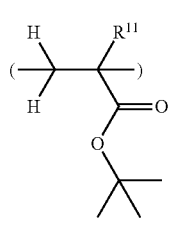
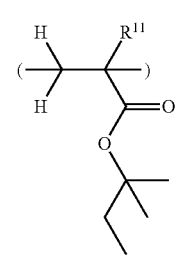

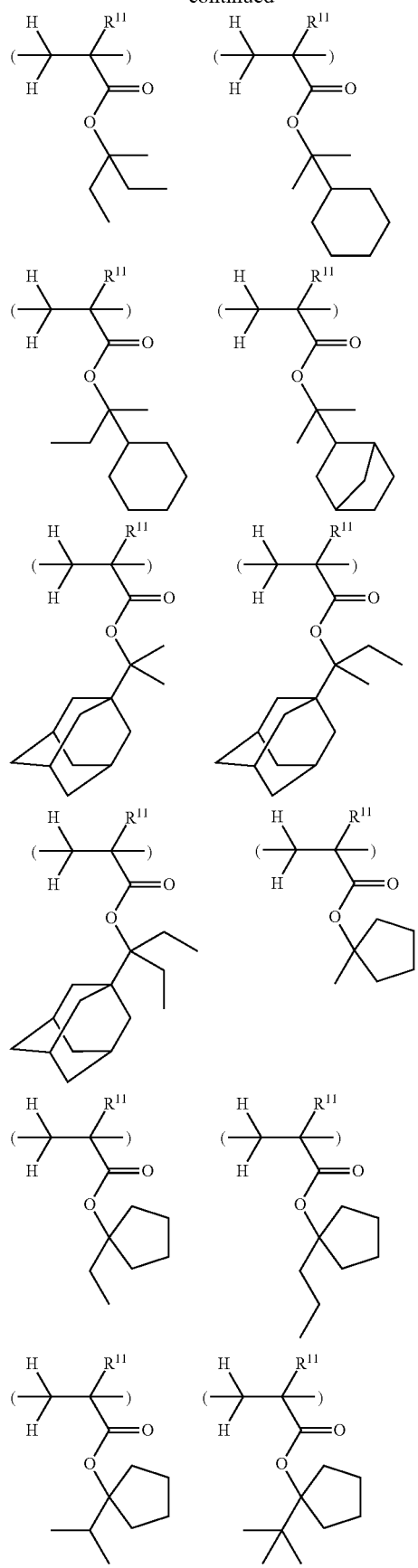
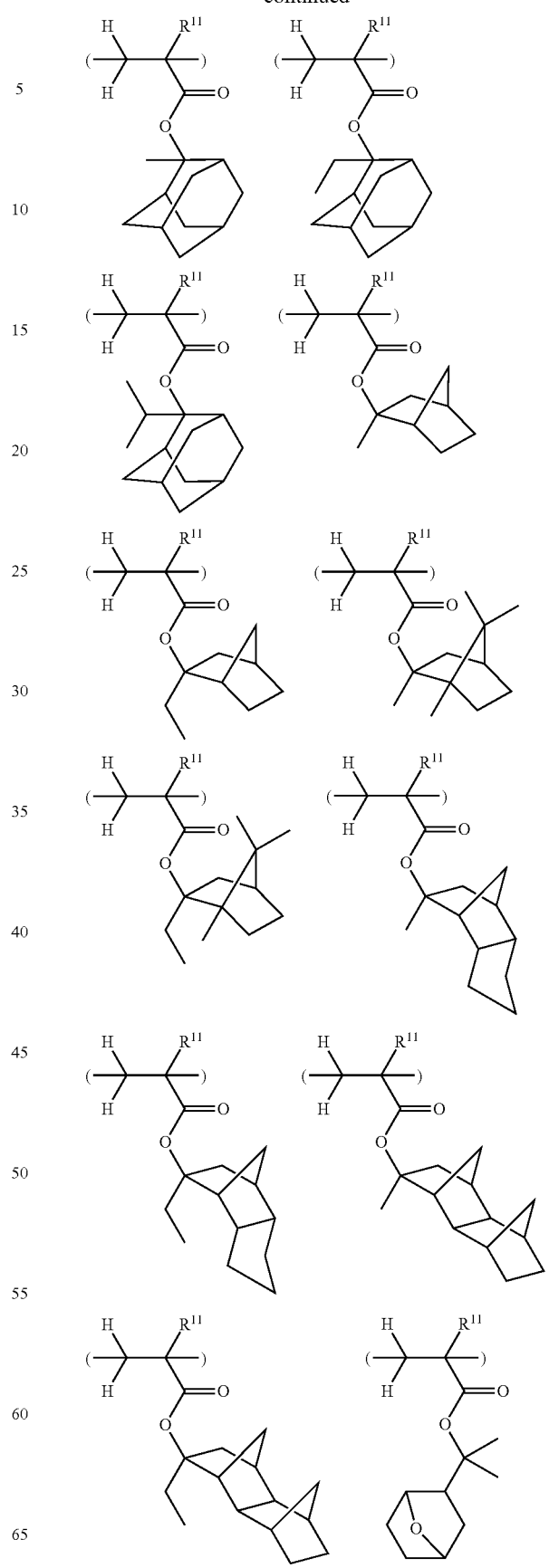

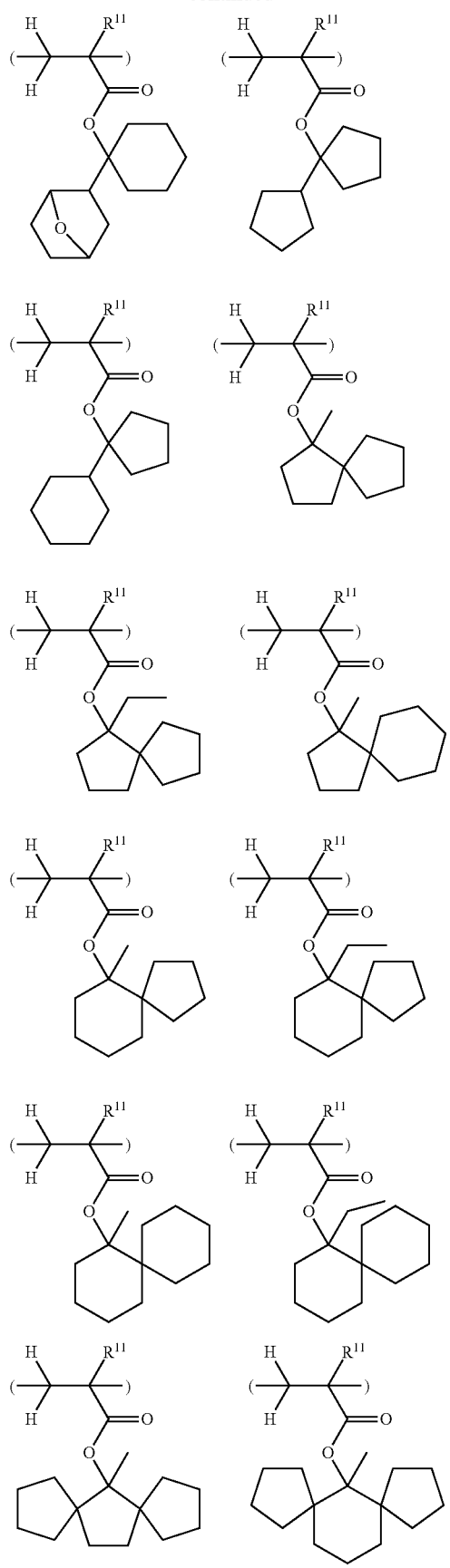
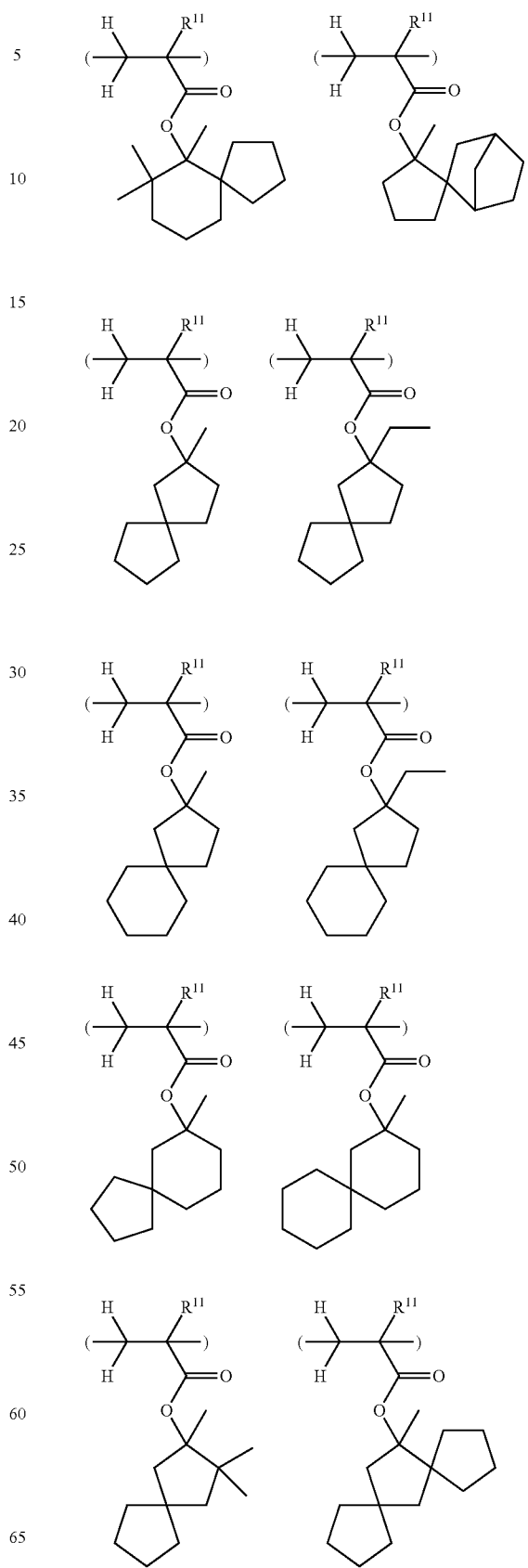

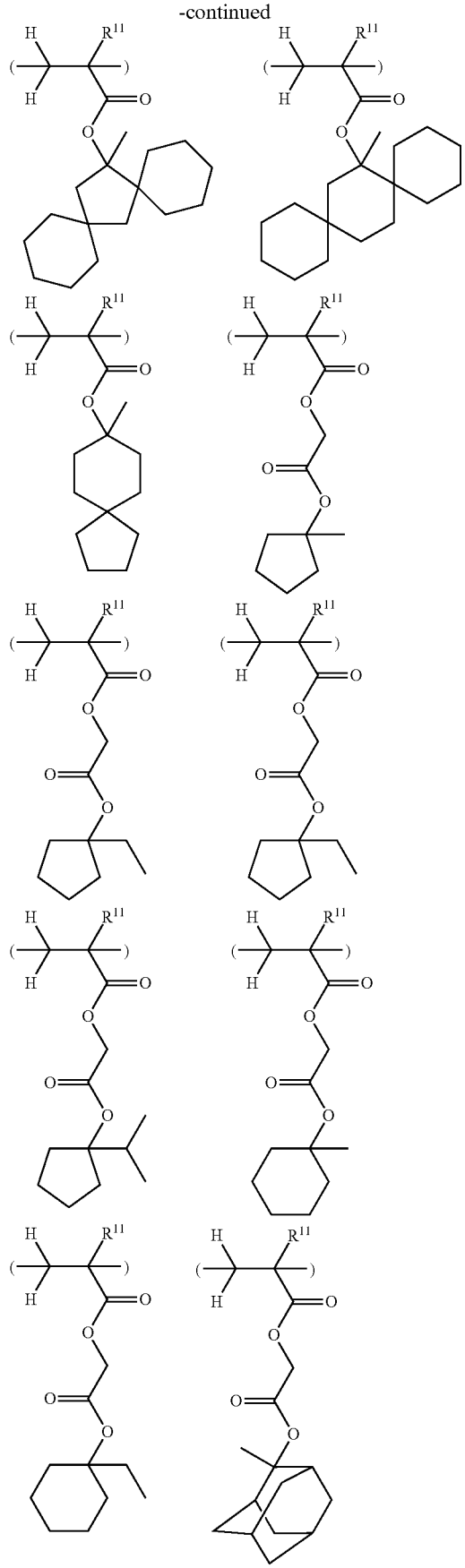
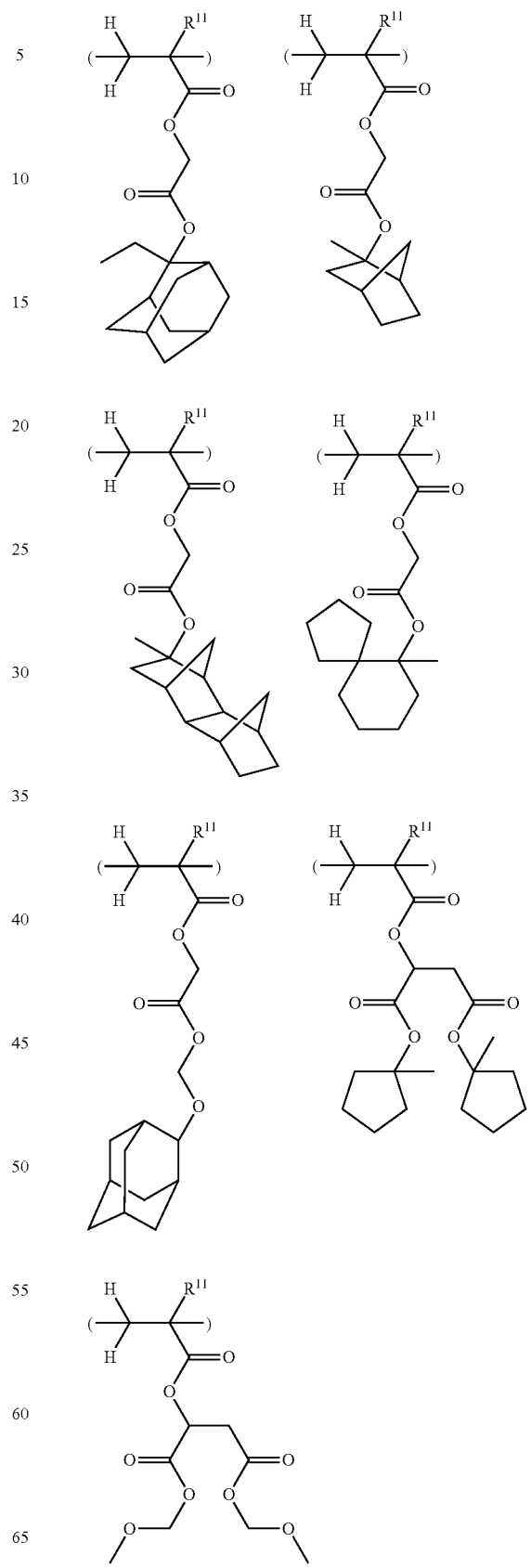

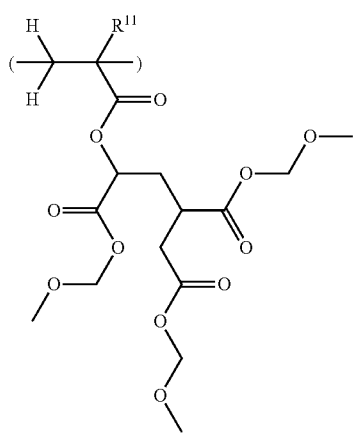
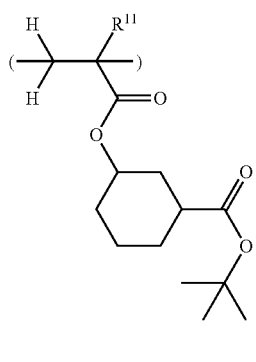
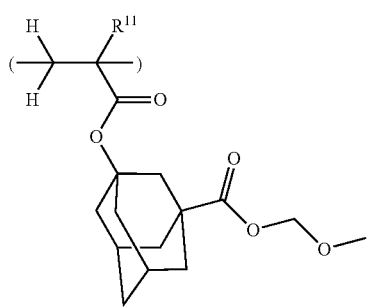
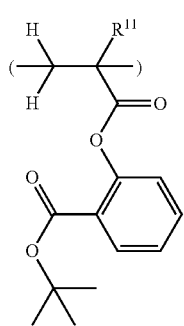
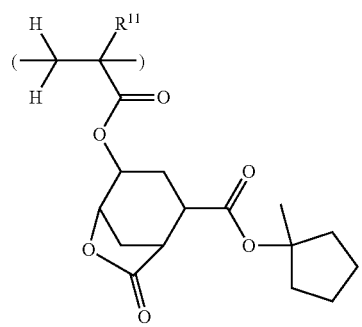
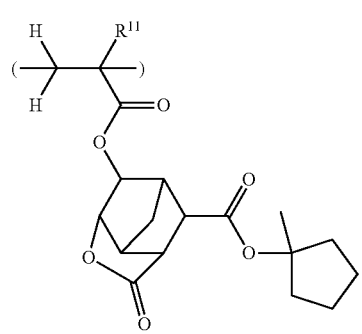
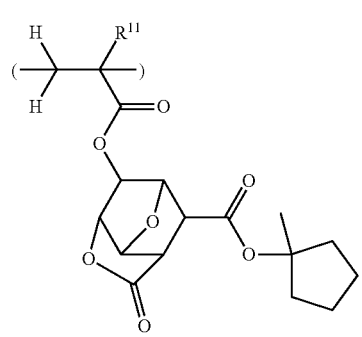
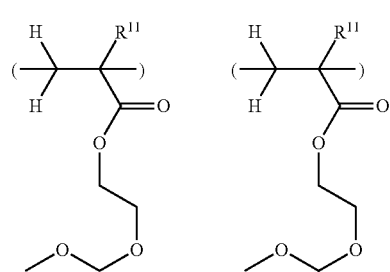
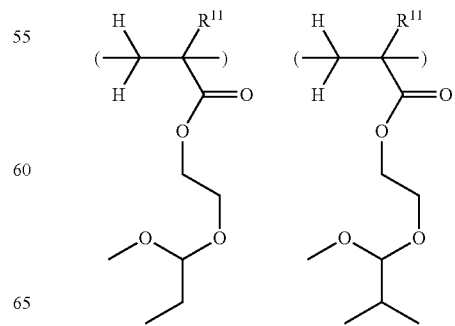

35
-continued
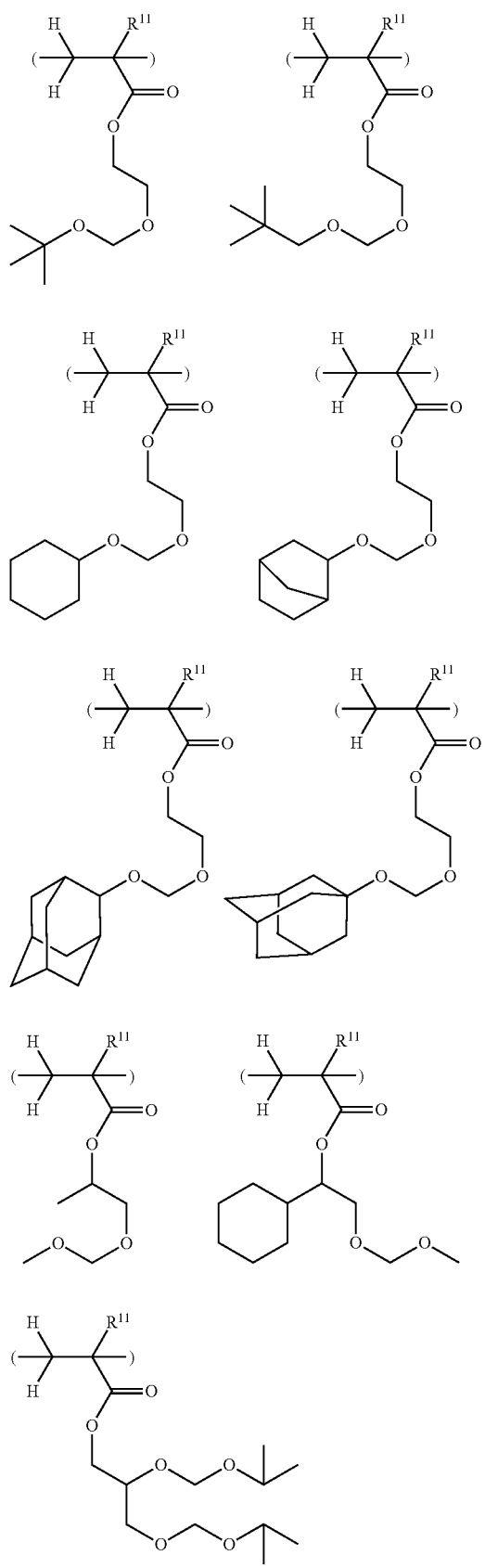
36
-continued
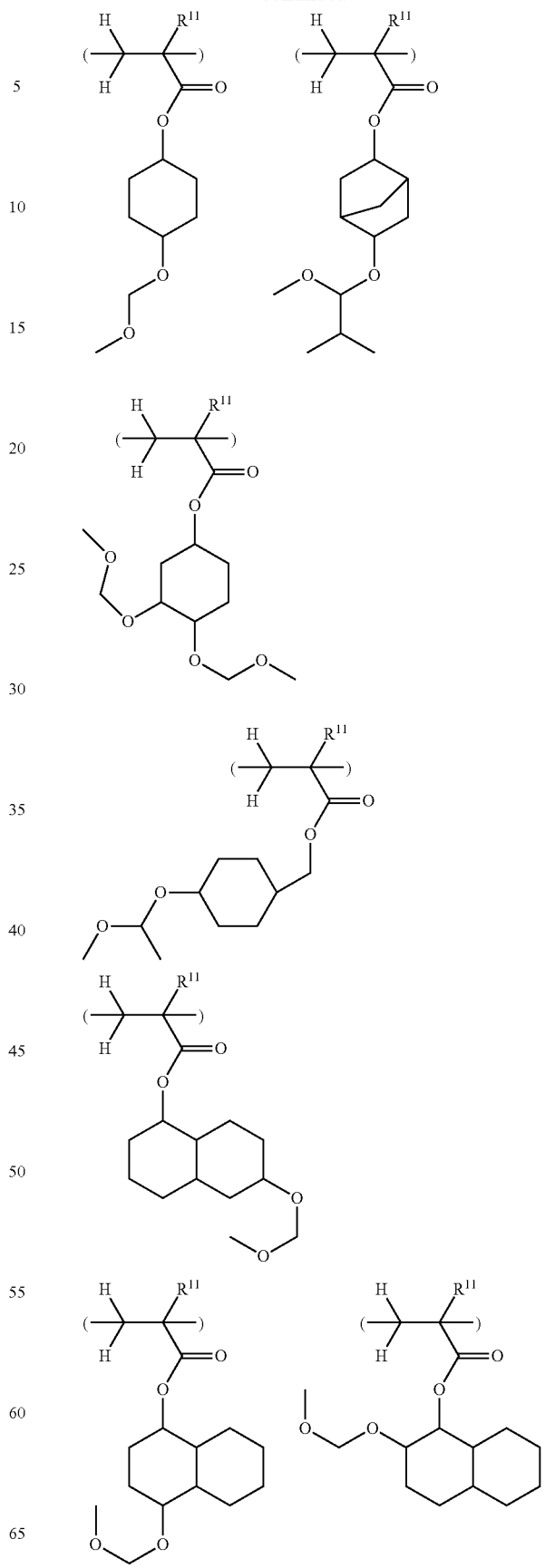

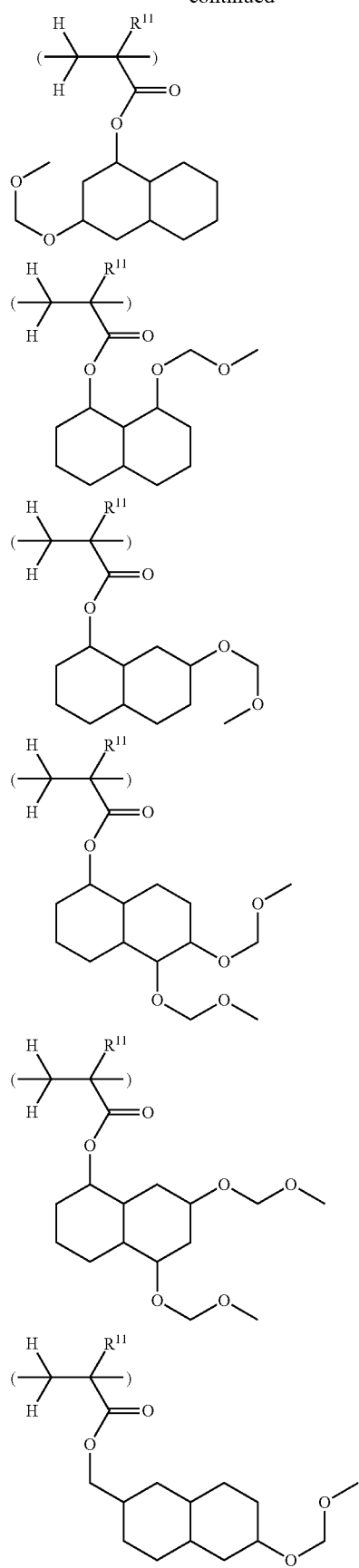
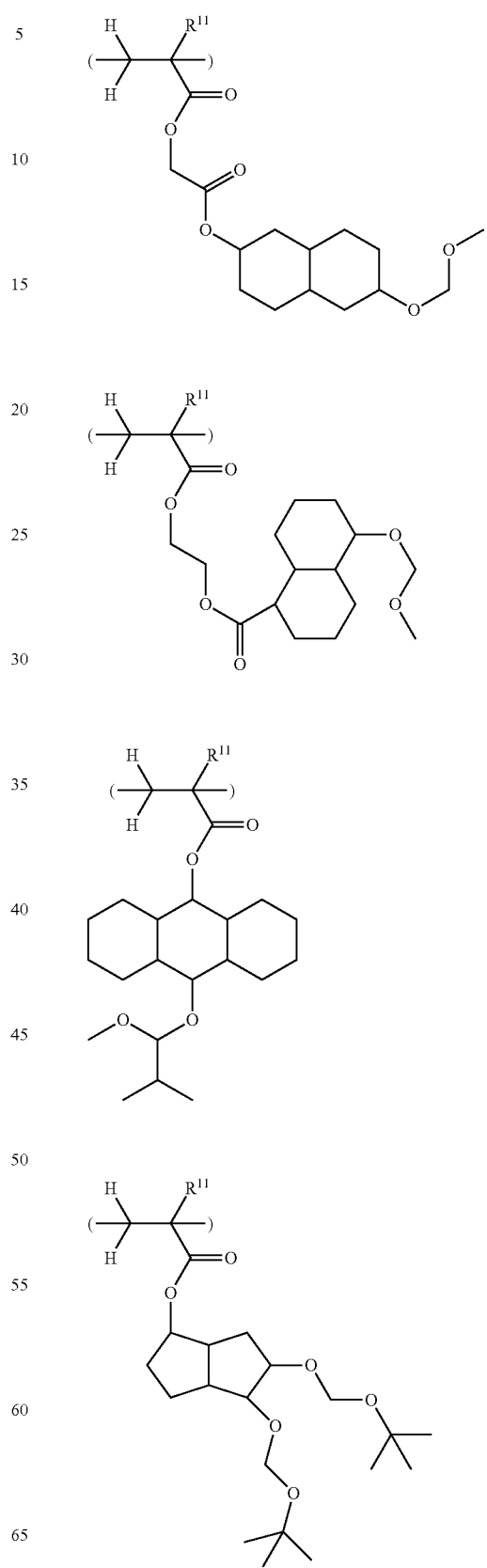

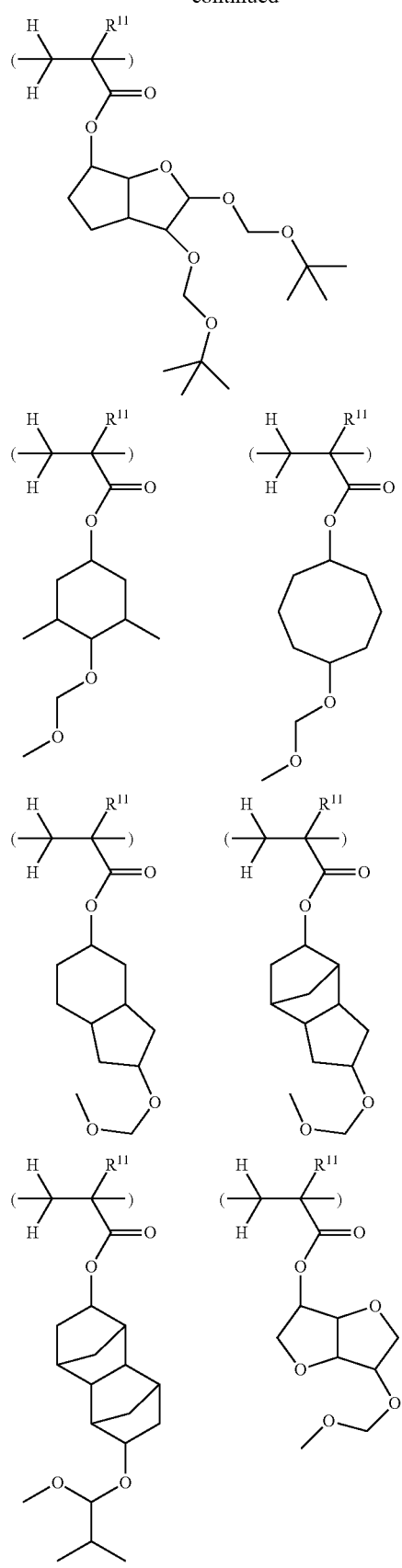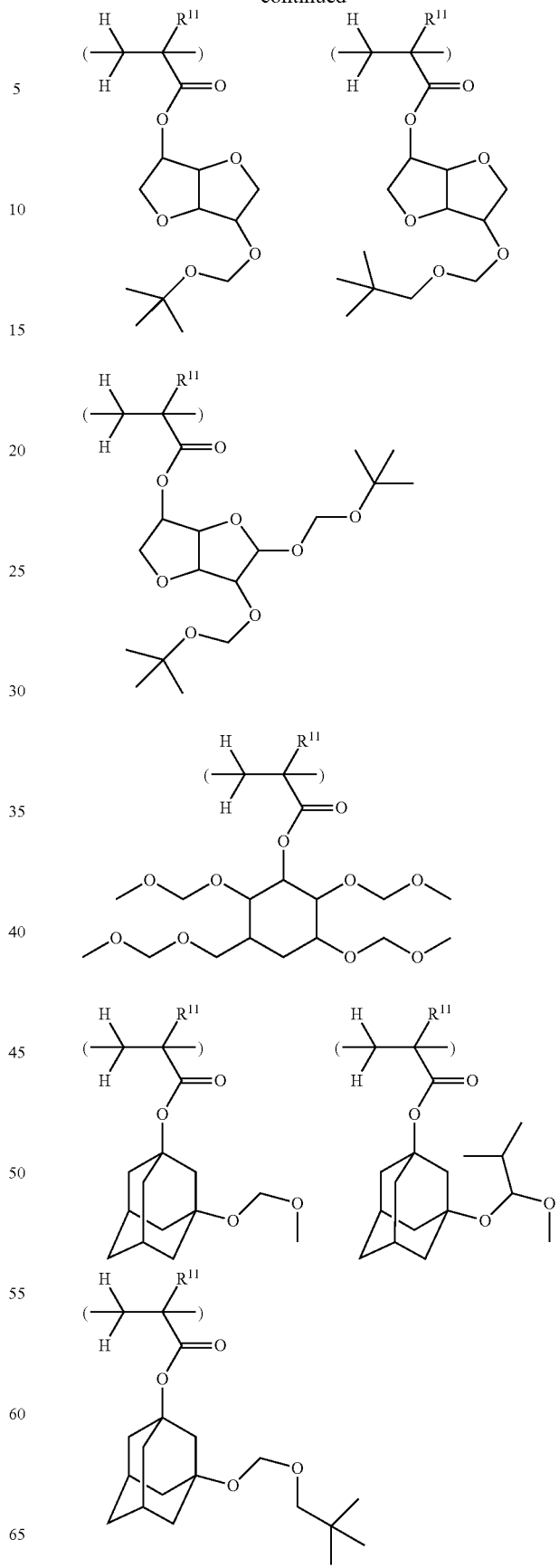

41
-continued
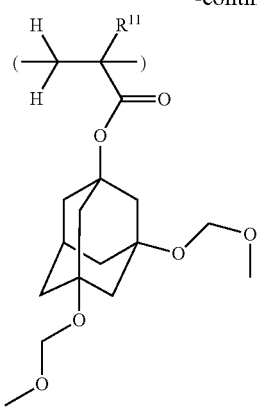
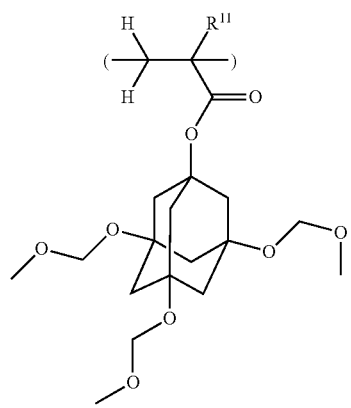
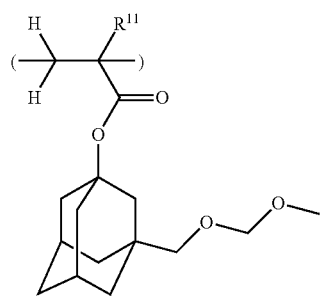
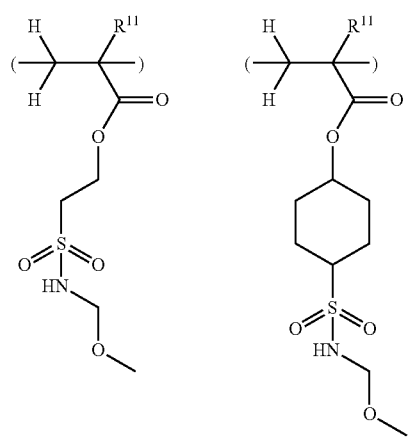
42
-continued
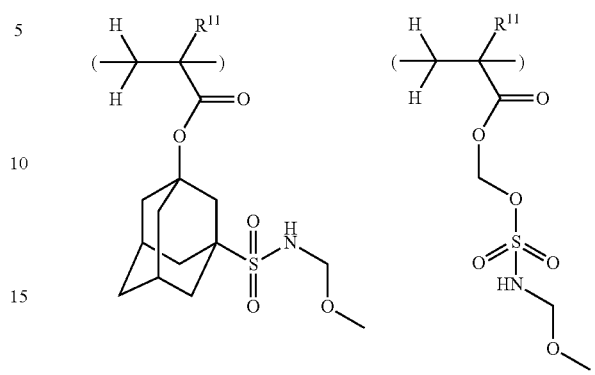
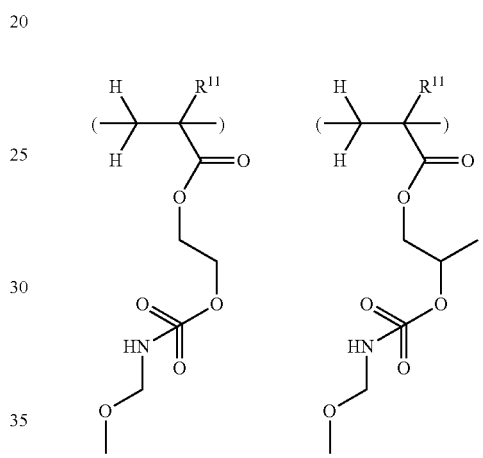
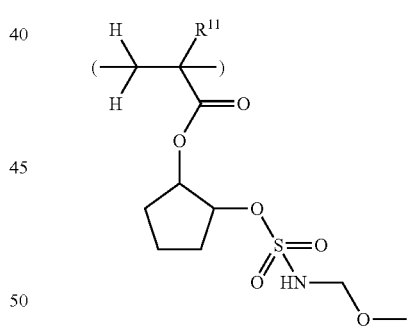
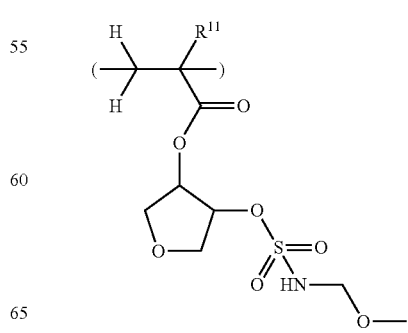

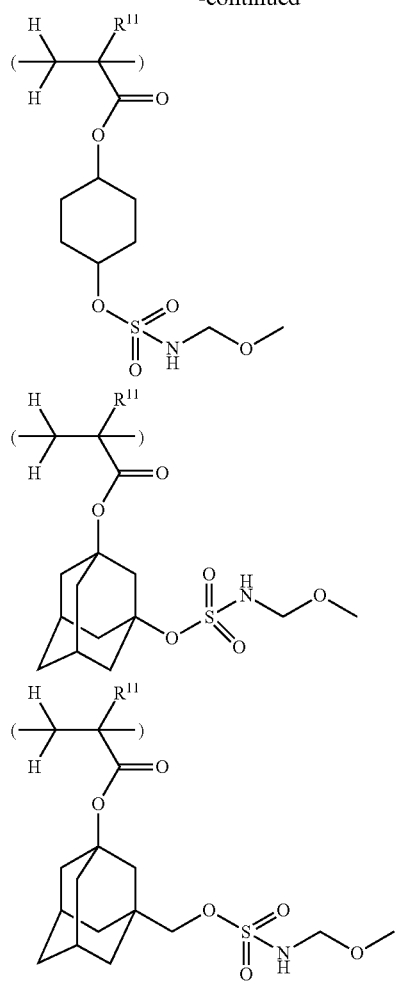

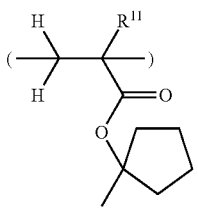 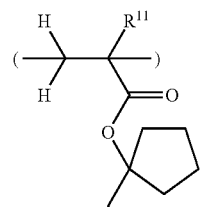

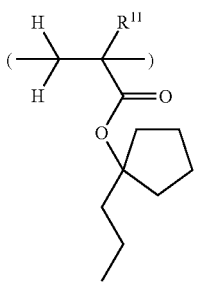 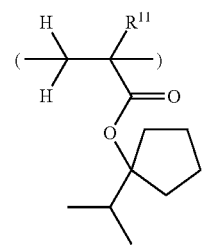

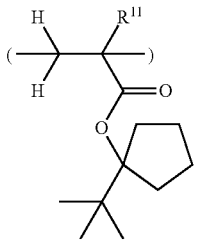 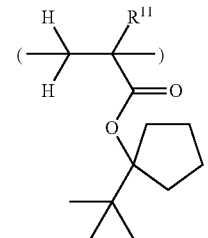

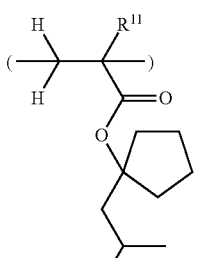 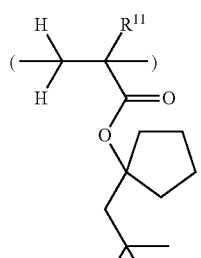

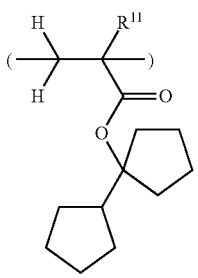

Herein $R^{11}$ is hydrogen or methyl.

Of the recurring units having a polar group protected with an acid labile group, which are incorporated in the polymer (A), recurring units having the general formula (2) are most preferred.

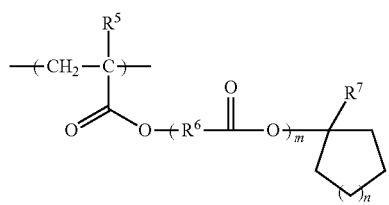

(2)

In formula (2), $R^5$ is hydrogen or methyl, $R^6$ is a straight, branched or cyclic, divalent aliphatic hydrocarbon group of 2 to 16 carbon atoms which may have an ether or ester bond, $R^7$ is a straight, branched or cyclic $C_1$-$C_7$ alkyl group, m is 0 or 1, and n is 1 or 2. The recurring units of formula (2) have a high solubility in organic solvent developer and contribute to an improvement in dissolution contrast.

Examples of the recurring units of formula (2) are shown below, but not limited thereto.

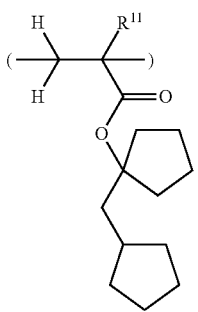

-continued
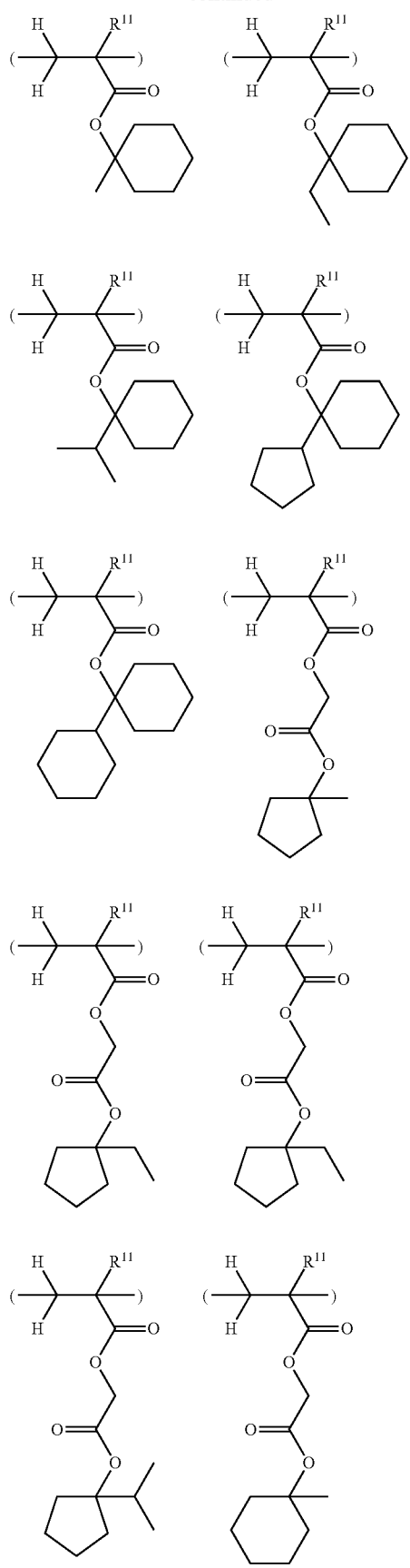
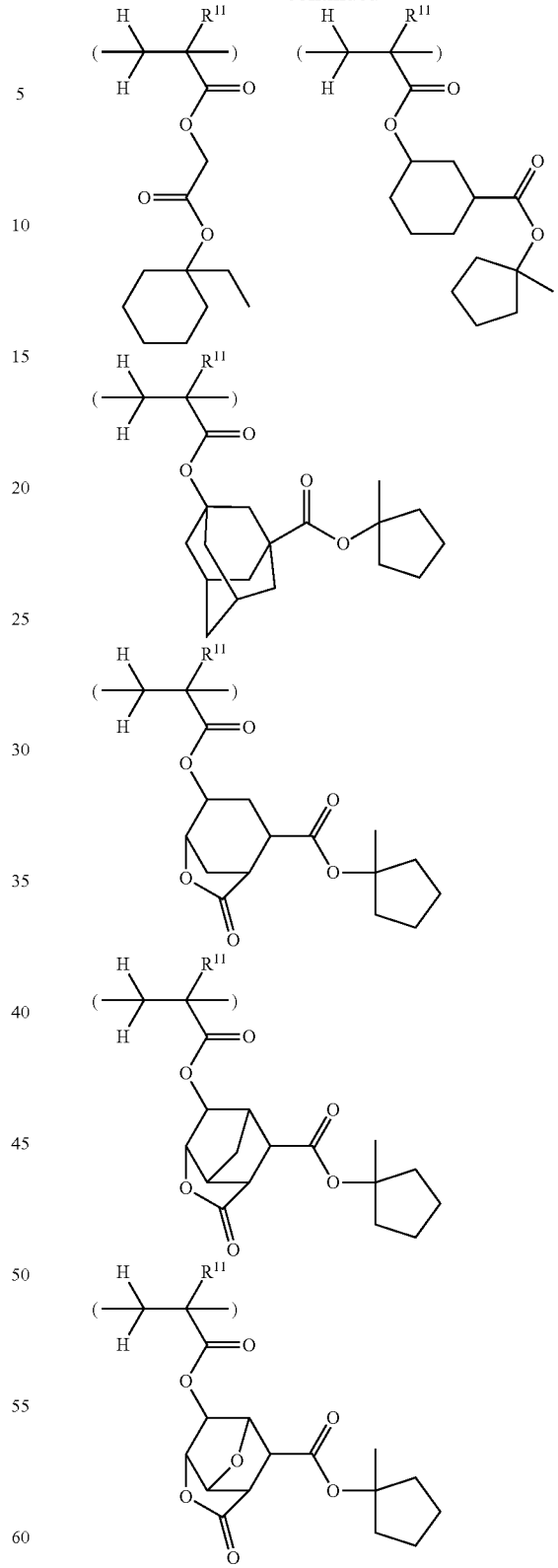
Herein $R^{11}$ is as defined above.
Of the recurring units of formula (2), those units wherein $R^7$ is tert-butyl, tert-pentyl or neopentyl are most preferred from the aspect of solubility of the unexposed region.

In the polymer (A), there may be incorporated two or more types of recurring units having a polar group protected with an acid labile group. The recurring units of formula (2) should preferably account for 20 to 100 mol %, more preferably 40 to 100 mol % of the entire recurring units having an acid labile group.

In addition to the recurring units having an acid labile group, the polymer (A) may preferably comprise recurring units of the structure having the general formula (3).

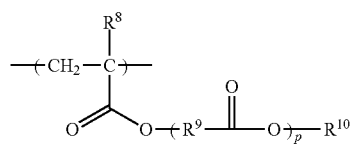

Herein $R^8$ is hydrogen or methyl, $R^9$ is a straight, branched or cyclic, divalent aliphatic hydrocarbon group of 2 to 16 carbon atoms which may have an ether or ester bond, $R^{10}$ is a cyclic hydrocarbon group of 4 to 15 carbon atoms having at least one partial structure selected from the group consisting of hydroxyl, ether, ketone, ester, carbonic acid ester, and sulfonic acid ester, and p is 0 or 1.

Combining the recurring units of the structure having formula (3) with the recurring units having an acid labile group (typically having formula (2)) makes it possible to suppress the dissolution rate of the exposed region to further enhance the dissolution contrast.

Examples of the recurring units of formula (3) are shown below, but not limited thereto.

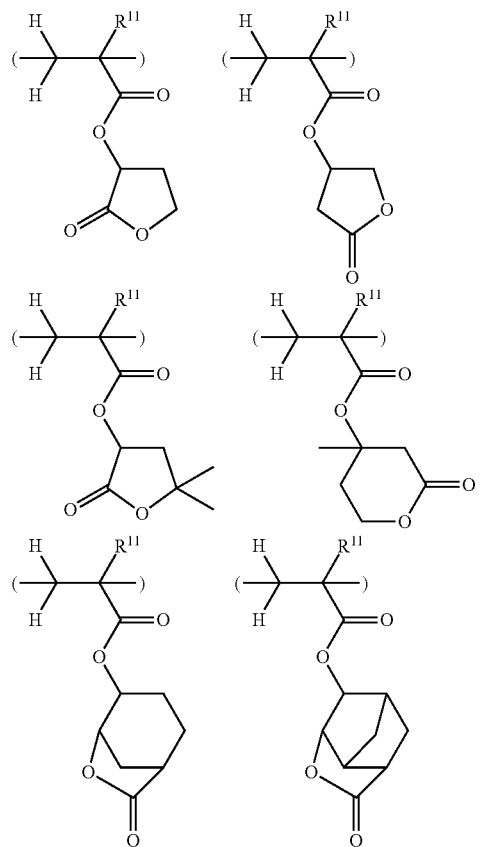

-continued

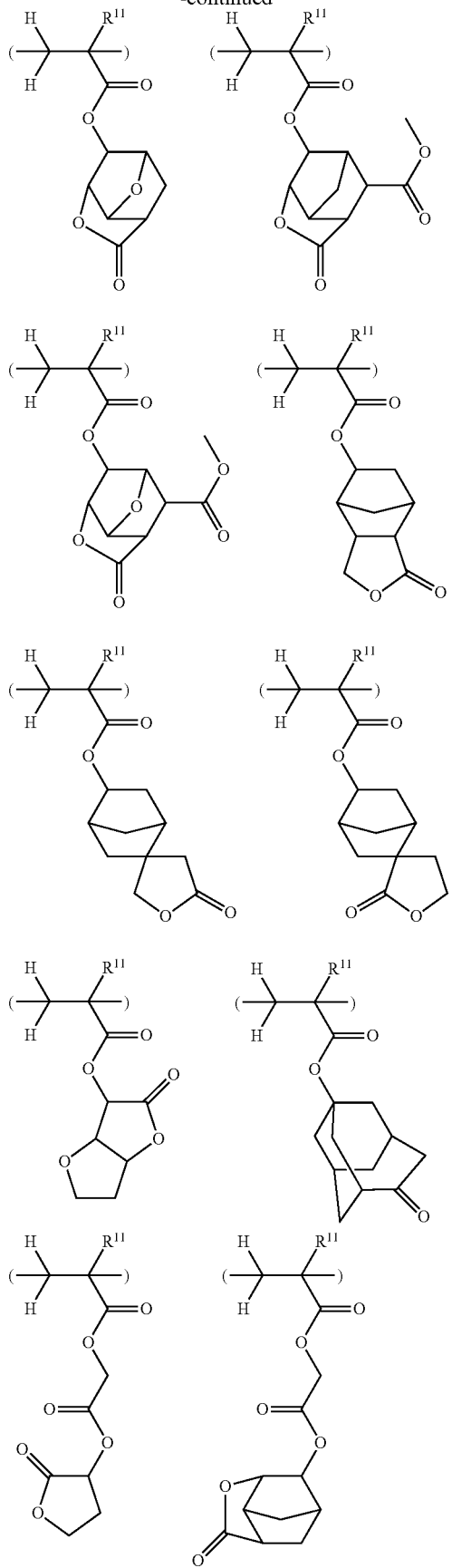

-continued
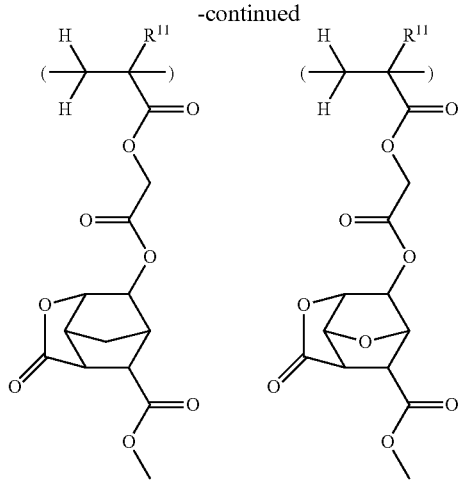
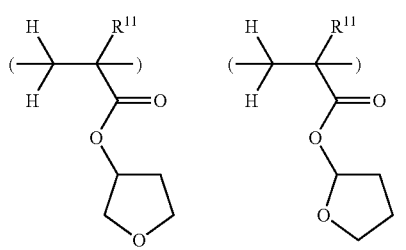
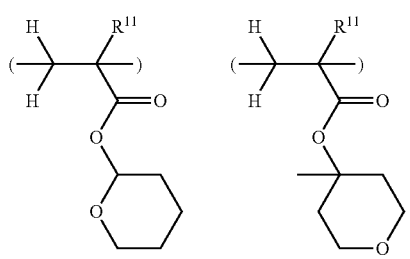
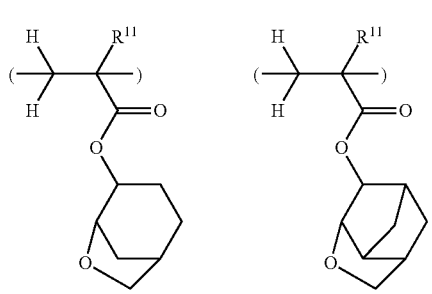
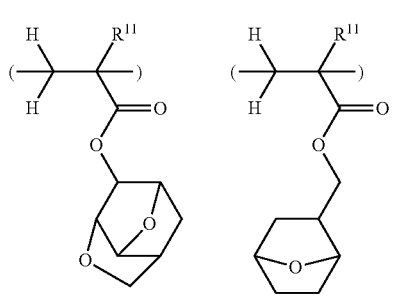
-continued
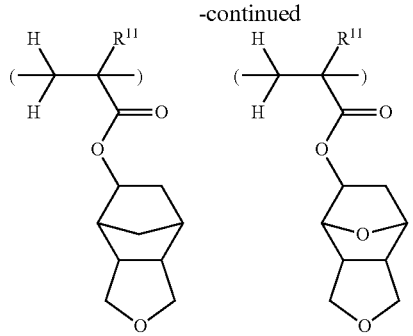
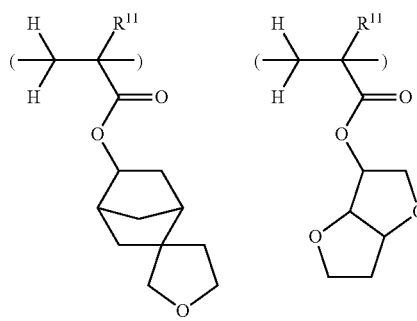
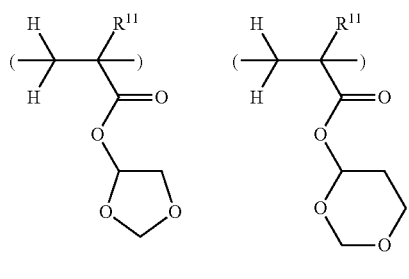
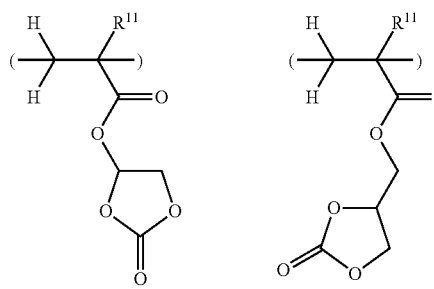
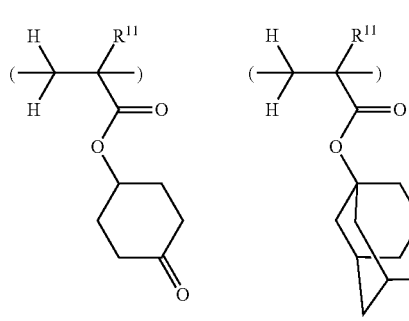

51
-continued
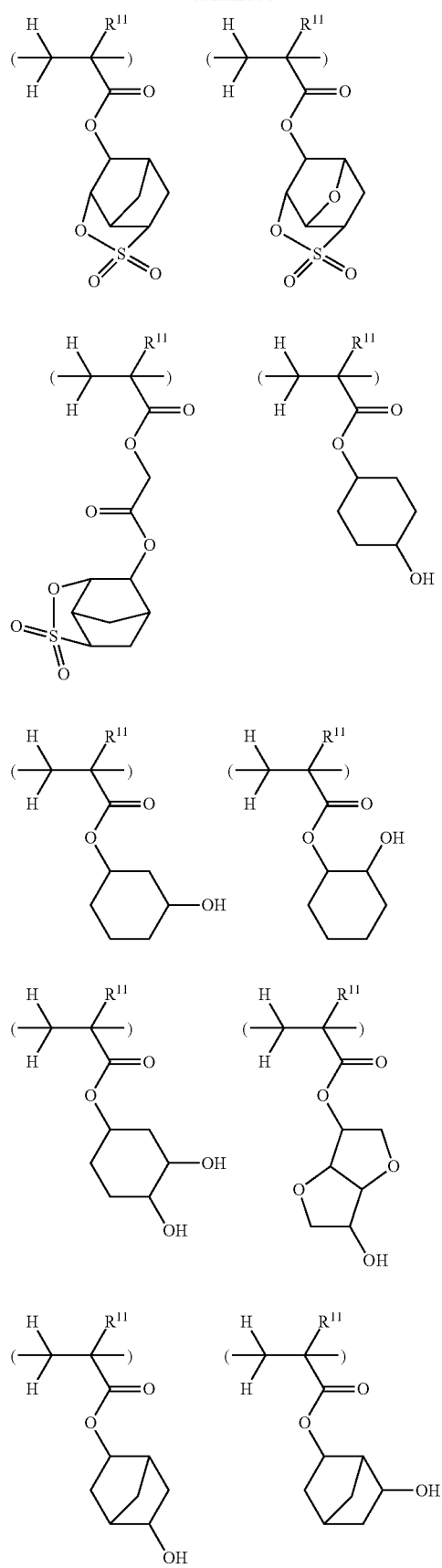
52
-continued
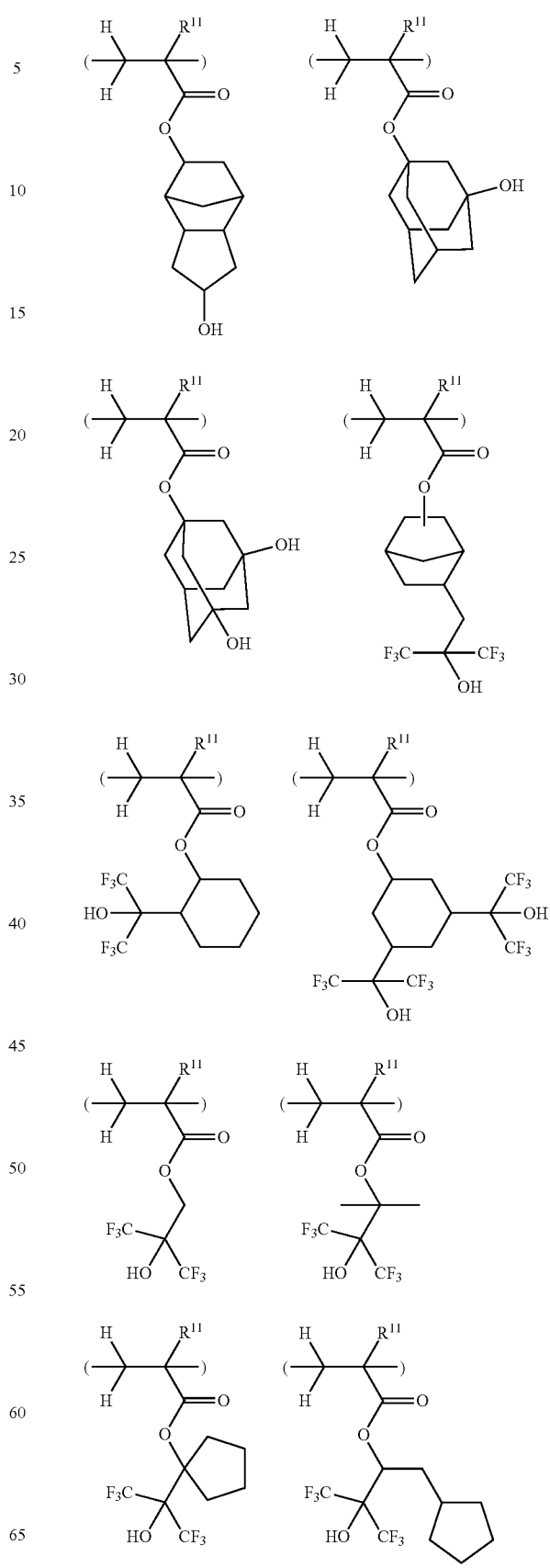

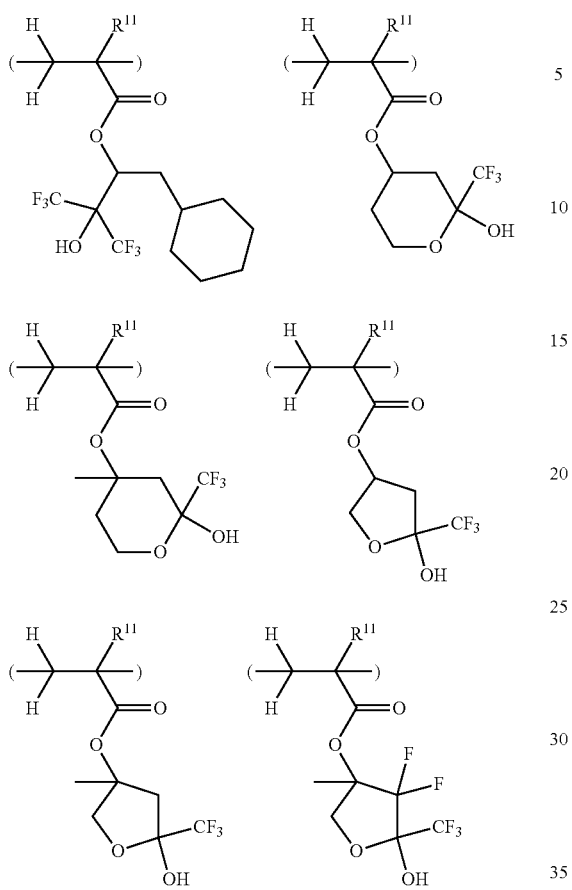

Herein R[11] is as defined above.

The polymer (A) may further comprise other recurring units, examples of which include units having a polar group such as a carboxyl, amino, amide, carbamate or cyano group, and units having an aromatic group. Inclusion of these optional units enables to adjust the dissolution behavior in developer and to control the diffusion of generated acid. Examples of the other recurring units are given below, but not limited thereto.

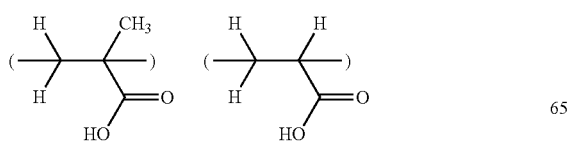

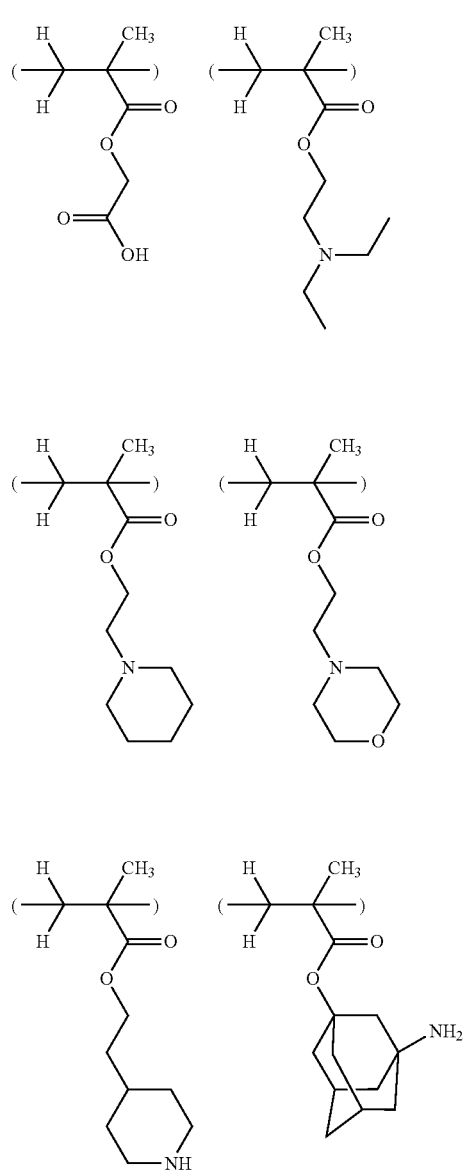

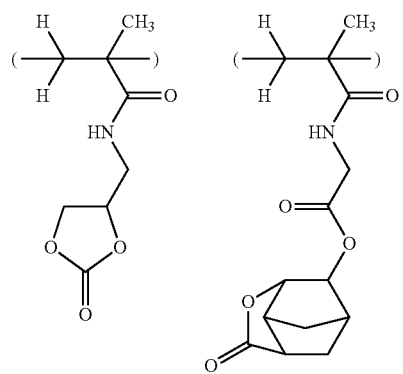

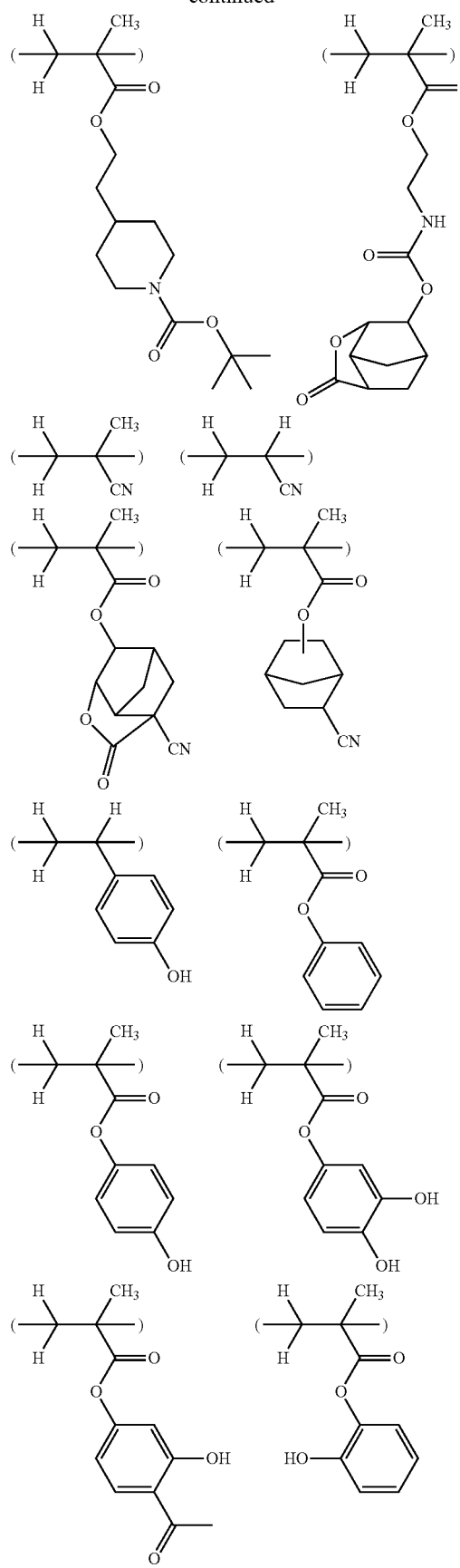
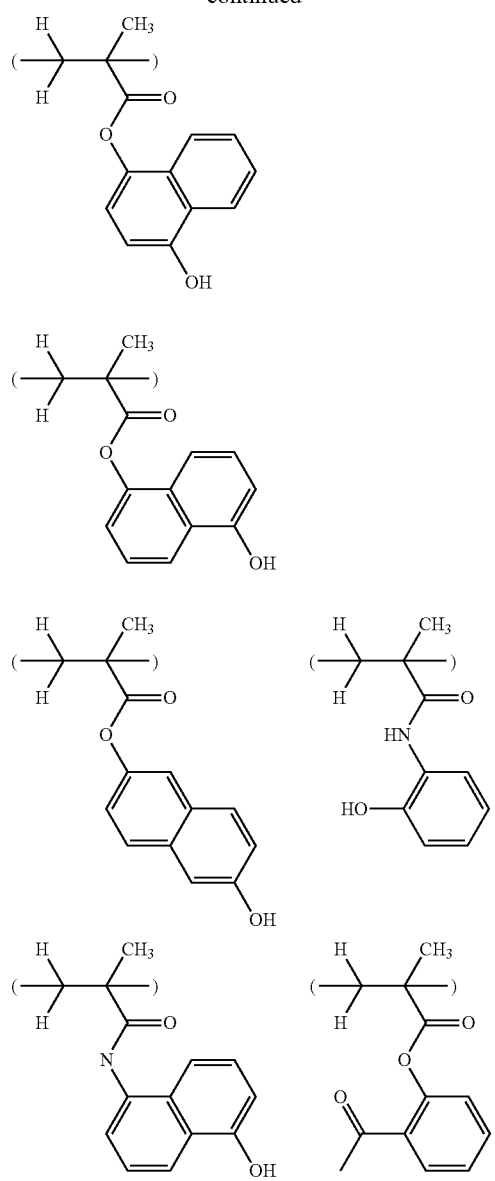

In the polymer (A), recurring units having an oxirane or oxetane ring may be further copolymerized. Copolymerization of recurring units having an oxirane or oxetane ring is effective for improving film retention and etch resistance of the exposed region because the exposed region is crosslinked. Examples of the recurring units having an oxirane or oxetane ring are given below.

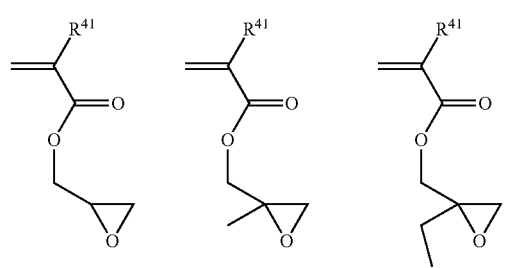

-continued
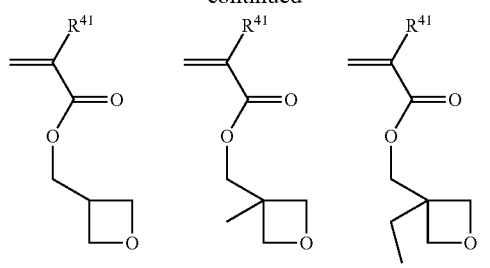
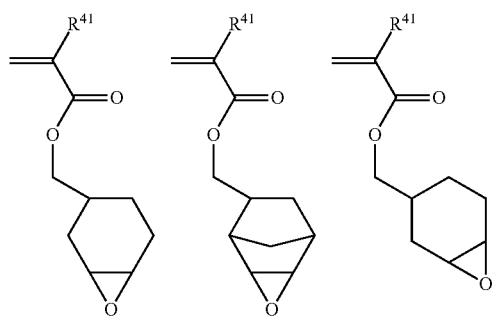
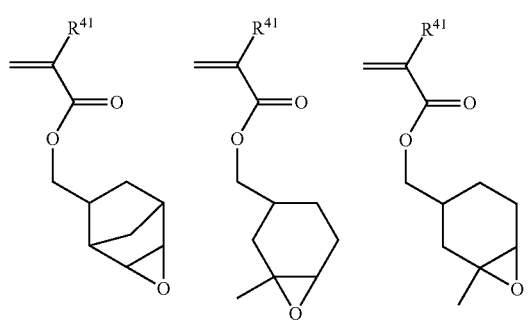
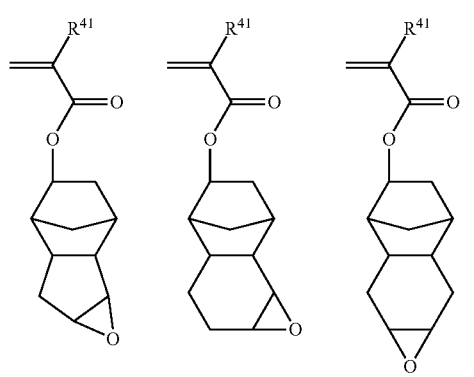
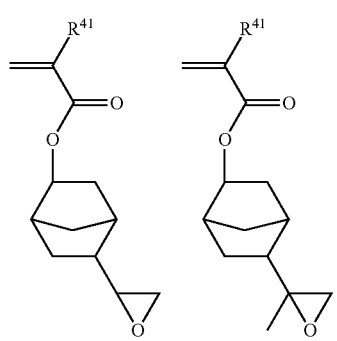
-continued
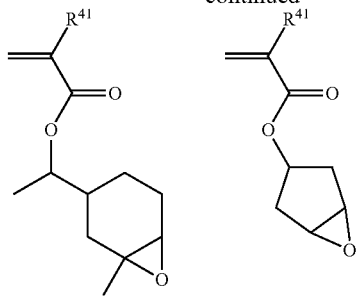
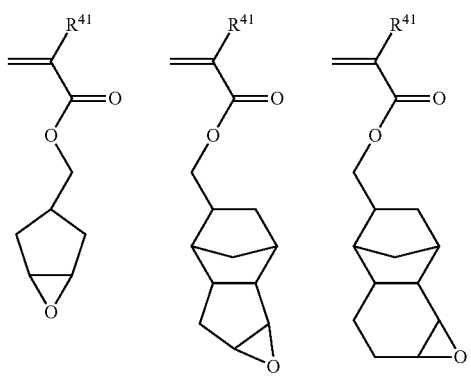
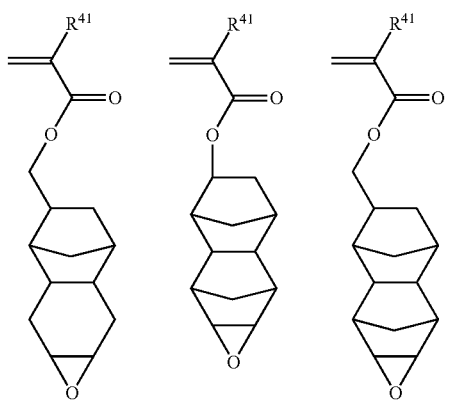
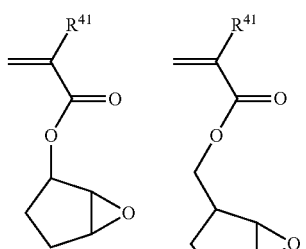
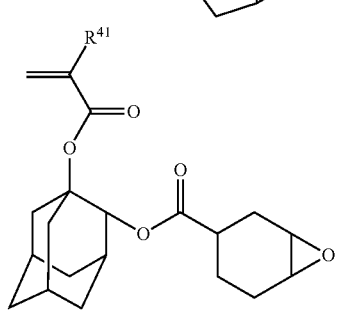

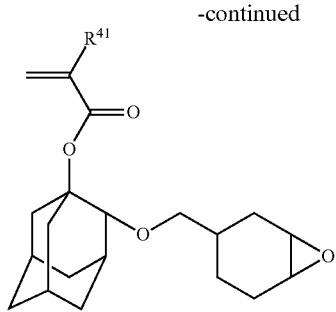
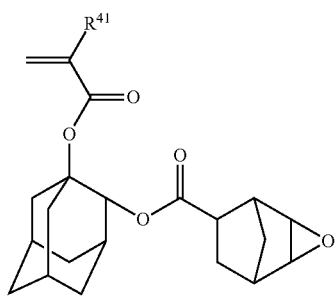
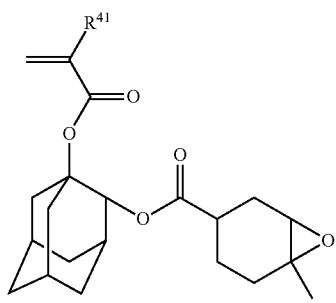
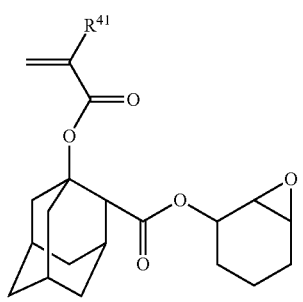
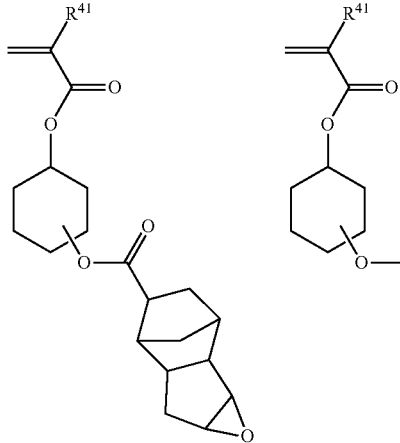
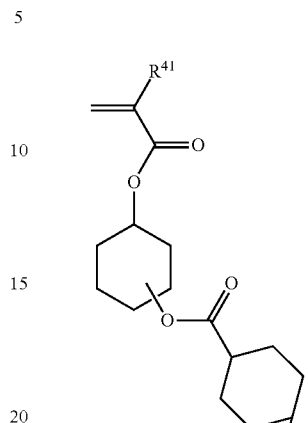
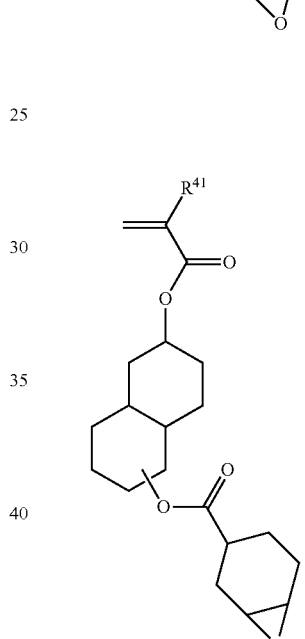

-continued

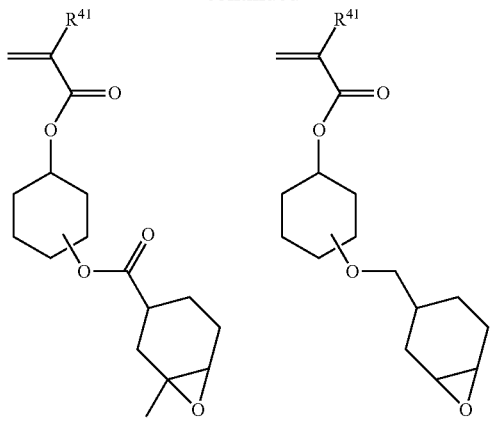
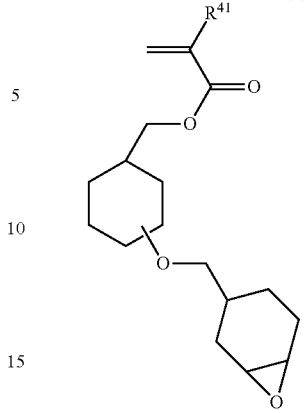
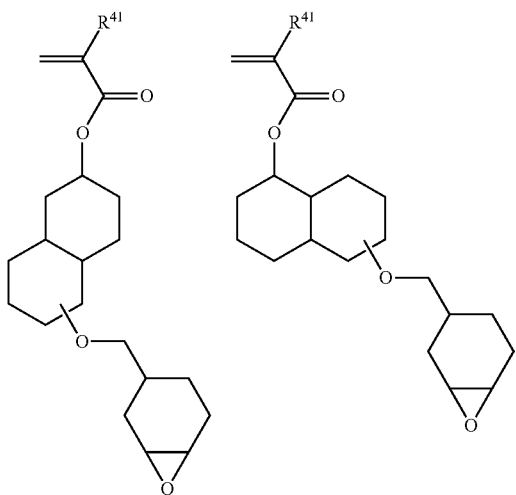
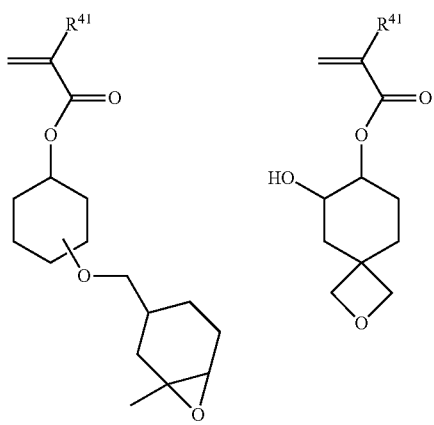
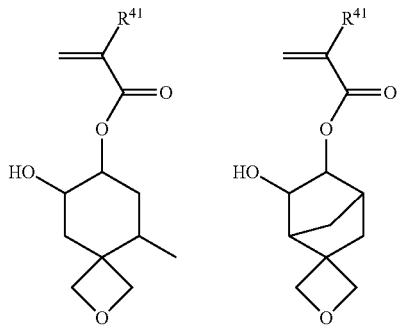

Herein $R^{41}$ is hydrogen or methyl.

Provided that "a" is the total of molar fractions of recurring units having an acid labile group, b is the total of molar fractions of recurring units having formula (3), and c is the total of molar fractions of other recurring units, appropriate molar fractions of individual recurring units are in the range: $0.2 \leq a \leq 0.8$, $0.2 \leq b \leq 0.8$, and $0 \leq c < 0.2$; more preferably $0.3 \leq a \leq 0.7$, $0.3 \leq b \leq 0.7$, and $0 \leq c < 0.1$, and $a+b+c=1$.

The polymer serving as the base resin in the resist composition used in the pattern forming process of the invention should preferably have a weight average molecular weight (Mw) in the range of 1,000 to 500,000, and more preferably 2,000 to 30,000, as measured by GPC versus polystyrene standards using tetrahydrofuran solvent. With too low a Mw, a film thickness loss is likely to occur upon organic solvent development. A polymer with too high a Mw may lose solubility in organic solvent and have a likelihood of footing after pattern formation.

If a polymer has a wide molecular weight distribution or dispersity (Mw/Mn), which indicates the presence of lower and higher molecular weight polymer fractions, there is a possibility that following exposure, foreign matter is left on the pattern or the pattern profile is exacerbated. The influences of molecular weight and dispersity become stronger as the pattern rule becomes finer. Therefore, the multi-component copolymer should preferably have a narrow dispersity (Mw/Mn) of 1.0 to 2.0, especially 1.0 to 1.5, in order to provide a resist composition suitable for micropatterning to a small feature size.

It is acceptable to use a blend of two or more polymers which differ in compositional ratio, molecular weight or dispersity.

Component (B) is a photoacid generator (PAG) of the structure having the general formula (1).

$$R^1-COOC(CF_3)_2-CH_2SO_3^- R^2R^3R^4S^+ \quad (1)$$

Herein $R^1$ is a straight, branched or cyclic, monovalent hydrocarbon group of 1 to 50 carbon atoms which may contain a heteroatom. $R^2$, $R^3$ and $R^4$ are each independently a substituted or unsubstituted, straight or branched $C_1$-$C_{10}$ alkyl, alkenyl or oxoalkyl group or a substituted or unsubstituted $C_6$-$C_{18}$ aryl, aralkyl or aryloxoalkyl group, or at least two of $R^2$, $R^3$ and $R^4$ may bond together to form a ring with the sulfur atom in the formula.

In formula (1), $R^1$ is a monovalent hydrocarbon group, examples of which are illustrated below. Suitable alkyl groups include methyl, ethyl, propyl, isopropyl, n-butyl, sec-butyl, tert-butyl, pentyl, hexyl, heptyl, octyl, cyclopentyl, cyclohexyl, cycloheptyl, cyclopropylmethyl, 4-methylcyclohexyl, cyclohexylmethyl, norbornyl, 1-adamantyl, 1-adamantylmethyl, and steroid structure-bearing groups. Suitable oxoalkyl groups include 2-oxocyclopentyl, 2-oxocyclohexyl, 4-oxocyclohexyl, 2-oxopropyl, 2-oxoethyl, 2-cyclopentyl-2-oxoethyl, 2-cyclohexyl-2-oxoethyl, 2-(4-methylcyclohexyl)-2-oxoethyl, 4-oxatricyclo[4.2.1.0$^{3,7}$]nonan-5-on-9-yl, and 4-oxo-1-adamantyl. Suitable aryl groups include phenyl, 1-naphthyl, 2-naphthyl, anthranyl and thienyl, as well as hydroxyphenyl and alkoxyphenyl groups such as 4-hydroxyphenyl, 4-methoxyphenyl, 3-methoxyphenyl, 2-methoxyphenyl, 4-ethoxyphenyl, 4-tert-butoxyphenyl, and 3-tert-butoxyphenyl, alkylphenyl groups such as 2-methylphenyl, 3-methylphenyl, 4-methylphenyl, 4-ethylphenyl, 4-tert-butylphenyl, 4-n-butylphenyl, and 2,4-dimethylphenyl, alkylnaphthyl groups such as methylnaphthyl and ethylnaphthyl, alkoxynaphthyl groups such as methoxynaphthyl and ethoxynaphthyl, dialkylnaphthyl groups such as dimethylnaphthyl and diethylnaphthyl, and dialkoxynaphthyl groups such as dimethoxynaphthyl and diethoxynaphthyl. Suitable aralkyl groups include benzyl, 1-phenylethyl, and 2-phenylethyl. Suitable aryloxoalkyl groups include 2-aryl-2-oxoethyl groups such as 2-phenyl-2-oxoethyl, 2-(1-naphthyl)-2-oxoethyl, and 2-(2-naphthyl)-2-oxoethyl. Also included are vinyl and isopropenyl.

Of the foregoing groups of $R^1$, tert-butyl, cyclohexyl, 1-adamantyl, 1-adamantylmethyl, 4-oxatricyclo[4.2.1.0$^{3,7}$]nonan-5-on-9-yl, 4-oxo-1-adamantyl, and steroid structure-bearing groups are most preferred.

The groups represented by $R^2$, $R^3$ and $R^4$ are illustrated below. Suitable alkyl groups include methyl, ethyl, propyl, isopropyl, n-butyl, sec-butyl, tert-butyl, pentyl, hexyl, heptyl, octyl, cyclopentyl, cyclohexyl, cycloheptyl, cyclopropylmethyl, 4-methylcyclohexyl, cyclohexylmethyl, norbornyl, and adamantyl. Suitable alkenyl groups include vinyl, allyl, propenyl, butenyl, hexenyl, and cyclohexenyl. Suitable oxoalkyl groups include 2-oxocyclopentyl, 2-oxocyclohexyl, 2-oxopropyl, 2-oxoethyl, 2-cyclopentyl-2-oxoethyl, 2-cyclohexyl-2-oxoethyl, and 2-(4-methylcyclohexyl)-2-oxoethyl. Suitable aryl groups include phenyl, naphthyl, and thienyl, as well as hydroxyphenyl and alkoxyphenyl groups such as 4-hydroxyphenyl, 4-methoxyphenyl, 3-methoxyphenyl, 2-methoxyphenyl, 4-ethoxyphenyl, 4-tert-butoxyphenyl, and 3-tert-butoxyphenyl, alkylphenyl groups such as 2-methylphenyl, 3-methylphenyl, 4-methylphenyl, 4-ethylphenyl, 4-tert-butylphenyl, 4-n-butylphenyl, and 2,4-dimethylphenyl, alkylnaphthyl groups such as methylnaphthyl and ethylnaphthyl, alkoxynaphthyl groups such as methoxynaphthyl and ethoxynaphthyl, dialkylnaphthyl groups such as dimethylnaphthyl and diethylnaphthyl, and dialkoxynaphthyl groups such as dimethoxynaphthyl and diethoxynaphthyl. Suitable aralkyl groups include benzyl, 1-phenylethyl, and 2-phenylethyl. Suitable aryloxoalkyl groups include 2-aryl-2-oxoethyl groups such as 2-phenyl-2-oxoethyl, 2-(1-naphthyl)-2-oxoethyl, and 2-(2-naphthyl)-2-oxoethyl. Also included are aryl groups having a polymerizable substituent group such as acryloyloxy or methacryloyloxy, for example, 4-acryloyloxyphenyl, 4-methacryloyloxyphenyl, 2-acryloyloxy-3,5-dimethylphenyl, 4-methacryloyloxy-3,5-dimethylphenyl, 4-vinyloxyphenyl, and 4-vinylphenyl. When any two or more of $R^2$, $R^3$ and $R^4$ bond together to form a ring with the sulfur atom, suitable ring-forming groups are divalent organic groups such as 1,4-butylene and 3-oxa-1,5-pentylene.

Illustrative, non-limiting examples of the sulfonium cation include triphenylsulfonium, 4-hydroxyphenyldiphenylsulfonium, bis(4-hydroxyphenyl)phenylsulfonium, tris(4-hydroxyphenyl)sulfonium, 4-tert-butoxyphenyldiphenylsulfonium, bis(4-tert-butoxyphenyl)phenylsulfonium, tris(4-tert-butoxyphenyl)sulfonium, 3-tert-butoxyphenyldiphenylsulfonium, bis(3-tert-butoxyphenyl)phenylsulfonium, tris(3-tert-butoxyphenyl)sulfonium, 3,4-di-tert-butoxyphenyldiphenylsulfonium, bis(3,4-di-tert-butoxyphenyl)phenylsulfonium, tris(3,4-di-tert-butoxyphenyl)sulfonium, diphenyl(4-thiophenoxyphenyl)sulfonium, 4-tert-butoxycarbonylmethyloxyphenyldiphenylsulfonium, tris(4-tert-butoxycarbonylmethyloxyphenyl)sulfonium, (4-tert-butoxyphenyl)bis(4-dimethylaminophenyl)sulfonium, tris(4-dimethylaminophenyl)sulfonium, 2-naphthyldiphenylsulfonium, (4-hydroxy-3,5-dimethylphenyl)diphenylsulfonium, (4-n-hexyloxy-3,5-dimethylphenyl)diphenylsulfonium, dimethyl(2-naphthyl)sulfonium, 4-hydroxyphenyldimethylsulfonium, 4-methoxyphenyldimethylsulfonium, trimethylsulfonium, 2-oxocyclohexylcyclohexylmethylsulfonium, trinaphthylsulfonium, tribenzylsulfonium, diphenylmethylsulfonium, dimethylphenylsulfonium, 2-oxo-2-phenylethylthiacyclopentanium, diphenyl-2-thienylsulfonium, 4-n-butoxynaphthyl-1-thiacyclopentanium, 2-n-butoxynaphthyl-1-thiacyclopentanium, 4-methoxynaphthyl-1-thiacyclopentanium, and 2-methoxynaphthyl-1-thiacyclopentanium. Of these, triphenylsulfonium, 4-tert-butylphenyldiphenylsulfonium, 4-tert-butoxyphenyldiphenylsulfonium, tris(4-tert-butylphenyl)sulfonium, and 4-tert-butoxycarbonylmethyloxyphenyldiphenylsulfonium are most preferred.

Exemplary structures of the anion moiety in PAG (B) are given below, but not limited thereto.

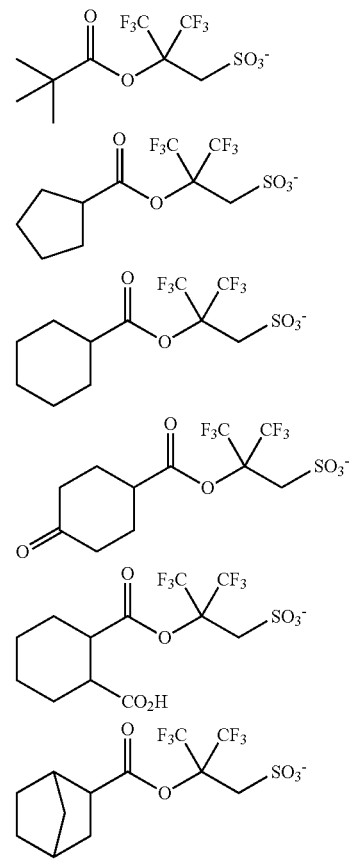

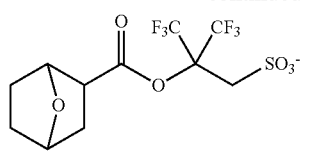
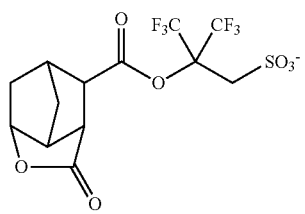
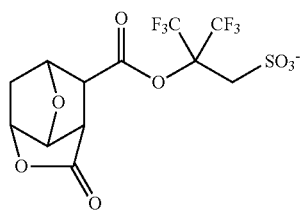
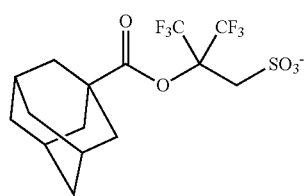
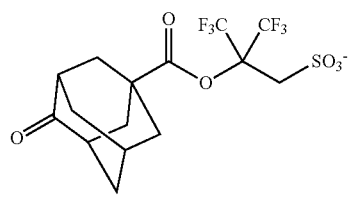
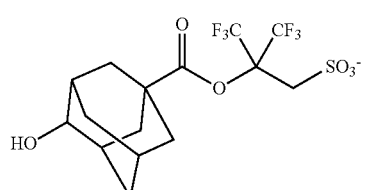
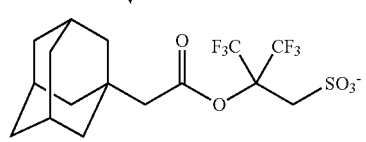
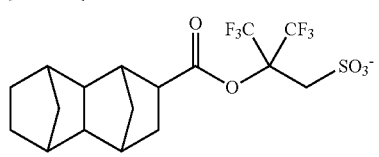
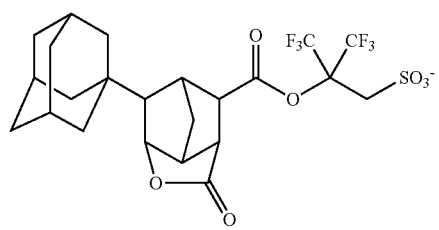
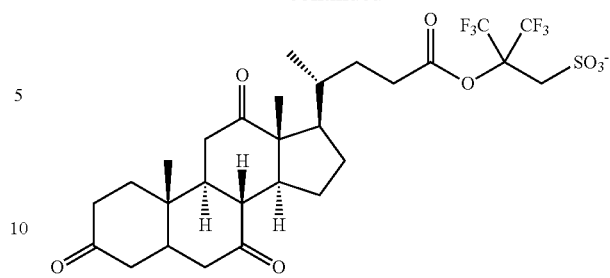
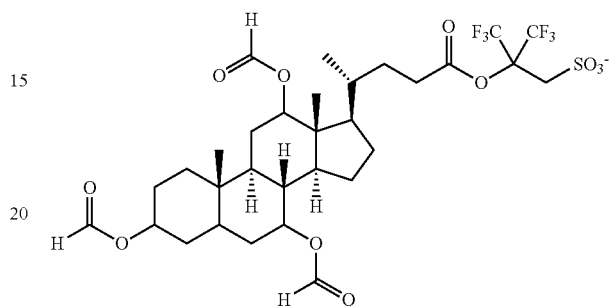
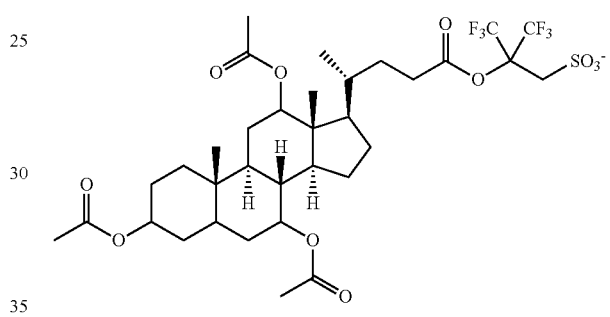
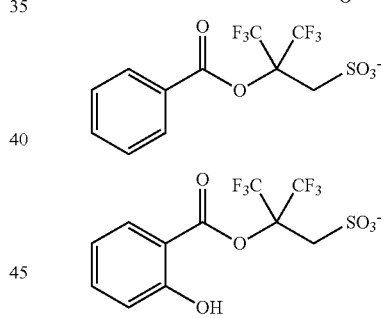
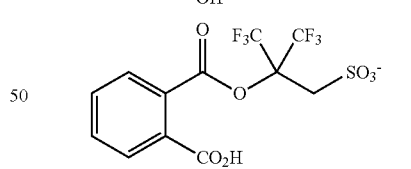
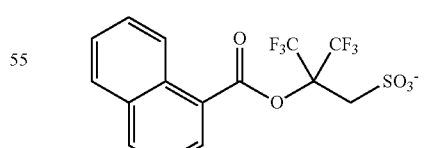
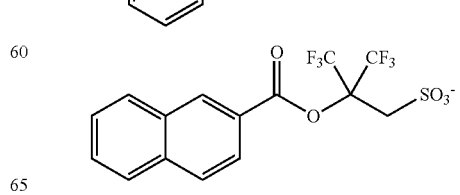

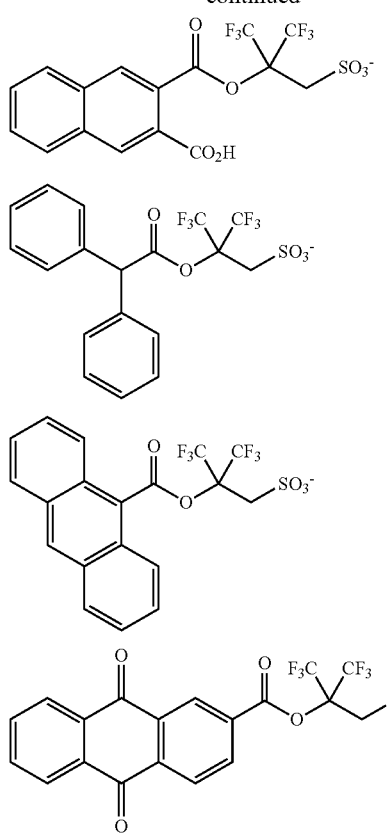
Exemplary structures of the cation moiety in PAG (B) are given below, but not limited thereto.
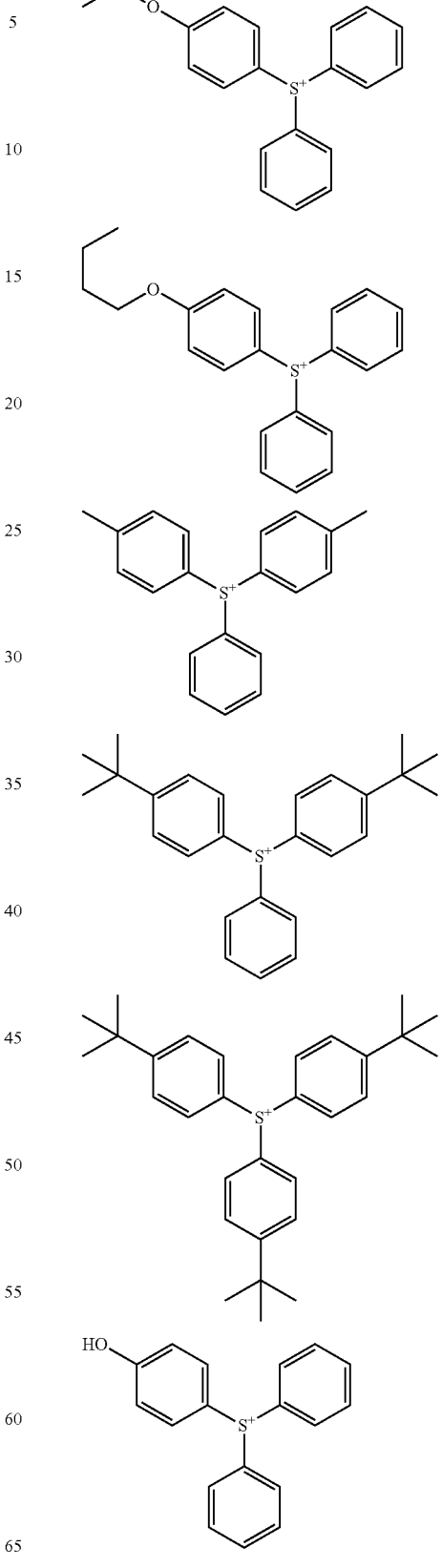

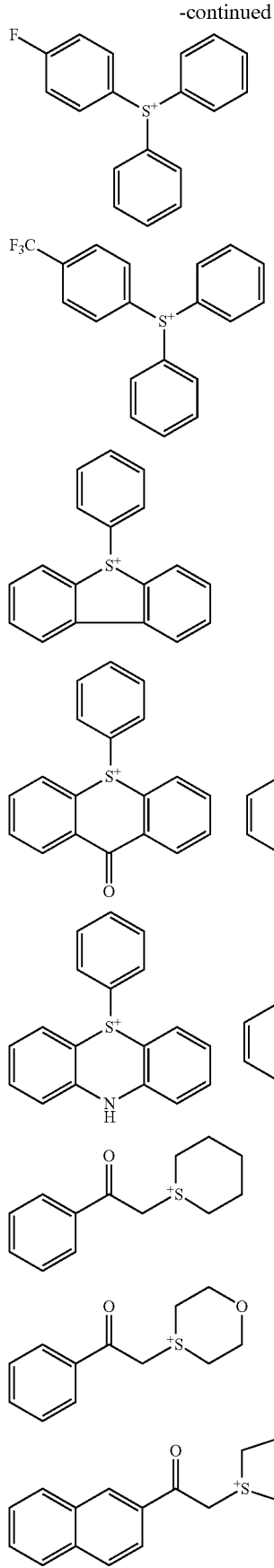
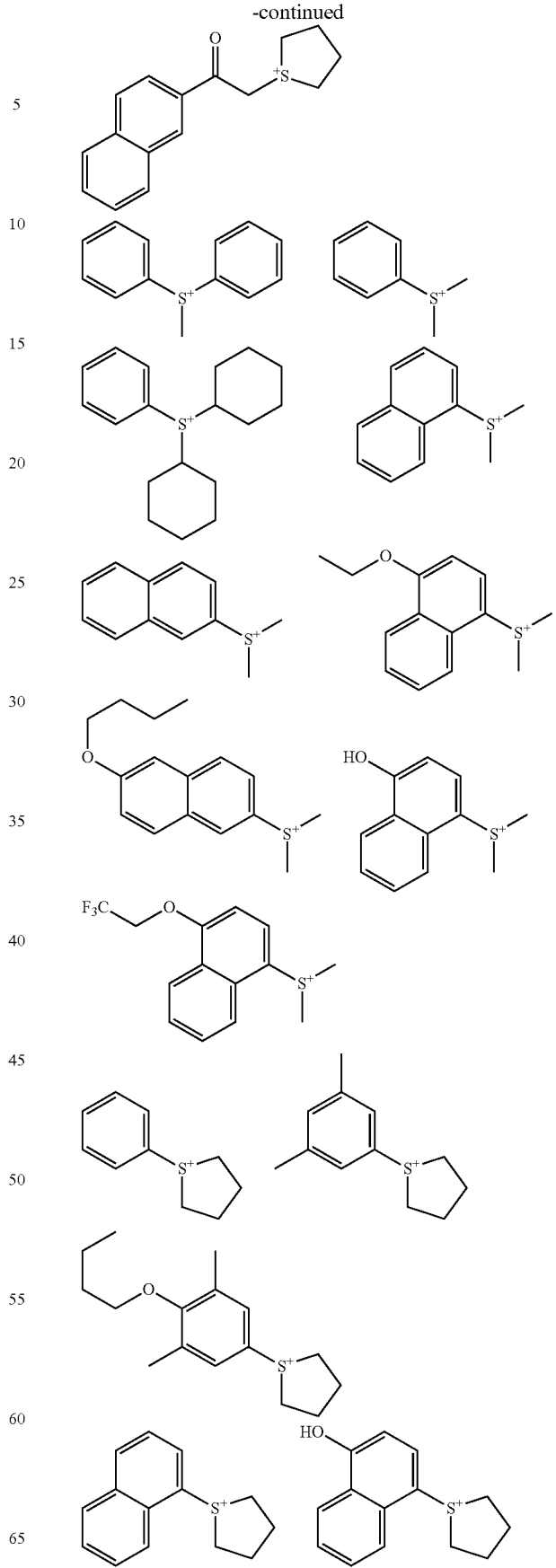

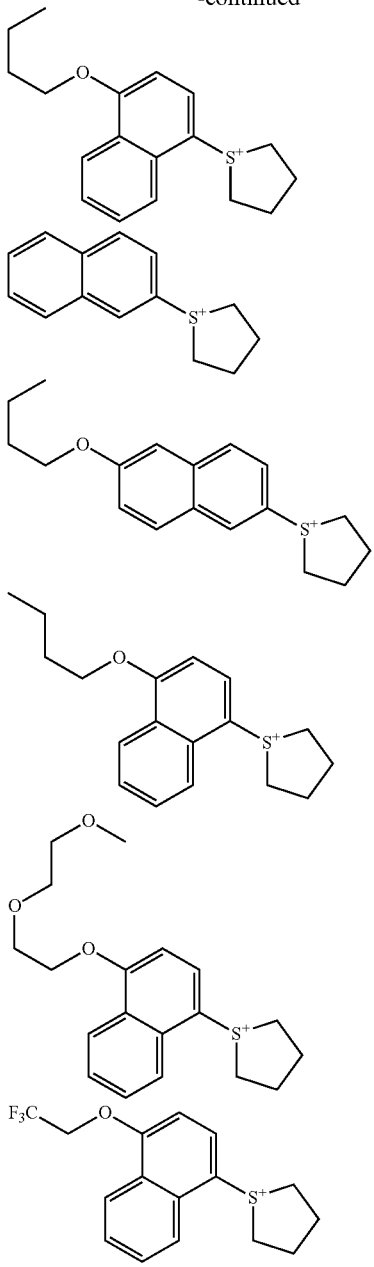

Since the PAG (B) is highly soluble in organic solvents so that it may not interfere with dissolution of a resist film (obtained by coating the resist composition) during organic solvent development, the effect of increasing the dissolution rate of the unexposed region is expectable. Since neither fluorine atom nor fluoroalkyl group is present at the alpha-position of the sulfo group of the generated acid, its acidity is lower than perfluoroalkanesulfonic acids which are commonly used in ArF lithography resist compositions, for example. For this reason, the influence of diffusion of the generated acid, which can cause resolution degradation and roughness increase, is suppressed.

The PAG (B) is preferably compounded in an amount of 0.5 to 30 parts and more preferably 1 to 20 parts by weight per 100 parts by weight of the base resin.

Besides the PAG (B), another PAG may be added to the resist composition. The other PAG may be any compound capable of generating an acid upon exposure to high-energy radiation. Suitable PAGs include sulfonium salts, iodonium salts, sulfonyldiazomethane, N-sulfonyloxyimide, and oxime-O-sulfonate acid generators, which may be used alone or in admixture. Examples of the other PAG are described in JP-A 2008-111103, paragraphs [0123] to [0138] (U.S. Pat. No. 7,537,880).

The resist composition used in the pattern forming process may further comprise an organic solvent (C), and optionally, a basic compound, surfactant, dissolution regulator, acetylene alcohol, and other components.

Examples of the organic solvent (C) used herein are described in JP-A 2008-111103, paragraphs [0144] to [0145]. Specifically, exemplary solvents include ketones such as cyclohexanone and methyl-2-n-amyl ketone; alcohols such as 3-methoxybutanol, 3-methyl-3-methoxybutanol, 1-methoxy-2-propanol, and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; esters such as propylene glycol monomethyl ether acetate (PGMEA), propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, and propylene glycol mono-tert-butyl ether acetate; and lactones such as γ-butyrolactone, and mixtures thereof. Where the acid labile group used is of acetal type, a high-boiling alcohol solvent may be added for accelerating deprotection reaction of acetal, for example, diethylene glycol, propylene glycol, glycerol, 1,4-butane diol, and 1,3-butane diol.

Exemplary basic compounds include primary, secondary and tertiary amine compounds, specifically amine compounds having a hydroxyl, ether, ester, lactone, cyano or sulfonic acid ester group, as described in JP-A 2008-111103, paragraphs [0146] to [0164], and compounds having a carbamate group, as described in JP 3790649.

Exemplary surfactants are described in JP-A 2008-111103, paragraphs [0165] to [0166]. Exemplary dissolution regulators are described in JP-A 2008-122932 (US 2008090172), paragraphs [0155] to [0178], and exemplary acetylene alcohols in paragraphs [0179] to [0182].

The organic solvent is preferably used in an amount of 100 to 10,000 parts, more preferably 300 to 8,000 parts by weight per 100 parts by weight of the base resin. The basic compound is preferably used in an amount of 0.0001 to 30 parts, more preferably 0.001 to 20 parts by weight per 100 parts by weight of the base resin. Notably, the amounts of the dissolution regulator, surfactant and acetylene alcohol added may be determined as appropriate for their purpose of addition.

Also a polymeric additive may be added for improving the water repellency on surface of a resist film as spin coated. By rendering the resist film surface more repellent to water, this additive, when used in the topcoatless immersion lithography, functions to suppress leach-out of resist components during exposure for thereby preventing contamination of the exposure tool. The preferred polymeric additives include fluorine-containing polymers, for example, polymers having a fluoroalkyl group and polymers having a specific structure with a 1,1,1,3,3,3-hexafluoro-2-propanol residue. Suitable polymeric additives are described in JP-A 2007-297590, JP-A 2008-111103, and JP-A 2012-128067. An appropriate amount of the water repellency improver is 0.1 to 20 parts, preferably 0.5 to 10 parts by weight per 100 parts by weight of the base resin.

Process

The pattern forming process of the invention comprises the steps of coating a resist composition onto a substrate, prebaking the resist composition to form a resist film, exposing a selected region of the resist film to high-energy radiation, PEB, and developing the exposed resist film in an organic solvent-based developer so that the unexposed region of resist film is dissolved and the exposed region of resist film is left, thereby forming a negative tone resist pattern such as a hole or trench pattern.

FIG. 1 illustrates the pattern forming process of the invention. First, the resist composition is coated on a substrate to form a resist film thereon. Specifically, a resist film 40 of a resist composition is formed on a processable substrate 20 disposed on a substrate 10 directly or via an intermediate intervening layer 30 as shown in FIG. 1A. The resist film preferably has a thickness of 10 to 1,000 nm and more preferably 20 to 500 nm. Prior to exposure, the resist film is heated or prebaked, preferably at a temperature of 60 to 180° C., especially 70 to 150° C. for a time of 10 to 300 seconds, especially 15 to 200 seconds.

The substrate 10 used herein is generally a silicon substrate. The processable substrate (or target film) 20 used herein includes $SiO_2$, SiN, SiON, SiOC, p-Si, α-Si, TiN, WSi, BPSG, SOG, Cr, CrO, CrON, MoSi, low dielectric film, and etch stopper film. The intermediate intervening layer 30 includes hard masks of $SiO_2$, SiN, SiON or p-Si, an undercoat in the form of carbon film, a silicon-containing intermediate film, and an organic antireflective coating.

Next comes exposure depicted at 50 in FIG. 1B. For the exposure, preference is given to high-energy radiation having a wavelength of 140 to 250 nm, EUV having a wavelength of 13.5 nm, and EB, and especially ArF excimer laser radiation of 193 nm. The exposure may be done either in a dry atmosphere such as air or nitrogen stream or by immersion lithography in water. The ArF immersion lithography uses deionized water or liquids having a refractive index of at least 1 and highly transparent to the exposure wavelength such as alkanes as the immersion solvent. In the immersion lithography, the resist film as prebaked is exposed to light through a projection lens while water is introduced between the resist film and the projection lens. Since this allows lenses to be designed to a NA of 1.0 or higher, formation of finer feature size patterns is possible. The immersion lithography is important for the ArF lithography to survive to the 45-nm node. In the case of immersion lithography, deionized water rinsing (or post-soaking) may be carried out after exposure for removing water droplets left on the resist film, or a protective film may be applied onto the resist film after pre-baking for preventing any leach-out from the resist film and improving water slip on the film surface.

The resist protective film used in the immersion lithography is preferably formed from a solution of a polymer having 1,1,1,3,3,3-hexafluoro-2-propanol residues which is soluble in the developer, in a solvent selected from alcohols of at least 4 carbon atoms, ethers of 8 to 12 carbon atoms, and mixtures thereof. The protective film-forming composition used herein may be based on a polymer comprising recurring units derived from a monomer having a 1,1,1,3,3,3-hexafluoro-2-propanol residue. While the protective film must dissolve in the organic solvent developer, the polymer comprising recurring units having a 1,1,1,3,3,3-hexafluoro-2-propanol residue dissolves in organic solvent developers. In particular, protective film-forming materials having 1,1,1,3,3,3-hexafluoro-2-propanol residues as described in JP-A 2007-025634 and JP-A 2008-003569 readily dissolve in organic solvent developers.

In the protective film-forming composition, an amine compound or ammonium salt or a polymer having copolymerized therein recurring units containing an amine compound or ammonium salt may be used. This component is effective for controlling diffusion of the acid generated in the exposed region of the photoresist film to the unexposed region for thereby preventing any hole opening failure. Useful protective film materials having an amine compound added thereto are described in JP-A 2008-003569, and useful protective film materials having an amino group or ammonium salt copolymerized are described in JP-A 2007-316448. The amine compound or ammonium salt may be selected from the compounds enumerated as the basic compound to be added to the resist composition. An appropriate amount of the amine compound or ammonium salt added is 0.01 to 10 parts, preferably 0.02 to 8 parts by weight per 100 parts by weight of the base resin.

The solvent in the protective film-forming composition is preferably selected from alcohols of at least 4 carbon atoms, ethers of 8 to 12 carbon atoms, and mixtures thereof. Suitable alcohols of at least 4 carbon atoms include 1-butyl alcohol, 2-butyl alcohol, isobutyl alcohol, tert-butyl alcohol, 1-pentanol, 2-pentanol, 3-pentanol, tert-amyl alcohol, neopentyl alcohol, 2-methyl-1-butanol, 3-methyl-1-butanol, 3-methyl-3-pentanol, cyclopentanol, 1-hexanol, 2-hexanol, 3-hexanol, 2,3-dimethyl-2-butanol, 3,3-dimethyl-1-butanol, 3,3-dimethyl-2-butanol, 2-ethyl-1-butanol, 2-methyl-1-pentanol, 2-methyl-2-pentanol, 2-methyl-3-pentanol, 3-methyl-1-pentanol, 3-methyl-2-pentanol, 3-methyl-3-pentanol, 4-methyl-1-pentanol, 4-methyl-2-pentanol, 4-methyl-3-pentanol, cyclohexanol, and 1-octanol. Suitable ether solvents of 8 to 12 carbon atoms include di-n-butyl ether, diisobutyl ether, di-sec-butyl ether, di-n-pentyl ether, diisopentyl ether, di-sec-pentyl ether, di-tert-amyl ether, and di-n-hexyl ether.

After formation of the photoresist film, deionized water rinsing (or post-soaking) may be carried out for extracting the acid generator and the like from the film surface or washing away particles, or after exposure, rinsing (or post-soaking) may be carried out for removing water droplets left on the resist film.

Exposure is preferably performed in an exposure dose of about 1 to 200 $mJ/cm^2$, more preferably about 10 to 100 $mJ/cm^2$. This is followed by baking (PEB) on a hot plate at 60 to 150° C. for 1 to 5 minutes, preferably at 80 to 120° C. for 1 to 3 minutes.

Thereafter the exposed resist film is developed in an organic solvent-based developer for 0.1 to 3 minutes, preferably 0.5 to 2 minutes by any conventional techniques such as dip, puddle and spray techniques. In this way, the unexposed region of resist film was dissolved away, leaving a negative resist pattern 40 on the substrate 10 as shown in FIG. 1C. The developer used herein is based on an organic solvent which is preferably selected from among ketones such as 2-octanone, 2-nonanone, 2-heptanone, 3-heptanone, 4-heptanone, 2-hexanone, 3-hexanone, diisobutyl ketone, 2-methylcyclohexanone, 3-methylcyclohexanone, 4-methylcyclohexanone, acetophenone, 2'-methylacetophenone and 4'-methylacetophenone, and esters such as propyl acetate, butyl acetate, isobutyl acetate, amyl acetate, butenyl acetate, isoamyl acetate, propyl formate, butyl formate, isobutyl formate, amyl formate, isoamyl formate, methyl valerate, methyl pentenoate, methyl crotonate, ethyl crotonate, methyl lactate, ethyl lactate, propyl lactate, butyl lactate, isobutyl lactate, amyl lactate, isoamyl lactate, methyl 2-hydroxyisobutyrate, ethyl 2-hydroxyisobutyrate, methyl benzoate, ethyl benzoate, phenyl acetate, benzyl acetate, methyl phenylacetate, benzyl formate, phenylethyl formate, methyl 3-phenylpropionate, benzyl propionate, ethyl phenylacetate, and 2-phenylethyl acetate.

These solvents may be used alone or in admixture of two or more. The organic solvent or solvents are preferably present in a total amount of at least 60% by weight of the developer. More preferably the organic solvent(s) accounts for 80 to 100% by weight of the developer. The developer may contain another organic solvent which is typically selected from alkanes such as octane, decane and dodecane, and alcohols such as isopropyl alcohol, 1-butyl alcohol, 1-pentanol, 1-hexanol, and 4-methyl-2-pentanol.

A surfactant may be added to the developer while it may be selected from the same list of compounds as exemplified for the surfactant to be added to the resist composition.

At the end of development, the resist film is rinsed. As the rinsing liquid, a solvent which is miscible with the developer and does not dissolve the resist film is preferred. Suitable solvents include alcohols of 3 to 10 carbon atoms, ether compounds of 8 to 12 carbon atoms, alkanes, alkenes, and alkynes of 6 to 12 carbon atoms, and aromatic solvents. Specifically, suitable alkanes of 6 to 12 carbon atoms include hexane, heptane, octane, nonane, decane, undecane, dodecane, methylcyclopentane, dimethylcyclopentane, cyclohexane, methylcyclohexane, dimethylcyclohexane, cycloheptane, cyclooctane, and cyclononane. Suitable alkenes of 6 to 12 carbon atoms include hexene, heptene, octene, cyclohexene, methylcyclohexene, dimethylcyclohexene, cycloheptene, and cyclooctene. Suitable alkynes of 6 to 12 carbon atoms include hexyne, heptyne, and octyne. Suitable alcohols of 3 to 10 carbon atoms include n-propyl alcohol, isopropyl alcohol, 1-butyl alcohol, 2-butyl alcohol, isobutyl alcohol, tert-butyl alcohol, 1-pentanol, 2-pentanol, 3-pentanol, tert-amyl alcohol, neopentyl alcohol, 2-methyl-1-butanol, 3-methyl-1-butanol, 3-methyl-3-pentanol, cyclopentanol, 1-hexanol, 2-hexanol, 3-hexanol, 2,3-dimethyl-2-butanol, 3,3-dimethyl-1-butanol, 3,3-dimethyl-2-butanol, 2-ethyl-1-butanol, 2-methyl-1-pentanol, 2-methyl-2-pentanol, 2-methyl-3-pentanol, 3-methyl-1-pentanol, 3-methyl-2-pentanol, 3-methyl-3-pentanol, 4-methyl-1-pentanol, 4-methyl-2-pentanol, 4-methyl-3-pentanol, cyclohexanol, and 1-octanol. Suitable ether compounds of 8 to 12 carbon atoms include di-n-butyl ether, diisobutyl ether, di-sec-butyl ether, di-n-pentyl ether, diisopentyl ether, di-sec-pentyl ether, di-tert-amyl ether, and di-n-hexyl ether. The solvents may be used alone or in admixture. Besides the foregoing solvents, aromatic solvents may be used, for example, toluene, xylene, ethylbenzene, isopropylbenzene, tert-butylbenzene and mesitylene.

In forming a trench pattern, negative tone development is often successful in forming an optical image with a higher contrast than positive tone development. As used herein, the term "trench pattern" refers to a line-and-space pattern in which the spaces are narrower than the lines, that is, the space size is smaller than the line width. The pattern in which spaces are separated indefinitely apart, that is, the line width is indefinitely extended is referred to as "isolated trench pattern." As the trench (or space) width becomes finer, the negative tone development adapted to form trenches by reversal of a line pattern image on a mask becomes more advantageous to insure a resolution.

The method of forming a hole pattern by negative tone development is typically classified in terms of mask design into the following three methods:
(i) performing exposure through a mask having a dotted light-shielding pattern so that a pattern of holes may be formed at the dots after negative tone development,
(ii) performing exposure through a mask having a lattice-like light-shielding pattern so that a pattern of holes may be formed at the intersections of gratings after negative tone development, and
(iii) performing two exposures using a mask having a lined light-shielding pattern, changing the direction of lines during second exposure from the direction of lines during first exposure so that the lines of the second exposure may intersect with the lines of the first exposure, whereby a pattern of holes is formed at the intersections of lines after negative tone development.

Figure 7:
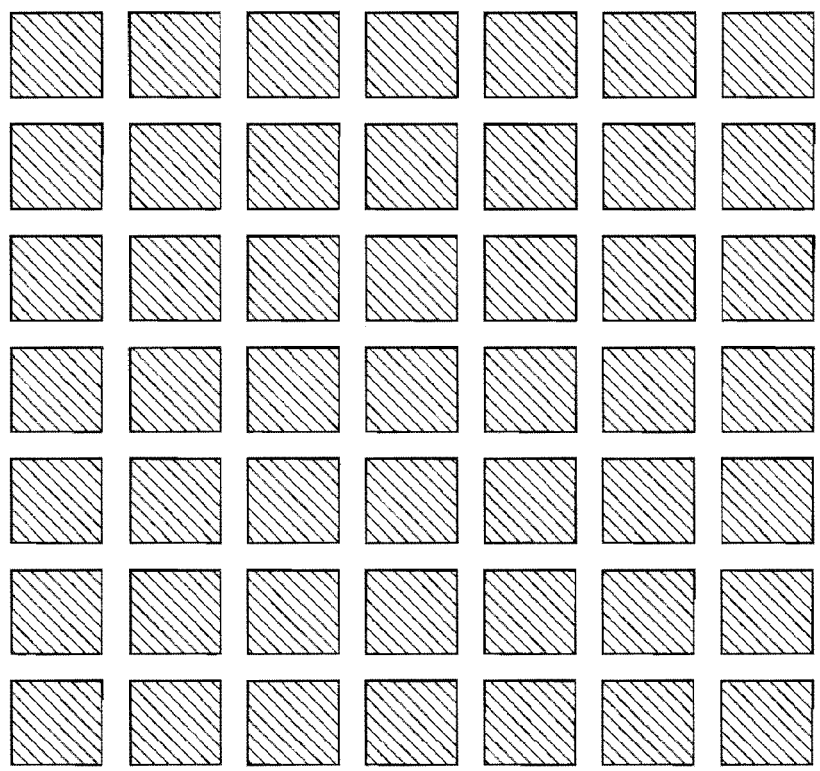
FIG. 7 illustrates a mask bearing a dot pattern of square dots.
Figure 17:
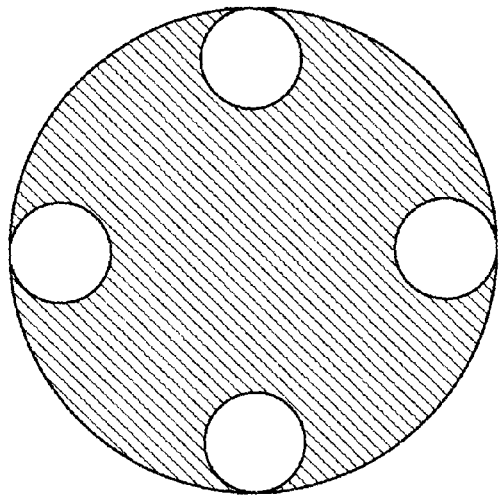
FIG. 17 illustrates an aperture configuration in an exposure tool of cross-pole illumination for enhancing the contrast of both X and Y-direction lines.

Method (i) uses a mask having a dotted light-shielding pattern as shown in FIG. 7. Although the illumination for exposure used in this method is not particularly limited, a cross-pole illumination or quadru-pole illumination with the aperture configuration shown in FIG. 17 is preferred for the purpose of reducing the pitch. The contrast may be improved by combining the cross-pole illumination with X-Y polarized illumination or azimuthally polarized illumination of circular polarization.

Figure 5:
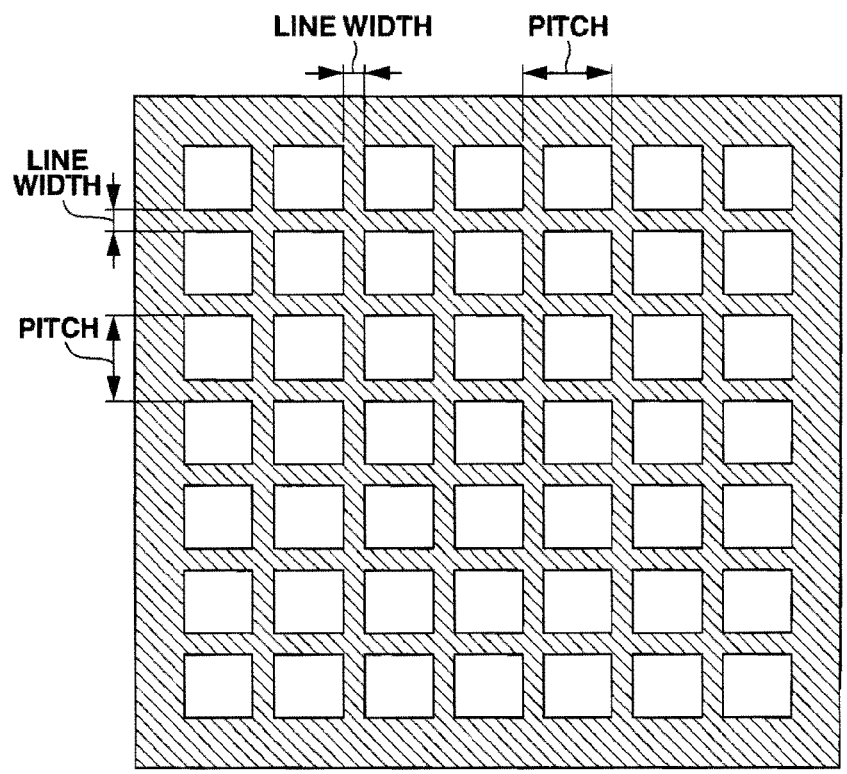
FIG. 5 illustrates a mask bearing a lattice-like pattern.

Method (ii) uses a mask having a lattice-like light-shielding pattern as shown in FIG. 5. Like Method (i), a combination of cross-pole illumination with polarized illumination is preferred for the purpose of improving resolution even at a narrow pitch.

Figure 6:
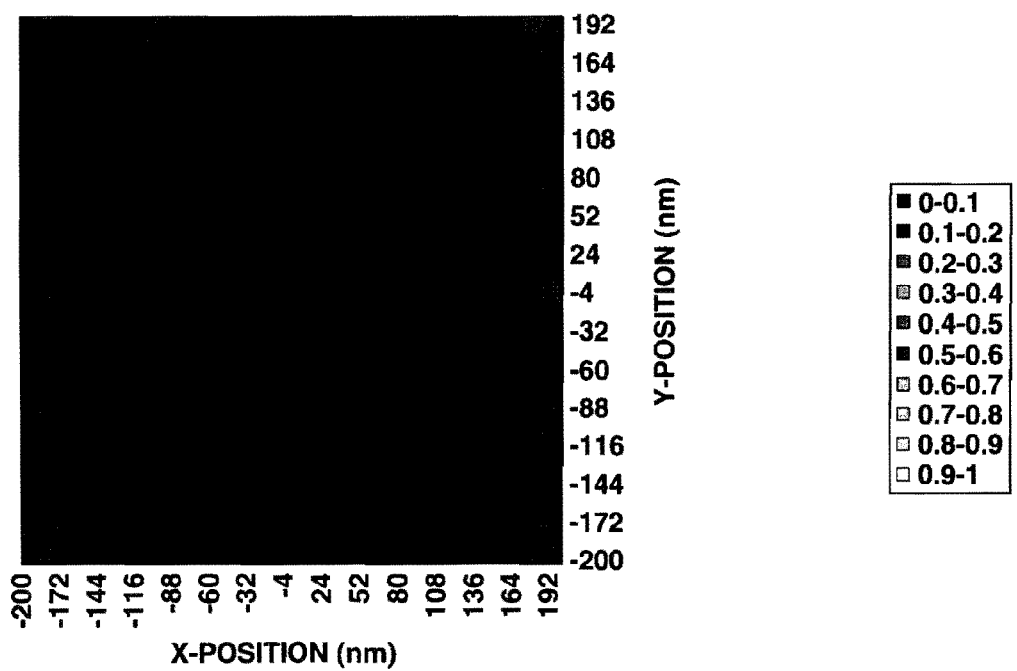
FIG. 6 is an optical image of a lattice-like pattern having a pitch of 90 nm and a width of 30 nm printed under conditions: NA 1.3 lens, cross-pole illumination, 6% halftone phase shift mask, and azimuthally polarized illumination.
Figure 8:
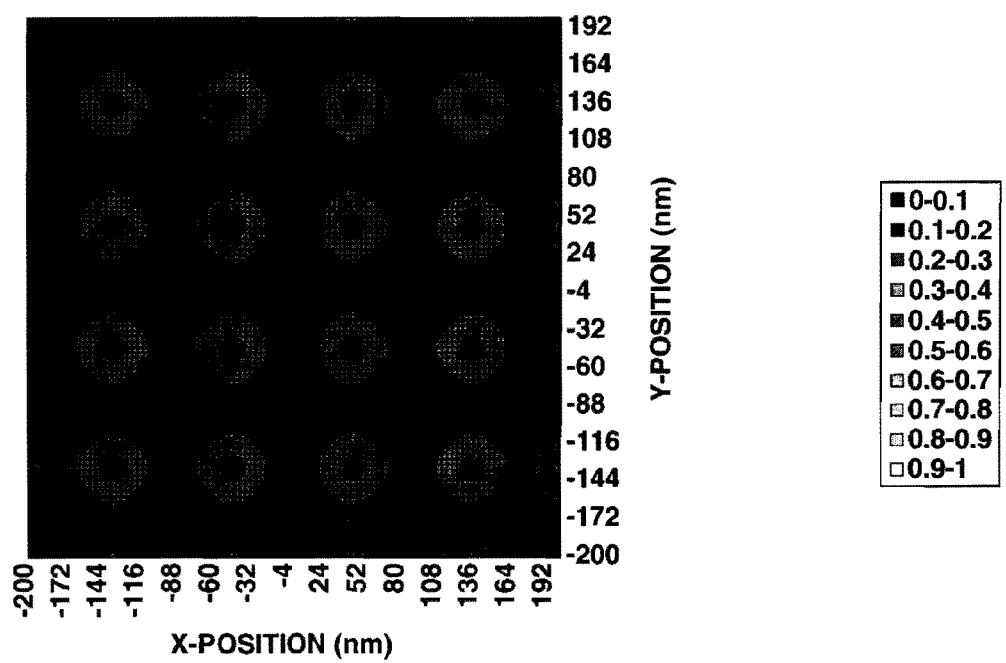
FIG. 8 is an optical image of a square dot pattern having a pitch of 90 nm and a side width of 60 nm printed under conditions: NA 1.3 lens, cross-pole illumination, 6% halftone phase shift mask, and azimuthally polarized illumination, showing its contrast.

On use of a mask bearing a dot pattern of square dots having a pitch of 90 nm and a side width of 60 nm as shown in FIG. 7, under conditions: ArF excimer laser of wavelength 193 nm, NA 1.3 lens, cross-pole illumination, 6% halftone phase shift mask, and azimuthally polarized illumination, an optical image is obtained as shown in FIG. 8 that depicts the contrast thereof. On use of a mask bearing a lattice-like line pattern having a pitch of 90 nm and a line width of 30 nm as shown in FIG. 5, under conditions: NA 1.3 lens, cross-pole illumination, 6% halftone phase shift mask, and azimuthally polarized illumination, an optical image is obtained as shown in FIG. 6. As compared with the use of the dot pattern, the use of the lattice-like pattern has the advantage of enhanced optical contrast despite the drawback of reduced resist sensitivity due to reduced light intensity.

In Method (ii), the procedure of using a half-tone phase shift mask having a transmittance of 3 to 15% and converting the intersections of lattice-like shifter gratings into a pattern of holes after development is preferred because the optical contrast is improved.

Figure 15:
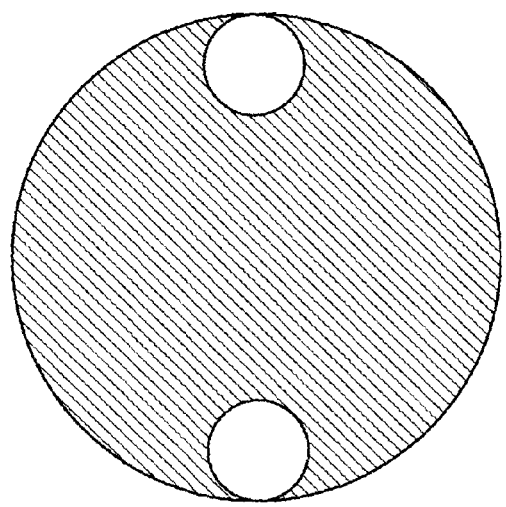
FIG. 15 illustrates an aperture configuration in an exposure tool of dipole illumination for enhancing the contrast of X-direction lines.
Figure 16:
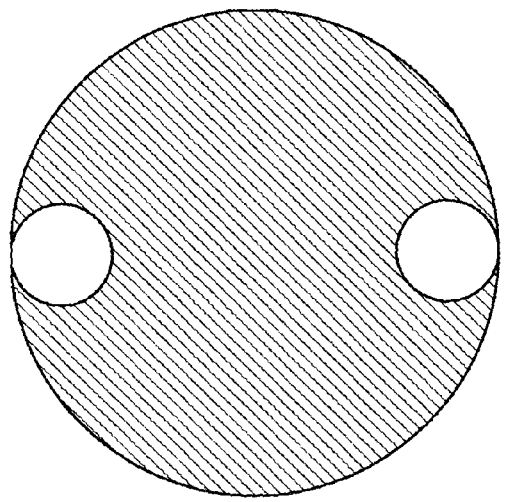
FIG. 16 illustrates an aperture configuration in an exposure tool of dipole illumination for enhancing the contrast of Y-direction lines.

Method (iii) can achieve a further higher contrast than Methods (i) and (ii) by using dipole illumination with aperture configurations as shown in FIGS. 15 and 16, performing exposure to X and Y-direction line patterns in two separate steps, and overlaying the resulting optical images. The contrast may be enhanced by combining dipole illumination with s-polarized illumination.

Figure 3:
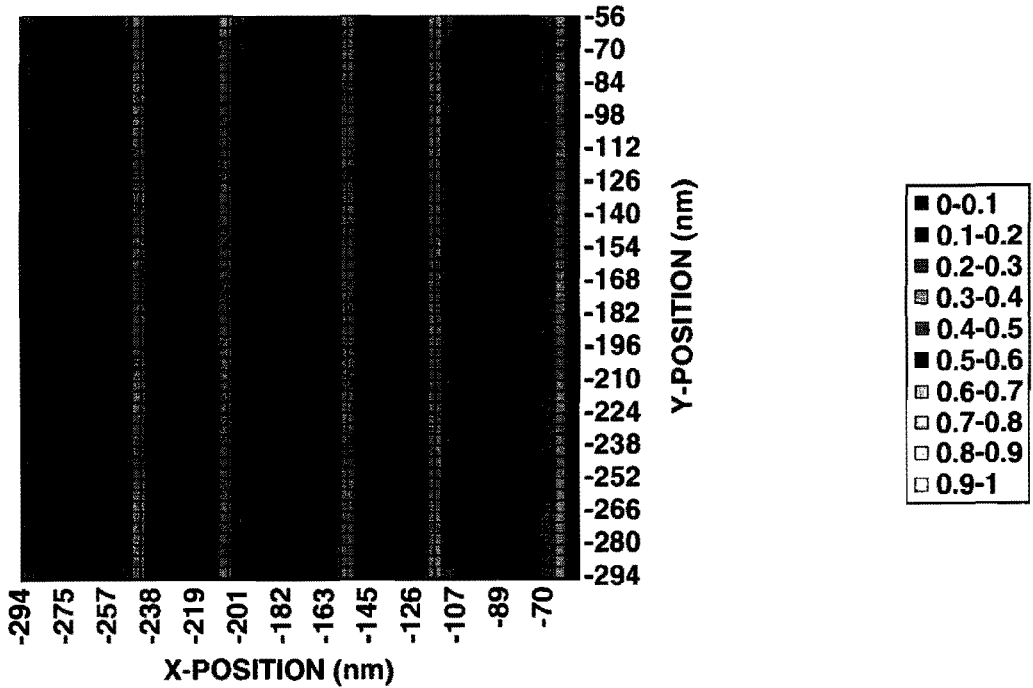
FIG. 3 is an optical image of Y-direction lines like FIG. 2.
Figure 4:
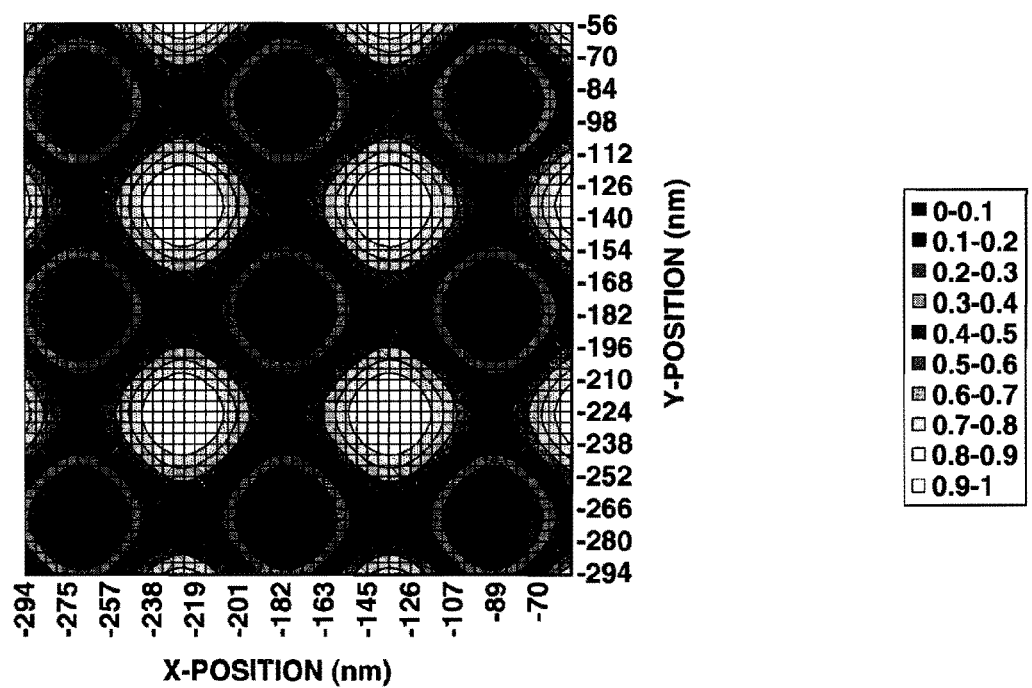
FIG. 4 shows a contrast image obtained by overlaying the optical image of X-direction lines in FIG. 2 with the optical image of Y-direction lines in FIG. 3.

FIG. 2 is an optical image of X-direction lines having a pitch of 90 nm and a line size of 45 nm printed under conditions: ArF excimer laser of wavelength 193 nm, NA 1.3 lens, dipole illumination, 6% halftone phase shift mask, and s-polarization. FIG. 3 is an optical image of Y-direction lines having a pitch of 90 nm and a line size of 45 nm printed under conditions: ArF excimer laser of wavelength 193 nm, NA 1.3 lens, dipole illumination, 6% halftone phase shift mask, and s-polarization. A black area is a light shielded area while a white area is a high light intensity area. A definite contrast difference is recognized between white and black, indicating the presence of a fully light shielded area. FIG. 4 shows a contrast image obtained by overlaying the optical image of X-direction lines in FIG. 2 with that of Y-direction lines in FIG. 3. Against the expectation that a combination of x and Y lines may form a lattice-like image, weak light black areas draw circular shapes. As the pattern (circle) size becomes larger, the circular shape changes to a rhombic shape to merge with adjacent ones. As the circle size becomes smaller, circularity is improved, which is evidenced by the presence of a fully light shielded small circle.

Since Method (iii) involving double exposures provides a high optical contrast despite a reduced throughput as compared with Methods (i) and (ii) involving a single exposure, Method (iii) can form a fine pattern with uniformity of size and is advantageous for pitch narrowing. The angle between the first and second lines is preferably right, but may deviate from 90°, and the size and/or pitch may be the same or different between the first lines and the second lines. If a single mask bearing first lines in one area and second lines in another area is used, it is possible to carry out first and second exposures continuously. Two consecutive exposures using a single mask with the X and Y-direction contrasts emphasized can be carried out on the currently commercially available scanner.

It is difficult to form a fine hole pattern that holes are randomly arrayed at varying pitch and position. The super-resolution technology using off-axis illumination (such as dipole or cross-pole illumination) in combination with a phase shift mask and polarization is successful in improving the contrast of dense (or grouped) patterns, but not so the contrast of isolated patterns.

When the super-resolution technology is applied to repeating dense patterns, the pattern density bias between dense and isolated patterns, known as proximity bias, becomes a problem. As the super-resolution technology used becomes stronger, the resolution of a dense pattern is more improved, but the resolution of an isolated pattern remains unchanged. Then the proximity bias is exaggerated. In particular, an increase of proximity bias in a hole pattern resulting from further miniaturization poses a serious problem. One common approach taken to suppress the proximity bias is by biasing the size of a mask pattern. Since the proximity bias varies with properties of a resist composition, specifically dissolution contrast and acid diffusion, the proximity bias of a mask varies with the type of resist composition. For a particular type of resist composition, a mask having a different proximity bias must be used. This adds to the burden of mask manufacturing. Then the pack and unpack (PAU) method is proposed in Proc. SPIE Vol. 5753, p 171 (2005), which involves strong super-resolution illumination of a first positive resist to resolve a dense hole pattern, coating the first positive resist pattern with a negative resist film material in alcohol solvent which does not dissolve the first positive resist pattern, exposure and development of an unnecessary hole portion to close the corresponding holes, thereby forming both a dense pattern and an isolated pattern. One problem of the PAU method is misalignment between first and second exposures, as the authors point out in the report. The hole pattern which is not closed by the second development experiences two developments and thus undergoes a size change, which is another problem.

To form a random pitch hole pattern by positive/negative reversal, a mask is used in which a lattice-like light-shielding pattern is arrayed over the entire surface and the width of gratings is thickened only where holes are to be formed.

Figure 9:
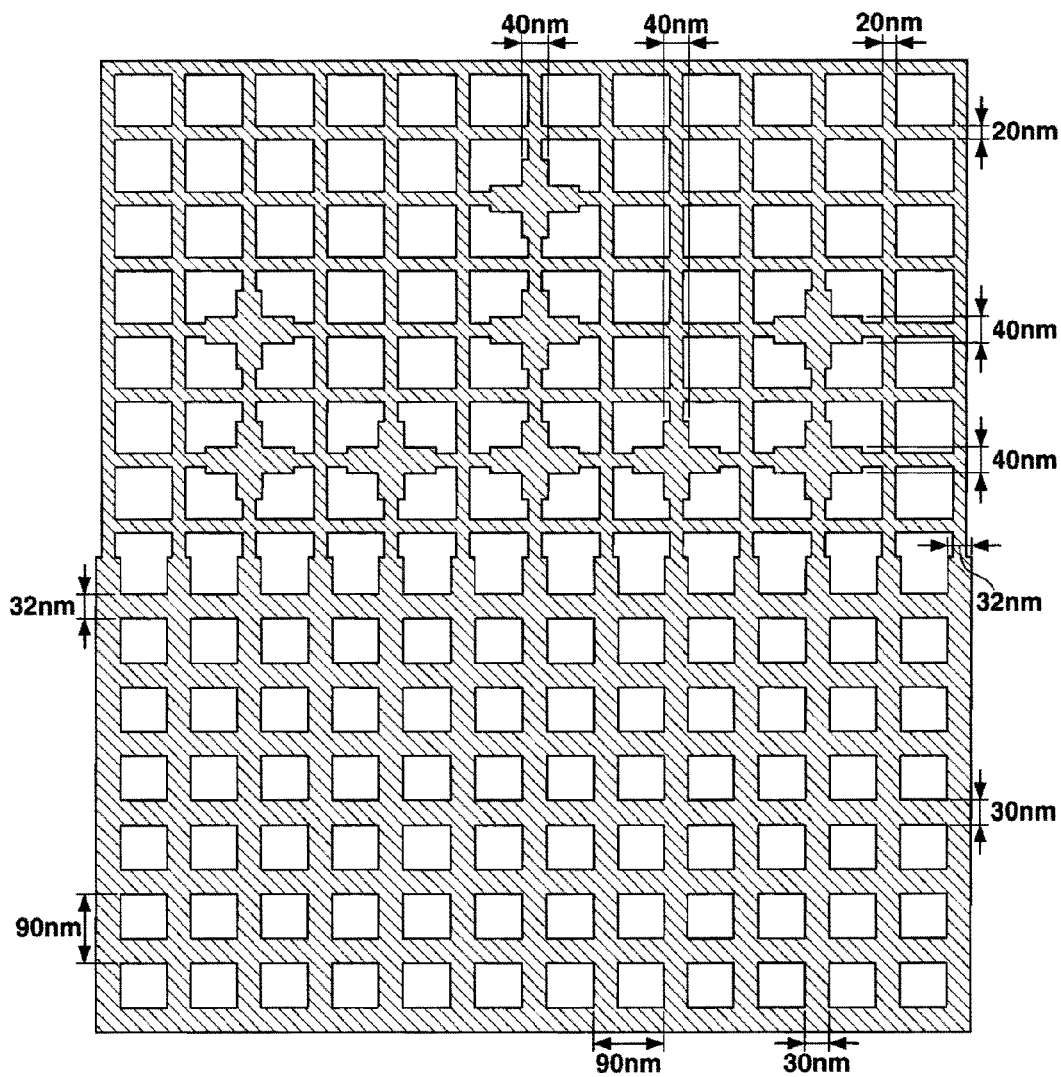
FIG. 9 illustrates a mask bearing a lattice-like pattern having a pitch of 90 nm and a line width of 20 nm on which thick crisscross or intersecting line segments are disposed where dots are to be formed.
Figure 11:
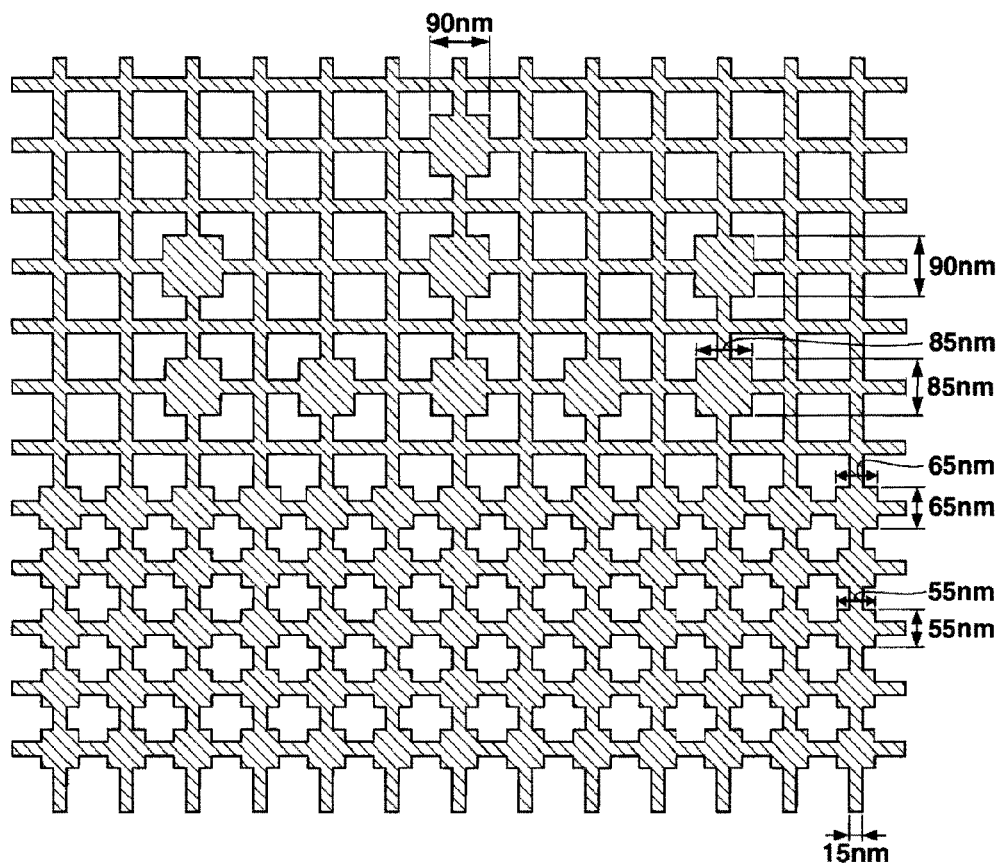
FIG. 11 illustrates a mask bearing a lattice-like pattern having a pitch of 90 nm and a line width of 15 nm on which thick dots are disposed where dots are to be formed.

In Method (ii), a pattern of holes at random pitches can be formed by using a phase shift mask including a lattice-like first shifter having a line width equal to or less than a half pitch and a second shifter arrayed on the first shifter and consisting of lines whose on-wafer size is 2 to 30 nm thicker than the line width of the first shifter as shown in FIG. 9, whereby a pattern of holes is formed only where the thick shifter is arrayed. Alternatively, a pattern of holes at random pitches can be formed by using a phase shift mask including a lattice-like first shifter having a line width equal to or less than a half pitch and a second shifter arrayed on the first shifter and consisting of dots whose on-wafer size is 2 to 100 nm thicker than the line width of the first shifter as shown in FIG. 11, whereby a pattern of holes is formed only where the thick shifter is arrayed.

As shown in FIG. 9, on a lattice-like pattern having a pitch of 90 nm and a line width of 20 nm, thick crisscross or intersecting line segments are disposed where dots are to be formed. A black area corresponds to the halftone shifter portion. Line segments with a width of 30 nm are disposed in the dense pattern portion whereas thicker line segments (width 40 nm in FIG. 9) are disposed in more isolated pattern portions. Since the isolated pattern provides light with a lower intensity than the dense pattern, thicker line segments are used. Since the peripheral area of the dense pattern provides light with a relatively low intensity, line segments having a width of 32 nm are assigned to the peripheral area which width is slightly greater than that in the internal area of the dense pattern.

Figure 10:
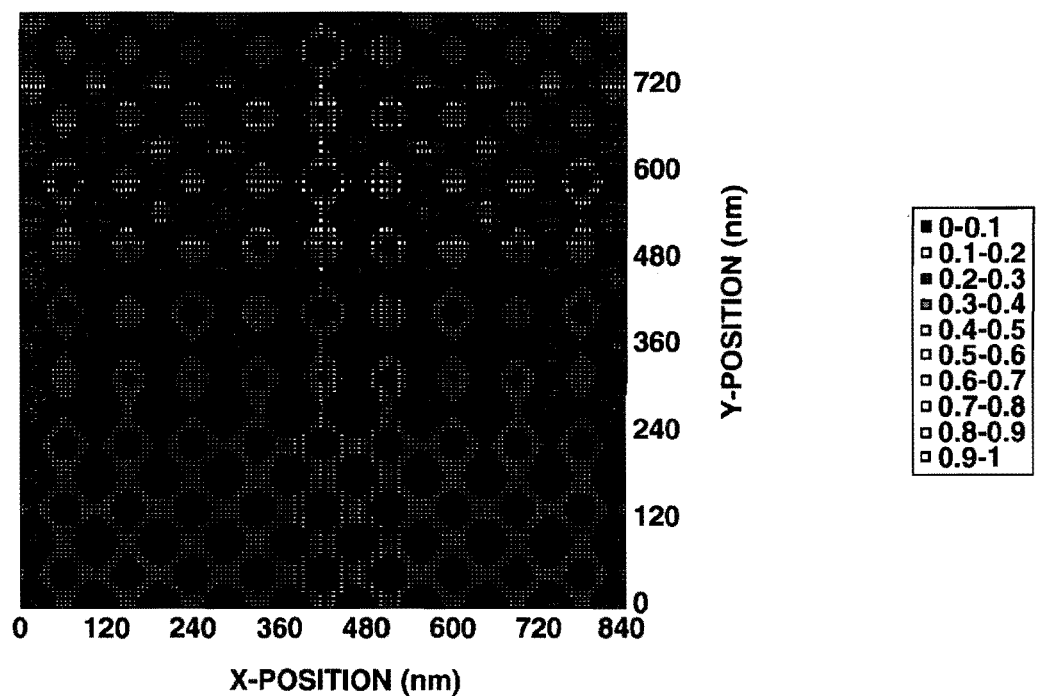
FIG. 10 is an optical image resulting from the mask of FIG. 9, printed under conditions: NA 1.3 lens, cross-pole illumination, 6% halftone phase shift mask, and azimuthally polarized illumination, showing its contrast.

FIG. 10 shows an optical image from the mask of FIG. 9, indicating the contrast thereof. Black or light-shielded areas are where holes are formed via positive/negative reversal. Black spots are found at positions other than where holes are formed, but few are transferred in practice because they are of small size. Optimization such as reduction of the width of grating lines corresponding to unnecessary holes can inhibit transfer of unnecessary holes.

Figure 12:
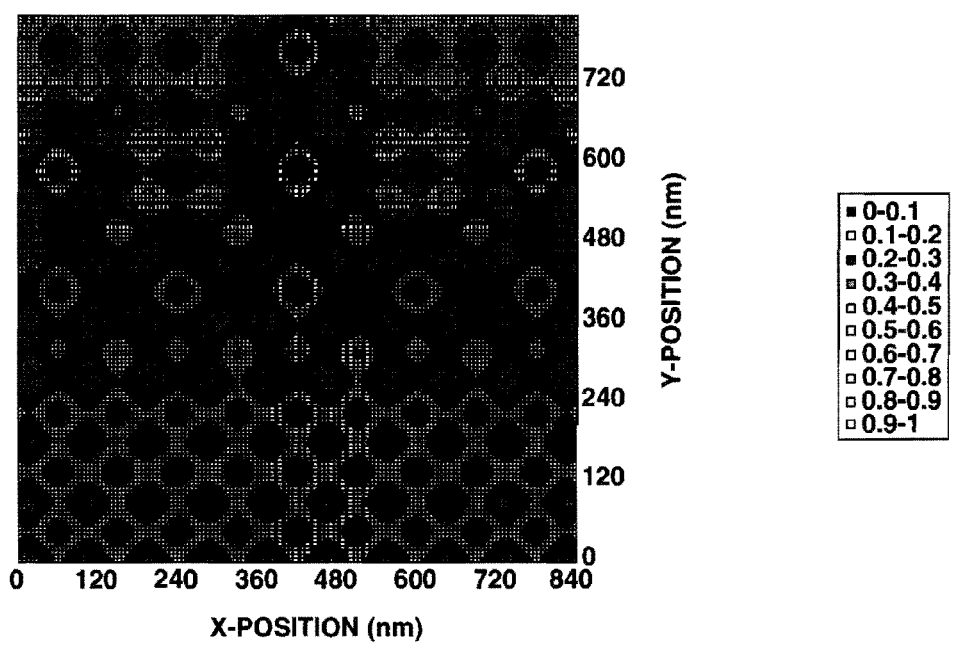
FIG. 12 is an optical image resulting from the mask of FIG. 11, printed under conditions: NA 1.3 lens, cross-pole illumination, 6% halftone phase shift mask, and azimuthally polarized illumination, showing its contrast.

Also useful is a mask in which a lattice-like light-shielding pattern is arrayed over the entire surface and thick dots are disposed only where holes are to be formed. As shown in FIG. 11, on a lattice-like pattern having a pitch of 90 nm and a line width of 15 nm, thick dots are disposed where dots are to be formed. A black area corresponds to the halftone shifter portion. Square dots having one side with a size of 55 nm are disposed in the dense pattern portion whereas larger square dots (side size 90 nm in FIG. 11) are disposed in more isolated pattern portions. Although square dots are shown in the figure, the dots may have any shape including rectangular, rhombic, pentagonal, hexagonal, heptagonal, octagonal, and polygonal shapes and even circular shape. FIG. 12 shows an optical image from the mask of FIG. 11, indicating the contrast thereof. The presence of black or light-shielded spots substantially equivalent to those of FIG. 10 indicates that holes are formed via positive/negative reversal.

Figure 13:
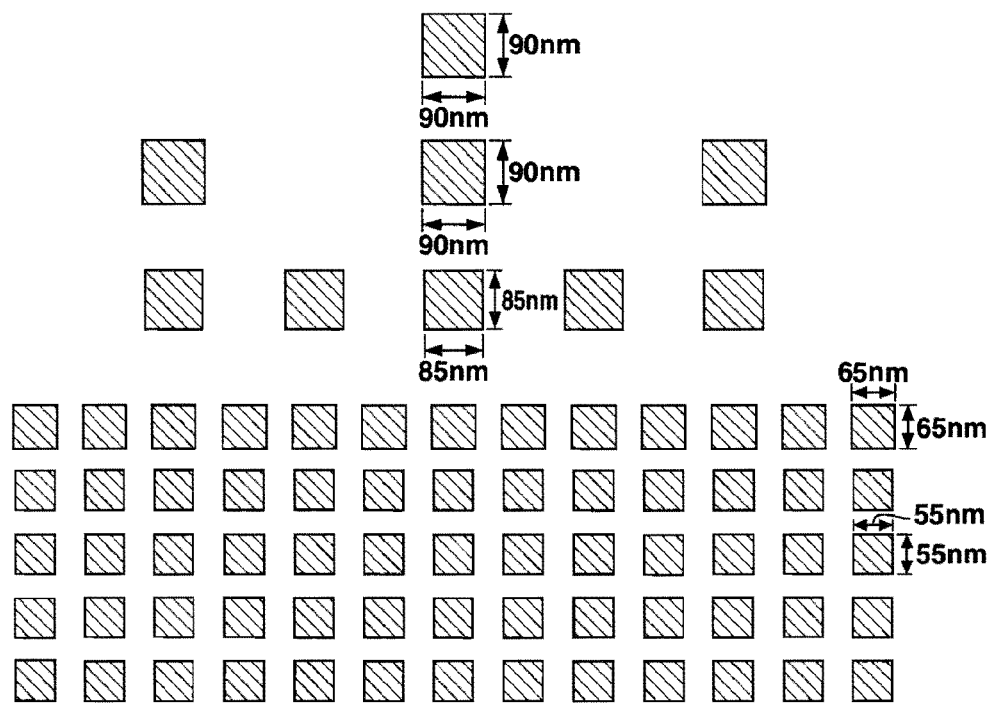
FIG. 13 illustrates a mask without a lattice-like pattern.
Figure 14:
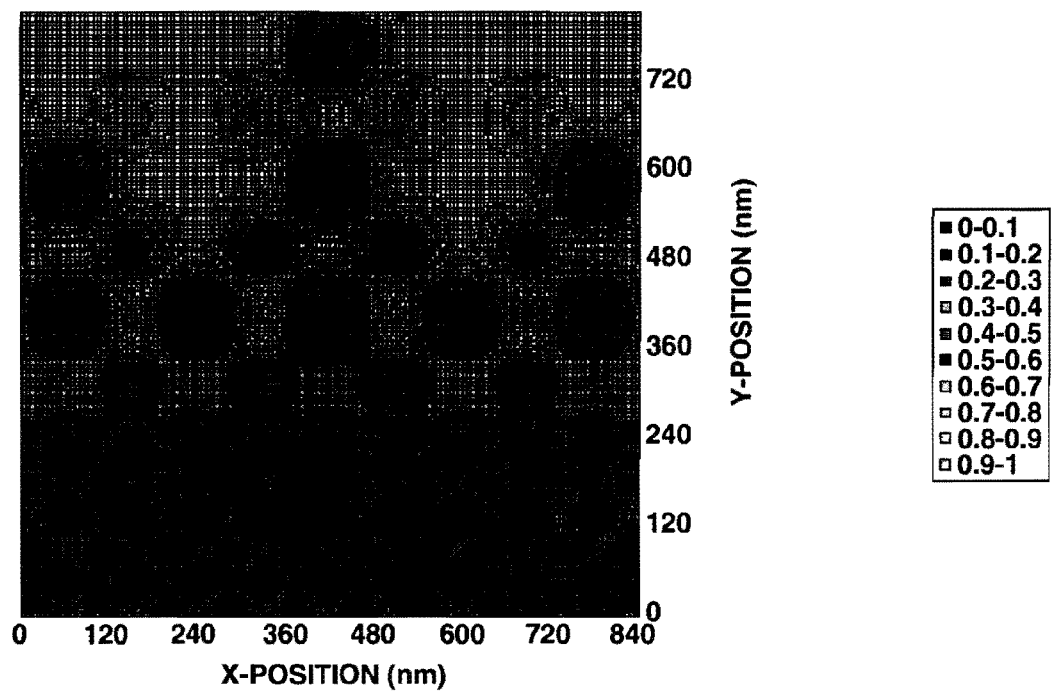
FIG. 14 is an optical image resulting from the mask of FIG. 13, printed under conditions: NA 1.3 lens, cross-pole illumination, 6% halftone phase shift mask, and azimuthally polarized illumination, showing its contrast.

On use of a mask bearing no lattice-like pattern arrayed as shown in FIG. 13, black or light-shielded spots do not appear as shown in FIG. 14. In this case, holes are difficult to form, or even if holes are formed, a variation of mask size is largely reflected by a variation of hole size because the optical image has a low contrast.

EXAMPLE

Examples of the invention are given below by way of illustration and not by way of limitation. The abbreviation "pbw" is parts by weight. For all polymers, Mw and Mn are determined by GPC versus polystyrene standards using tetrahydrofuran solvent.

Preparation of Resist Composition

Resist solutions (Resist-1 to 24) were prepared by dissolving components in a solvent in accordance with the recipe shown in Table 1, and filtering through a Teflon® filter with a pore size of 0.2 μm. Similarly, comparative resist solutions (Resist-25 to 29) were prepared in accordance with the recipe shown in Table 2. The polymers as base resin in Tables 1 and 2 have a structure, molecular weight (Mw) and dispersity (Mw/Mn) as shown in Tables 3 to 6. In Tables 3 to 6, the value in parentheses indicates a constitutional ratio (mol %) of the relevant recurring unit. The polymeric additives in Tables 1 and 2 have a structure, molecular weight (Mw) and dispersity (Mw/Mn) as shown in Table 7. In Table 7, the value in parentheses indicates a constitutional ratio (mol %) of the relevant recurring unit. The structure of photoacid generators in Tables 1 and 2 is shown in Tables 8-1 and 8-2. The structure of quenchers in Tables 1 and 2 is shown in Table 9. It is noted that of the PAGs in Table 8-1, PAG-1 to 8 correspond to the compound of formula (1) essential for the resist compositions of the invention.

TABLE 1

Inventive resist compositions

| | Base resin (pbw) | PAG (pbw) | Quencher (pbw) | Polymeric additive (pbw) | Solvent (pbw) |
|---|---|---|---|---|---|
| Resist-1 | Polymer-1(95) | PAG-1(9.4) | Q-1(0.4) | PA-1(5) | PGMEA(2,700) GBL(300) |
| Resist-2 | Polymer-2(95) | PAG-2(9.8) | Q-1(0.4) | PA-1(5) | PGMEA(2,700) GBL(300) |
| Resist-3 | Polymer-3(95) | PAG-3(10.7) | Q-2(0.3) | PA-1(5) | PGMEA(2,700) GBL(300) |
| Resist-4 | Polymer-3(95) | PAG-4(10.9) | Q-2(0.3) | PA-2(5) | PGMEA(2,700) GBL(300) |
| Resist-5 | Polymer-4(95) | PAG-3(10.7) | Q-2(0.3) | PA-1(5) | PGMEA(2,700) GBL(300) |
| Resist-6 | Polymer-4(95) | PAG-5(14.1) | Q-4(0.8) | PA-3(5) | PGMEA(2,700) GBL(300) |
| Resist-7 | Polymer-5(95) | PAG-6(11.5) | Q-2(0.3) | PA-1(5) | PGMEA(2,700) GBL(300) |
| Resist-8 | Polymer-5(95) | PAG-3(5.3) PAG-8(5.7) | Q-3(0.8) | PA-2(5) | PGMEA(2,700) GBL(300) |
| Resist-9 | Polymer-6(95) | PAG-3(5.3) PAG-9(5.1) | Q-4(1.6) | PA-1(5) | PGMEA(2,700) GBL(300) |
| Resist-10 | Polymer-7(95) | PAG-4(5.4) PAG-10(4.7) | Q-2(0.7) | PA-1(5) | PGMEA(2,700) GBL(300) |
| Resist-11 | Polymer-8(95) | PAG-3(5.3) PAG-11(4.9) | Q-2(0.3) | PA-2(5) | PGMEA(2,700) GBL(300) |
| Resist-12 | Polymer-8(95) | PAG-7(11.1) | — | PA-3(5) | PGMEA(2,700) GBL(300) |
| Resist-13 | Polymer-9(95) | PAG-6(5.8) PAG-13(5.4) | Q-2(0.7) | PA-1(5) | PGMEA(2,700) GBL(300) |
| Resist-14 | Polymer-10(95) | PAG-8(5.7) PAG-14(7.1) | Q-2(0.3) | PA-2(5) | PGMEA(2,700) GBL(300) |
| Resist-15 | Polymer-11(95) | PAG-7(5.5) PAG-12(5.3) | Q-3(0.8) | PA-1(5) | PGMEA(2,700) GBL(300) |
| Resist-16 | Polymer-12(95) | PAG-3(10.7) | Q-2(0.3) | PA-1(5) | PGMEA(2,700) GBL(300) |
| Resist-17 | Polymer-13(95) | PAG-3(10.7) | Q-2(0.3) | PA-2(5) | PGMEA(2,700) GBL(300) |
| Resist-18 | Polymer-14(95) | PAG-4(10.9) | Q-2(0.3) | PA-1(5) | PGMEA(2,700) GBL(300) |
| Resist-19 | Polymer-15(95) | PAG-4(10.9) | Q-2(0.3) | PA-3(5) | PGMEA(2,700) GBL(300) |
| Resist-20 | Polymer-16(95) | PAG-6(11.5) | Q-2(0.3) | PA-3(5) | PGMEA(2,700) GBL(300) |
| Resist-21 | Polymer-17(95) | PAG-6(11.5) | Q-2(0.3) | PA-1(5) | PGMEA(2,700) GBL(300) |
| Resist-22 | Polymer-18(95) | PAG-3(10.7) | Q-2(0.3) | PA-1(5) | PGMEA(2,700) GBL(300) |
| Resist-23 | Polymer-19(95) | PAG-3(5.3) PAG-12(5.3) | Q-2(0.7) | PA-1(5) | PGMEA(2,100) CyHO(900) |
| Resist-24 | Polymer-3(55) Polymer-20(40) | PAG-3(5.3) PAG-12(5.3) | Q-2(0.7) | PA 1(5) | PGMEA(2,100) CyHO(900) |

TABLE 2

Comparative resist compositions

| | Base resin (pbw) | PAG (pbw) | Quencher (pbw) | Polymeric additive (pbw) | Solvent (pbw) |
|---|---|---|---|---|---|
| Resist-25 | Polymer-3(95) | PAG-9(10.2) | Q-2(0.7) | PA-1(5) | PGMEA(2,700) GBL(300) |
| Resist-26 | Polymer-4(95) | PAG-12(10.7) | Q-4(1.6) | PA-3(5) | PGMEA(2,700) GBL(300) |
| Resist-27 | Polymer-5(95) | PAG-13(10.9) | Q-2(0.7) | PA-1(5) | PGMEA(2,700) GBL(300) |
| Resist-28 | Polymer-8(95) | PAG 10(4.7) PAG-11(4.9) | Q-2(0.3) | PA-2(5) | PGMEA(2,700) GBL(300) |
| Resist-29 | Polymer-8(95) | PAG-14(14.1) | Q-3(0.8) | PA-3(5) | PGMEA(2,700) GBL(300) |

TABLE 3

Base resin

| Polymer | Constitutional units | | | | | Mw | Mw/Mn |
| | Unit 1 | Unit 2 | Unit 3 | Unit 4 | Unit 5 | | |
|---|---|---|---|---|---|---|---|
| 1 | (50) | (10) | (40) | | | 7,300 | 1.6 |

TABLE 3-continued

| Base resin | | | | | | |
|---|---|---|---|---|---|---|
| Poly-mer | Unit 1 | Unit 2 | Unit 3 | Unit 4 | Unit 5 | Mw | Mw/Mn |
| 2 | (55) | (10) | (35) | | | 8,200 | 1.8 |
| 3 | (50) | (10) | (20) | (20) | | 6,900 | 1.5 |
| 4 | (45) | (15) | (40) | | | 7,400 | 1.7 |

TABLE 3-continued
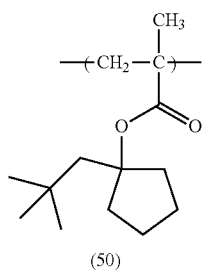
TABLE 4

TABLE 4-continued
| | Base resin | | | | | | |
|---|---|---|---|---|---|---|---|
| | Constitutional units | | | | | | Mw/ |
| Polymer | Unit 1 | Unit 2 | Unit 3 | Unit 4 | Unit 5 | Mw | Mn |
| 8 | 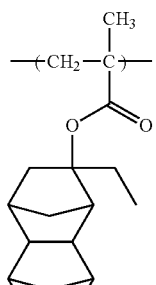 (20) | 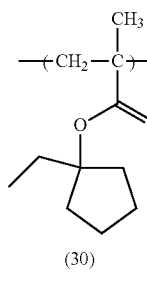 (30) | 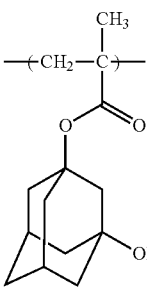 (10) | 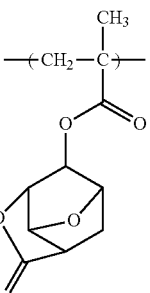 (40) | | 8,800 | 1.8 |
| 9 | 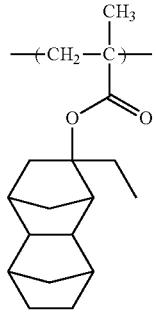 (15) | 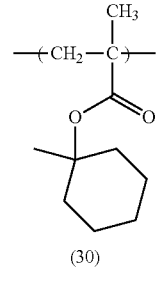 (30) | 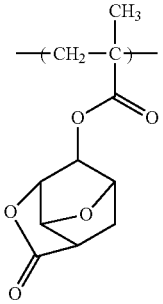 (50) | 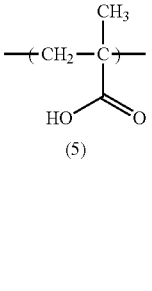 (5) | | 8,700 | 2.0 |
| 10 | 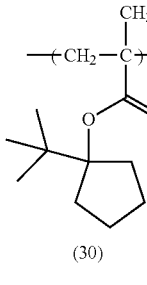 (30) | 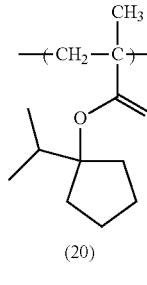 (20) | 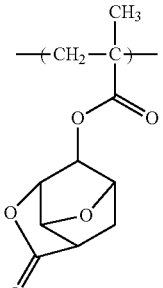 (20) | 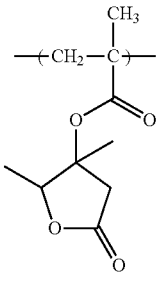 (30) | | 7,600 | 1.4 |

TABLE 5

| Polymer | Constitutional units | | | | | Mw | Mw/Mn |
|---|---|---|---|---|---|---|---|
| | Unit 1 | Unit 2 | Unit 3 | Unit 4 | Unit 5 | | |
| 11 | (15) | (35) | (10) | (40) | | 7,100 | 1.7 |
| 12 | (20) | (30) | (5) | (45) | | 9,000 | 1.7 |
| 13 | (20) | (25) | (5) | (30) | (20) | 6,700 | 1.6 |
| 14 | (20) | (30) | (20) | (20) | (10) | 7,400 | 1.4 |

TABLE 5-continued

| | Base resin | | | | | | |
|---|---|---|---|---|---|---|---|
| Poly- | Constitutional units | | | | | | Mw/ |
| mer | Unit 1 | Unit 2 | Unit 3 | Unit 4 | Unit 5 | Mw | Mn |
| 15 | (50) | (10) | (30) | (10) | | 8,100 | 1.8 |

TABLE 6

| | Base resin | | | | | | |
|---|---|---|---|---|---|---|---|
| Poly- | Constitutional units | | | | | | Mw/ |
| mer | Unit 1 | Unit 2 | Unit 3 | Unit 4 | Unit 5 | Mw | Mn |
| 16 | (10) | (40) | (15) | (35) | | 10,300 | 2.1 |
| 17 | (10) | (40) | (10) | (35) | (5) | 9,100 | 1.8 |

TABLE 6-continued

| | Base resin | | | | | | |
|---|---|---|---|---|---|---|---|
| Poly- | Constitutional units | | | | | | Mw/ |
| mer | Unit 1 | Unit 2 | Unit 3 | Unit 4 | Unit 5 | Mw | Mn |
| 18 | (15) | (35) | (10) | (30) | (10) | 6,400 | 1.5 |
| 19 | (50) | (50) | | | | 7,200 | 1.4 |
| 20 | (50) | (50) | | | | 10,500 | 1.3 |

TABLE 7

| | Polymeric additive | | | |
|---|---|---|---|---|
| | Constitutional units | | | |
| | Unit 1 | Unit 2 | Mw | Mw/Mn |
| PA-1 | (structure) (50) | (structure) (50) | 6,200 | 2.1 |
| PA-2 | (structure) (40) | (structure) (60) | 7,500 | 2.2 |
| PA-3 | (structure) (50) | (structure) (50) | 9,200 | 1.7 |

TABLE 8-1

PAG-1

(structure)

TABLE 8-1-continued
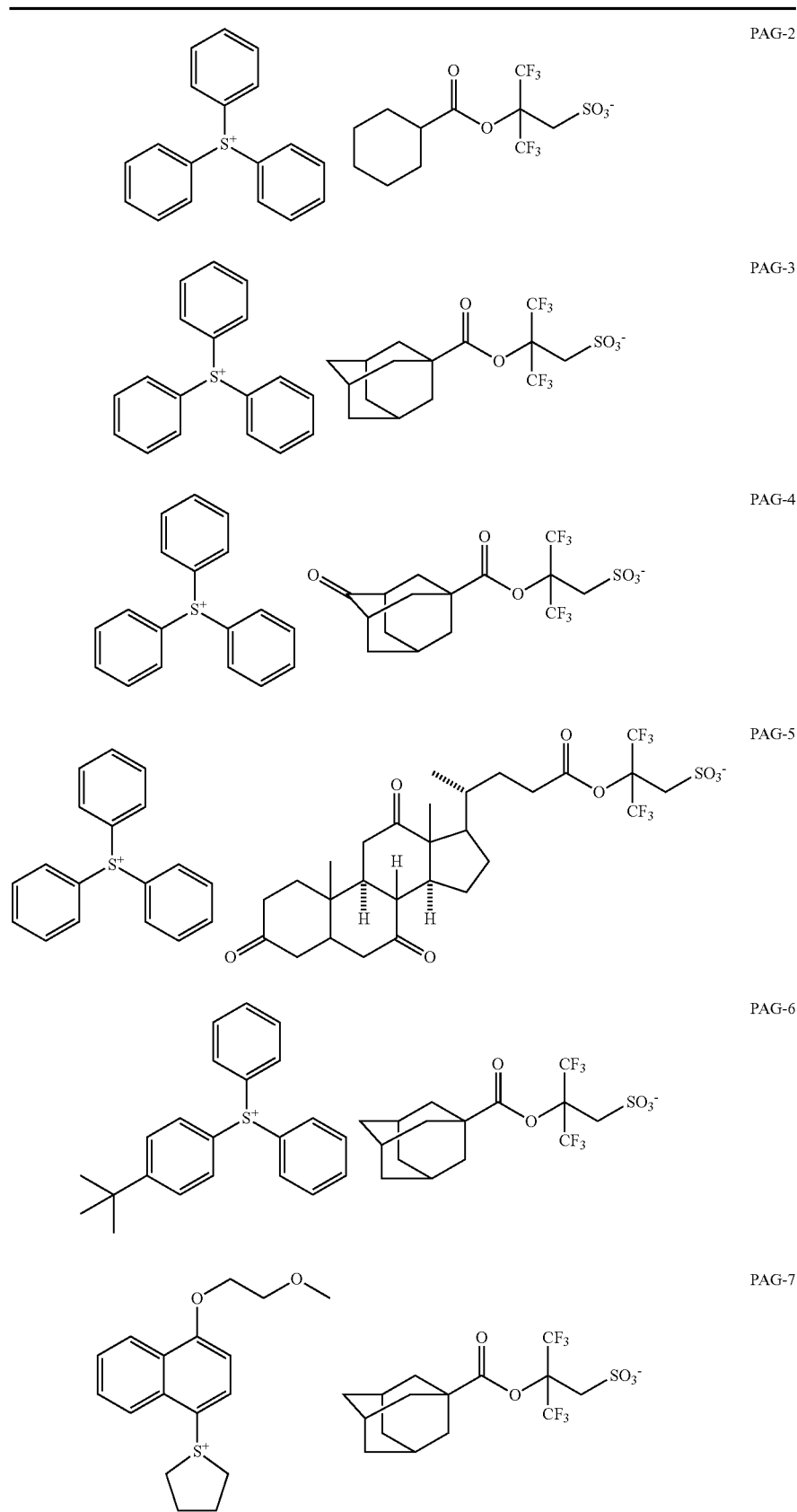

TABLE 8-1-continued
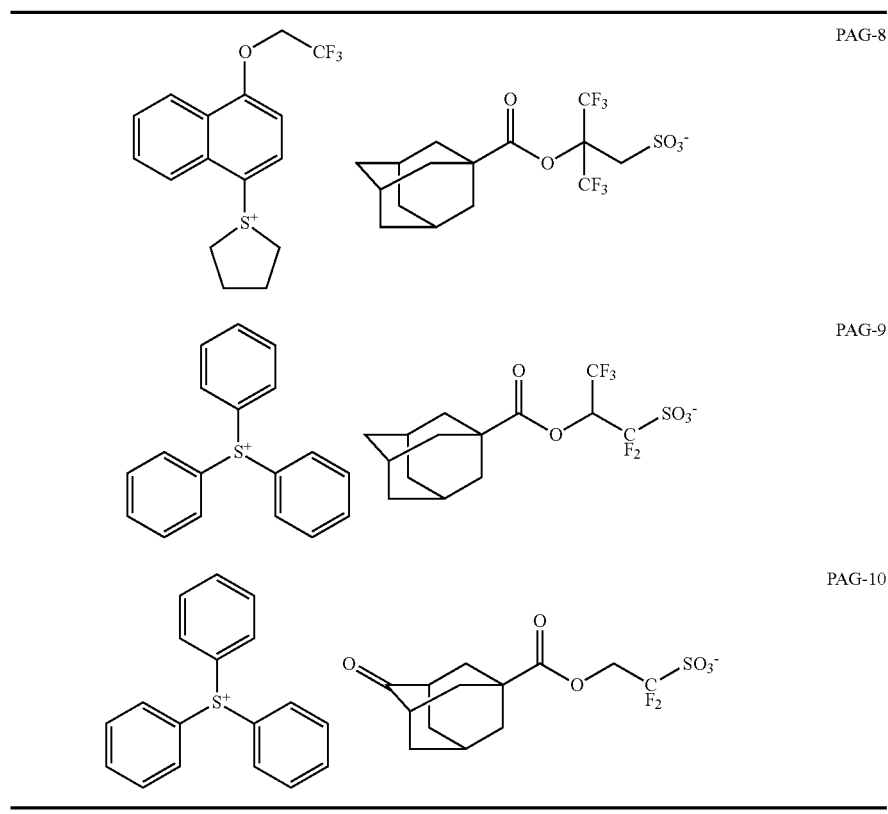
TABLE 8
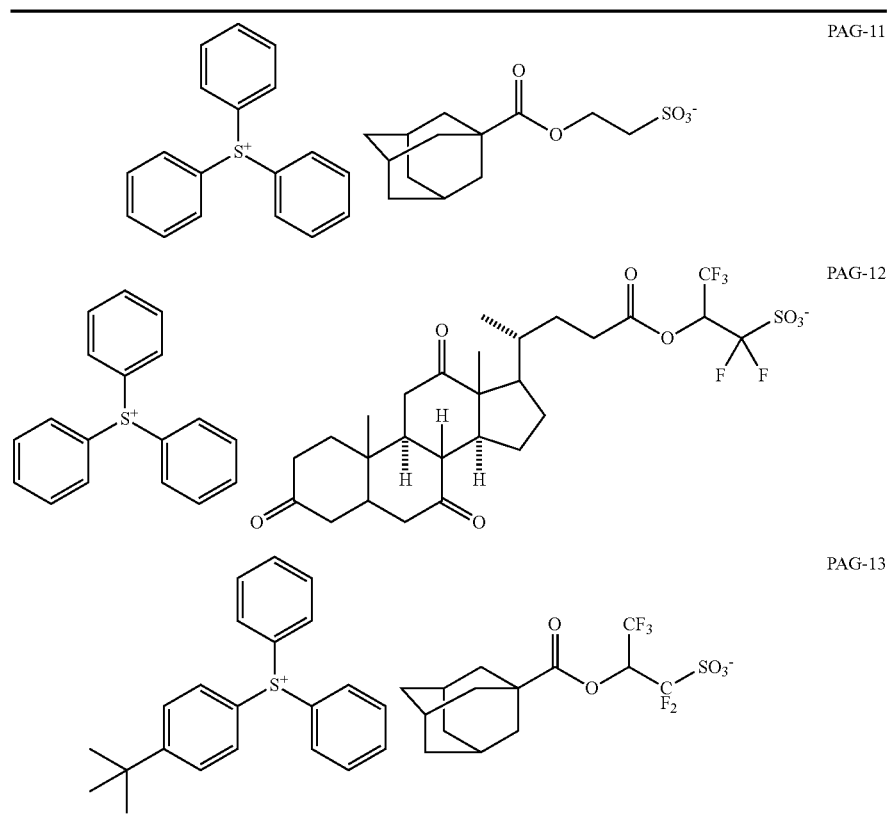

TABLE 8-continued

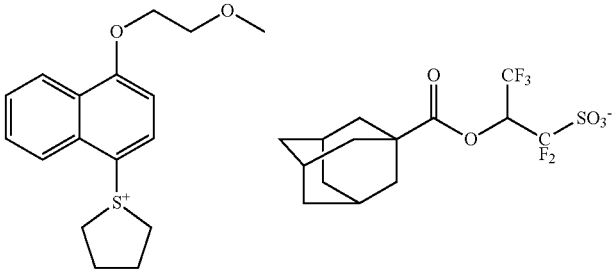

PAG-14

TABLE 9

Quencher

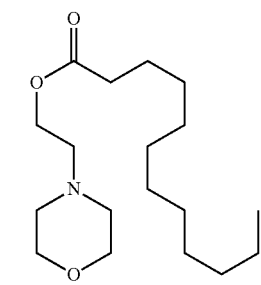 [SMILES: CCCCCCCCCCCC(=O)OCCN1CCOCC1]

Q-1

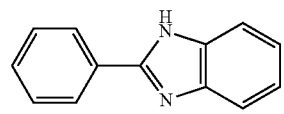

Q-2

TABLE 9-continued

Quencher

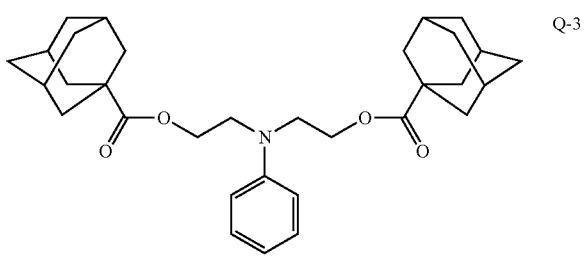

Q-3

TABLE 9-continued

Quencher

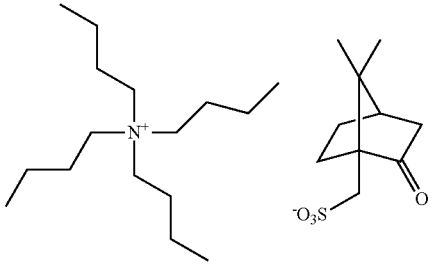

Q-4

The organic solvents in Tables 1 and 2 are as follows.
PGMEA: propylene glycol monomethyl ether acetate
CyHO: cyclohexanone
GBL: γ-butyrolactone All the resist compositions in Tables 1 and 2 contained 0.1 pbw of surfactant A.

Surfactant A: 3-methyl-3-(2,2,2-trifluoroethoxymethyl)oxetane/tetrahydrofuran/2,2-dimethyl-1,3-propanediol copolymer of the formula below (Omnova Solutions, Inc.)

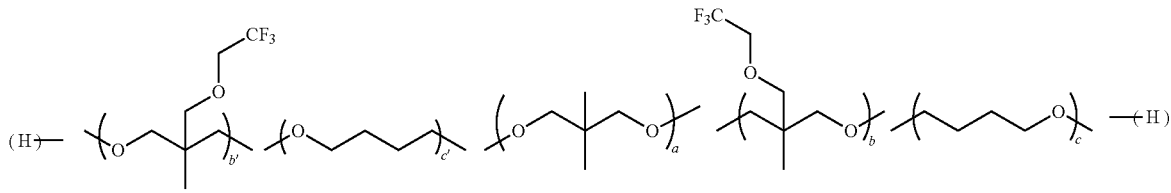

a:(b + b'):(c + c') = 1:4-7:0.01-1 (molar ratio) Mw = 1,500

Evaluation of Resists

Evaluation Method

A trilayer process substrate was prepared by forming a spin-on carbon film (ODL-50 by Shin-Etsu Chemical Co., Ltd., carbon content 80 wt %) of 200 nm thick on a silicon wafer and forming a silicon-containing spin-on hard mask (SHB-A940 by Shin-Etsu Chemical Co., Ltd., silicon content 43 wt %) of 35 nm thick thereon. The resist solution (Resist-1 to 29 in Tables 1 and 2) was spin coated on the trilayer process substrate, then baked (PAB) on a hot plate at 100° C. for 60 seconds to form a resist film of 90 nm thick.

Using an ArF excimer laser immersion lithography scanner (NSR-610C by Nikon Corp., NA 1.30, σ0.98/0.74, dipole opening 90 deg., s-polarized illumination), exposure was carried out in a varying exposure dose. After exposure, the resist film was baked (PEB) at an arbitrary temperature for 60 seconds, developed in an arbitrary developer for 30 seconds, and then rinsed with diisoamyl ether. The developer was selected from developers DS-1 to 3.

DS-1: butyl acetate
DS-2: 2-heptanone
DS-3: a mixture of butyl acetate and methyl benzoate in a weight ratio 1:1

The mask used was a halftone phase shift mask with a transmittance of 6%. For the pattern printed from an on-mask design of 45 nm line/90 nm pitch (actual on-mask size is 4 times because of ¼ image reduction projection exposure), the size of trenches formed under the light-shielding region was measured, using measurement SEM (CG4000 by Hitachi High-Technologies, Ltd.). The optimum dose (Eop) was a dose (mJ/cm$^2$) that provided a trench width of 45 nm. A variation (3σ) of width of trenches formed in intervals of 10 nm over the range of 200 nm at the optimum dose was determined and reported as edge roughness (nm).

As the dose is reduced, the trench size is enlarged and the line size is reduced. The maximum size (nm) of trench width which could be resolved without line collapse was determined and reported as collapse margin. A larger value indicates higher collapse resistance and is better.

The conditions (PEB temperature and developer) used in the evaluation of the inventive resist compositions in Table 1 are shown in Table 10 together with the test results. The conditions used in the evaluation of the comparative resist compositions in Table 2 are shown in Table 11 together with the test results.

TABLE 10

Evaluation conditions and results of inventive resist compositions

| | | Resist composition | PEB temperature (° C.) | Developer | Eop (mJ/cm$^2$) | Edge roughness (nm) | Collapse margin (nm) |
|---|---|---|---|---|---|---|---|
| Example | 1 | Resist-1 | 100 | DS-1 | 35 | 3.9 | 53 |
| | 2 | Resist-2 | 100 | DS-1 | 32 | 3.9 | 59 |
| | 3 | Resist-3 | 95 | DS-1 | 38 | 3.6 | 56 |
| | 4 | Resist-4 | 95 | DS-1 | 36 | 3.4 | 56 |
| | 5 | Resist-5 | 90 | DS-1 | 31 | 3.5 | 55 |
| | 6 | Resist-6 | 90 | DS-2 | 33 | 3.5 | 54 |
| | 7 | Resist-7 | 90 | DS-1 | 34 | 3.6 | 58 |
| | 8 | Resist-8 | 90 | DS-1 | 47 | 3.7 | 55 |
| | 9 | Resist-9 | 85 | DS-1 | 35 | 3.6 | 56 |
| | 10 | Resist-10 | 95 | DS-1 | 38 | 3.4 | 60 |
| | 11 | Resist-11 | 100 | DS-3 | 38 | 4.1 | 59 |
| | 12 | Resist-12 | 100 | DS-1 | 30 | 3.9 | 58 |
| | 13 | Resist-13 | 95 | DS-1 | 42 | 4.3 | 61 |
| | 14 | Resist-14 | 90 | DS-1 | 29 | 3.5 | 57 |
| | 15 | Resist-15 | 95 | DS-1 | 37 | 3.4 | 55 |
| | 16 | Resist-16 | 90 | DS-1 | 30 | 3.3 | 56 |
| | 17 | Resist-17 | 90 | DS-1 | 27 | 3.6 | 55 |
| | 18 | Resist-18 | 90 | DS-1 | 36 | 3.7 | 54 |
| | 19 | Resist-19 | 90 | DS-1 | 32 | 3.5 | 53 |
| | 20 | Resist-20 | 95 | DS-1 | 33 | 3.9 | 54 |
| | 21 | Resist-21 | 90 | DS-1 | 35 | 3.8 | 58 |
| | 22 | Resist-22 | 80 | DS-1 | 35 | 3.6 | 56 |
| | 23 | Resist-23 | 95 | DS-1 | 32 | 4.2 | 53 |
| | 24 | Resist-24 | 90 | DS-1 | 30 | 3.9 | 53 |

TABLE 11

Evaluation conditions and results of comparative resist compositions

| | | Resist composition | PEB temperature (° C.) | Developer | Eop (mJ/cm$^2$) | Edge roughness (nm) | Collapse margin (nm) |
|---|---|---|---|---|---|---|---|
| Comparative Example | 1 | Resist-25 | 95 | DS-1 | 36 | 5.3 | 48 |
| | 2 | Resist-26 | 90 | DS-2 | 34 | 5.0 | 48 |
| | 3 | Resist-27 | 90 | DS-1 | 34 | 5.1 | 47 |
| | 4 | Resist-28 | 100 | DS-3 | 37 | 6.2 | 49 |
| | 5 | Resist-29 | 100 | DS-1 | 29 | 5.4 | 46 |

It is seen from the results of Tables 10 and 11 that when a resist composition comprising a photoacid generator of specific structure is subjected to negative tone development in organic solvent, a trench pattern can be formed whose edge roughness is minimized and collapse margin is improved.

While the invention has been described with reference to a preferred embodiment, it will be understood by those skilled in the art that various changes may be made and equivalents may be substituted for elements thereof without departing from the scope of the invention. Therefore, it is intended that the invention not be limited to the particular embodiment disclosed as the best mode contemplated for carrying out this invention, but that the invention will include all embodiments falling within the scope of the appended claims.

Japanese Patent Application No. 2013-042709 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A process for forming a negative pattern, comprising the steps of coating a resist composition comprising (A) a polymer having an acid labile group, adapted to change its polarity under the action of acid, (B) a photoacid generator, and (C) an organic solvent onto a substrate, baking the coating to form a resist film, exposing the resist film to high-energy radiation to define exposed and unexposed regions, baking, and developing the resist film in a developer selected from the group consisting of ketones and esters to selectively dissolve the unexposed region of resist film, said photoacid generator (B) having the general formula (1):

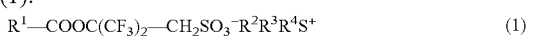

$$R^1\text{—COOC}(CF_3)_2\text{—}CH_2SO_3^- R^2R^3R^4S^+ \qquad (1)$$

wherein $R^1$ is a straight, branched or cyclic, monovalent hydrocarbon group of 1 to 50 carbon atoms which may contain a heteroatom, $R^2$, $R^3$ and $R^4$ are each independently a substituted or unsubstituted, straight or branched $C_1$-$C_{10}$ alkyl, alkenyl or oxoalkyl group or a substituted or unsubstituted $C_6$-$C_{18}$ aryl, aralkyl or aryloxoalkyl group, or at least two of $R^2$, $R^3$ and $R^4$ may bond together to form a ring with the sulfur atom, and said polymer (A) comprises recurring units having the general formula (2):

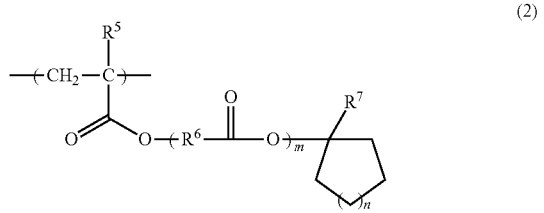

wherein $R^5$ is hydrogen or methyl, $R^6$ is a straight, branched or cyclic, divalent aliphatic hydrocarbon group of 2 to 16 carbon atoms which may contain an ether or ester bond, $R^7$ is tert-pentyl or neopentyl, m is 0 or 1, and n is 1 or 2.

2. The process of claim 1 wherein the polymer (A) further comprises recurring units having the general formula (3):

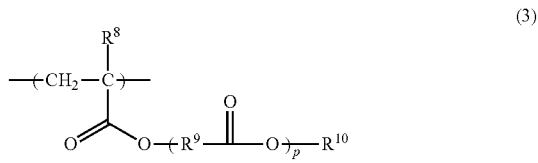

wherein $R^8$ is hydrogen or methyl, $R^9$ is a straight, branched or cyclic, divalent aliphatic hydrocarbon group of 2 to 16 carbon atoms which may contain an ether or ester bond, $R^{10}$ is a cyclic hydrocarbon group of 4 to 15 carbon atoms having at least one partial structure selected from the group consisting of hydroxyl, ether, ketone, ester, carbonic acid ester, and sulfonic acid ester, and p is 0 or 1.

3. The process of claim 1 wherein the developer comprises at least one organic solvent selected from the group consisting of 2-octanone, 2-nonanone, 2-heptanone, 3-heptanone, 4-heptanone, 2-hexanone, 3-hexanone, diisobutyl ketone, 2-methylcyclohexanone, 3-methylcyclohexanone, 4-methylcyclohexanone, acetophenone, 2'-methylacetophenone, 4'-methylacetophenone, propyl acetate, butyl acetate, isobutyl acetate, amyl acetate, isoamyl acetate, butenyl acetate, propyl formate, butyl formate, isobutyl formate, amyl formate, isoamyl formate, methyl valerate, methyl pentenoate, methyl crotonate, ethyl crotonate, methyl lactate, ethyl lactate, propyl lactate, butyl lactate, isobutyl lactate, amyl lactate, isoamyl lactate, methyl 2-hydroxyisobutyrate, ethyl 2-hydroxyisobutyrate, methyl benzoate, ethyl benzoate, phenyl acetate, benzyl acetate, methyl phenylacetate, benzyl formate, phenylethyl formate, methyl 3-phenylpropionate, benzyl propionate, ethyl phenylacetate, and 2-phenylethyl acetate, the at least one organic solvent being present in a total amount of at least 60% by weight of the developer.

4. The process of claim 1 wherein the step of exposing the resist film to high-energy radiation includes ArF excimer laser immersion lithography of wavelength 193 nm.

* * * * *